(12) United States Patent
Carter et al.

(10) Patent No.: US 11,414,117 B2
(45) Date of Patent: *Aug. 16, 2022

(54) ANTI-THEFT SYSTEM THAT USES SHOPPING CART LOCATION AND VIBRATION DATA

(71) Applicant: Gatekeeper Systems, Inc., Foothill Ranch, CA (US)

(72) Inventors: Scott J. Carter, Seal Beach, CA (US); Stephen E. Hannah, Placentia, CA (US); Jesse M. James, Santa Ana, CA (US); Narayanan V. Ramanathan, Lake Forest, CA (US); Robert M. Harling, Irvine, CA (US); Jack Johnson, Irvine, CA (US)

(73) Assignee: Gatekeeper Systems, Inc., Foothill Ranch, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,221

(22) Filed: Dec. 3, 2020

(65) Prior Publication Data
US 2021/0284217 A1 Sep. 16, 2021

Related U.S. Application Data

(63) Continuation of application No. 16/275,066, filed on Feb. 13, 2019, now Pat. No. 10,858,024, which is a (Continued)

(51) Int. Cl.
*B62B 3/14* (2006.01)
*G01P 15/08* (2006.01)
(Continued)

(52) U.S. Cl.
CPC ............ *B62B 3/1404* (2013.01); *G01C 21/16* (2013.01); *G01P 15/08* (2013.01); *G01R 33/07* (2013.01);
(Continued)

(58) Field of Classification Search
CPC ... B62B 3/1404; B62B 3/1416; B62B 5/0096; B62B 5/0404; G01C 21/16;
(Continued)

(56) References Cited

U.S. PATENT DOCUMENTS 4,242,668 A 12/1980 Herzog
4,628,454 A 12/1986 Ito
(Continued)

FOREIGN PATENT DOCUMENTS

DE 102012015188 A1 2/2014
WO WO 96/21206 A1 7/1996
(Continued)

OTHER PUBLICATIONS

International Search Report from corresponding International Patent Application No. PCT/US2018/021177, dated Jun. 12, 2018, in 15 pages.
(Continued)

*Primary Examiner* — Mohamed Barakat
(74) *Attorney, Agent, or Firm* — Knobbe, Martens, Olson & Bear, LLP

(57) ABSTRACT

Examples of systems and methods for locating movable objects such as carts (e.g., shopping carts) are disclosed. Such systems and methods can use dead reckoning techniques to estimate the current position of the movable object. Various techniques for improving accuracy of position estimates are disclosed, including compensation for various error sources involving the use of magnetometer and accelerometer, and using vibration analysis to derive wheel rotation rates. Various techniques utilize characteristics of the operating environment in conjunction with or in lieu of dead reckoning techniques, including characteristic of environment such as ground texture, availability of signals from radio frequency (RF) transmitters including precision fix
(Continued)

sources. Navigation techniques can include navigation history and backtracking, motion direction detection for dual swivel casters, use of gyroscopes, determining cart weight, multi-level navigation, multi-level magnetic measurements, use of lighting signatures, use of multiple navigation systems, or hard/soft iron compensation for different cart configurations.

22 Claims, 30 Drawing Sheets

Related U.S. Application Data continuation of application No. 15/913,468, filed on Mar. 6, 2018, now Pat. No. 10,232,869.

(60) Provisional application No. 62/468,913, filed on Mar. 8, 2017.

(51) Int. Cl.
    *G01C 21/16*     (2006.01)
    *G01R 33/07*     (2006.01)
    *G08B 13/16*     (2006.01)
    *G08B 13/14*     (2006.01)
    *B62B 5/04*     (2006.01)
    *G01C 21/20*     (2006.01)
    *B62B 5/00*     (2006.01)

(52) U.S. Cl.
    CPC ....... *G01R 33/072* (2013.01); *G08B 13/1436* (2013.01); *G08B 13/1654* (2013.01); *B62B 3/1416* (2013.01); *B62B 5/0096* (2013.01); *B62B 5/0404* (2013.01); *G01C 21/165* (2013.01); *G01C 21/20* (2013.01)

(58) Field of Classification Search
    CPC ....... G01C 21/165; G01C 21/20; G01P 15/08; G01R 33/07; G01R 33/072; G08B 13/1436; G08B 13/1654
    See application file for complete search history.

(56) References Cited

U.S. PATENT DOCUMENTS

| | | |
|---|---|---|
| 4,949,268 A | 8/1990 | Nishikawa et al. |
| 5,119,102 A | 6/1992 | Barnard |
| 5,194,844 A | 3/1993 | Zelda |
| 5,225,842 A | 7/1993 | Brown et al. |
| 5,247,440 A | 9/1993 | Capurka et al. |
| 5,283,550 A | 2/1994 | Macintyre |
| 5,311,194 A | 5/1994 | Brown |
| 5,315,290 A | 5/1994 | Moreno et al. |
| 5,357,182 A | 10/1994 | Wolfe et al. |
| 5,379,224 A | 1/1995 | Brown et al. |
| 5,420,592 A | 5/1995 | Johnson |
| 5,438,319 A | 8/1995 | Zeytoonjian et al. |
| 5,446,656 A | 8/1995 | Koseki et al. |
| 5,598,144 A | 1/1997 | Lace |
| 5,610,586 A | 3/1997 | Zeytoonjian et al. |
| 5,638,077 A | 6/1997 | Martin |
| 5,663,734 A | 9/1997 | Krasner |
| 5,719,555 A | 2/1998 | Zeytoonjian et al. |
| 5,739,786 A | 4/1998 | Greenspan et al. |
| 5,781,156 A | 7/1998 | Krasner |
| 5,823,302 A | 10/1998 | Schweninger |
| 5,831,530 A | 11/1998 | Lace et al. |
| 5,841,396 A | 11/1998 | Krasner |
| 5,868,100 A | 2/1999 | Marsh |
| 5,900,825 A | 5/1999 | Pressel et al. |
| 5,936,573 A | 8/1999 | Smith |
| 6,002,778 A | 12/1999 | Rossetti et al. |
| 6,024,655 A | 2/2000 | Coffee |
| 6,043,748 A | 3/2000 | Touchton et al. |
| 6,054,923 A | 4/2000 | Prather et al. |
| 6,058,338 A | 5/2000 | Agashe et al. |
| 6,067,046 A | 5/2000 | Nichols |
| 6,097,337 A | 8/2000 | Bisio |
| 6,102,414 A | 8/2000 | Schweninger |
| 6,121,928 A | 9/2000 | Sheynblat et al. |
| 6,125,972 A | 10/2000 | French et al. |
| 6,127,927 A | 10/2000 | Durban et al. |
| 6,144,916 A | 11/2000 | Wood, Jr. et al. |
| 6,150,980 A | 11/2000 | Krasner |
| 6,161,849 A | 12/2000 | Schweninger |
| 6,201,497 B1 | 3/2001 | Snyder et al. |
| 6,204,772 B1 | 3/2001 | DeMay et al. |
| 6,229,478 B1 | 5/2001 | Biacs et al. |
| 6,243,648 B1 | 6/2001 | Kilfeather et al. |
| 6,249,245 B1 | 6/2001 | Watters et al. |
| 6,271,755 B1 | 8/2001 | Prather et al. |
| 6,271,757 B1 | 8/2001 | Touchton et al. |
| 6,313,786 B1 | 11/2001 | Sheynblat et al. |
| 6,353,388 B1 | 3/2002 | Durban et al. |
| 6,362,728 B1 | 3/2002 | Lace et al. |
| 6,415,154 B1 | 7/2002 | Wang et al. |
| 6,437,734 B1 | 8/2002 | Mcburney et al. |
| 6,446,005 B1 | 9/2002 | Bingeman et al. |
| 6,473,030 B1 | 10/2002 | Mcburney et al. |
| 6,502,669 B1 | 1/2003 | Harris |
| 6,522,968 B1 | 2/2003 | Ito et al. |
| 6,567,041 B1 | 5/2003 | O'Dell |
| 6,603,978 B1 | 8/2003 | Carlsson et al. |
| 6,617,972 B2 | 9/2003 | Takarada et al. |
| 6,618,683 B1 | 9/2003 | Berstis et al. |
| 6,693,586 B1 | 2/2004 | Walters et al. |
| 6,701,253 B2 | 3/2004 | Edwards et al. |
| 6,720,915 B2 | 4/2004 | Sheynblat |
| 6,725,159 B2 | 4/2004 | Krasner |
| 6,859,761 B2 | 2/2005 | Bensky |
| 6,928,343 B2 | 8/2005 | Cato |
| 6,944,542 B1 | 9/2005 | Eschenbach |
| 6,945,366 B2 | 9/2005 | Taba |
| 7,053,823 B2 | 5/2006 | Cervinka et al. |
| 7,199,709 B2 | 4/2007 | Parsons |
| 7,254,402 B2 | 8/2007 | Vayanos et al. |
| 7,463,189 B2 | 12/2008 | Bryant et al. |
| 7,616,682 B2 | 11/2009 | Small |
| 7,656,291 B2 | 2/2010 | Rochelle et al. |
| 7,658,247 B2 | 2/2010 | Carter |
| 7,748,264 B2 | 7/2010 | Prem |
| 7,880,676 B2 | 2/2011 | Ergen et al. |
| 7,918,190 B2 | 4/2011 | Belcher et al. |
| 7,944,368 B2 | 5/2011 | Carter et al. |
| 7,999,733 B2 | 8/2011 | Gronemeyer |
| 8,018,376 B2 | 9/2011 | McClure et al. |
| 8,046,160 B2 | 10/2011 | Carter et al. |
| 8,047,161 B2 | 11/2011 | Moore |
| 8,149,110 B2 | 4/2012 | Troxler |
| 8,238,489 B2 | 8/2012 | Kim et al. |
| 8,463,540 B2 | 6/2013 | Hannah et al. |
| 8,558,698 B1 | 10/2013 | Hannah et al. |
| 8,570,171 B2 | 10/2013 | Hannah et al. |
| 8,578,984 B2 | 11/2013 | Hannah et al. |
| 8,674,845 B2 | 3/2014 | Carter et al. |
| 8,751,148 B2 | 6/2014 | Carter et al. |
| 8,779,729 B2 | 7/2014 | Shiraishi |
| 8,820,447 B2 | 9/2014 | Carter et al. |
| 8,894,086 B2 | 11/2014 | Ekbote |
| 9,116,234 B2 | 8/2015 | Van Dierendonck et al. |
| 9,164,176 B2 | 10/2015 | Fenton |
| 9,205,702 B2 | 12/2015 | Hannah et al. |
| 9,606,238 B2 | 3/2017 | Carter |
| 9,630,319 B2 | 4/2017 | Vicenti |
| 9,630,639 B2 | 4/2017 | Carter et al. |
| 9,669,659 B2 | 6/2017 | McKay et al. |
| 9,731,744 B2 | 8/2017 | Carter et al. |
| 10,001,541 B2 * | 6/2018 | Hannah ............... G01R 35/005 |
| 10,096,216 B1 | 10/2018 | McClintock |
| 10,101,458 B2 | 10/2018 | Carter |
| 10,232,869 B2 | 3/2019 | Carter et al. |
| 10,546,502 B2 | 1/2020 | Carter et al. |

(56) References Cited

U.S. PATENT DOCUMENTS

| | | | |
|---|---|---|---|
| 10,858,024 B2 | 12/2020 | Carter et al. | |
| 11,183,070 B2 | 11/2021 | Carter et al. | |
| 2001/0035840 A1 | 11/2001 | Fenton et al. | |
| 2001/0048387 A1 | 12/2001 | Sheynblat | |
| 2002/0050944 A1 | 5/2002 | Sheynblat et al. | |
| 2002/0080064 A1 | 6/2002 | Kim | |
| 2002/0116089 A1 | 8/2002 | Kirkpatrick | |
| 2002/0120400 A1 | 8/2002 | Lin | |
| 2002/0178085 A1 | 11/2002 | Sorensen | |
| 2002/0196151 A1 | 12/2002 | Troxler | |
| 2003/0040885 A1* | 2/2003 | Schoess | G01G 3/16 702/173 |
| 2004/0031650 A1 | 2/2004 | Taba | |
| 2004/0051263 A1 | 3/2004 | Prather et al. | |
| 2004/0102896 A1 | 5/2004 | Thayer et al. | |
| 2004/0160365 A1 | 8/2004 | Riley et al. | |
| 2004/0166873 A1 | 8/2004 | Simic et al. | |
| 2004/0196149 A1 | 10/2004 | Dufournier | |
| 2005/0060069 A1 | 3/2005 | Breed et al. | |
| 2005/0104745 A1 | 5/2005 | Bachelder et al. | |
| 2005/0259240 A1 | 11/2005 | Goren | |
| 2006/0082498 A1 | 4/2006 | Pitt et al. | |
| 2006/0125694 A1 | 6/2006 | Dejanovic et al. | |
| 2006/0244588 A1* | 11/2006 | Hannah | G01C 21/206 340/539.13 |
| 2006/0247847 A1* | 11/2006 | Carter | G06Q 10/08 701/498 |
| 2007/0045018 A1 | 3/2007 | Carter et al. | |
| 2007/0058700 A1 | 3/2007 | Fenton | |
| 2007/0061100 A1 | 3/2007 | Hall et al. | |
| 2007/0197229 A1 | 8/2007 | Kalliola et al. | |
| 2007/0240903 A1 | 10/2007 | Alft et al. | |
| 2007/0262900 A1 | 11/2007 | Haverkamp et al. | |
| 2008/0024286 A1 | 1/2008 | Perras | |
| 2008/0074260 A1 | 3/2008 | Reiner | |
| 2008/0122227 A1 | 5/2008 | Hammerie | |
| 2008/0158013 A1 | 7/2008 | Nebolon et al. | |
| 2009/0040103 A1 | 2/2009 | Chansarkar et al. | |
| 2009/0050441 A1 | 2/2009 | Wanzl | |
| 2009/0051590 A1 | 2/2009 | Pitt et al. | |
| 2009/0063176 A1* | 3/2009 | French | G06Q 30/0603 705/21 |
| 2009/0283370 A1 | 11/2009 | Sonnendorfer et al. | |
| 2009/0322600 A1 | 12/2009 | Whitehead et al. | |
| 2010/0011848 A1 | 1/2010 | Costes | |
| 2010/0013701 A1 | 1/2010 | Fischer et al. | |
| 2010/0136944 A1 | 6/2010 | Taylor et al. | |
| 2010/0161179 A1 | 6/2010 | McClure et al. | |
| 2010/0259450 A1 | 10/2010 | Kainulainen et al. | |
| 2010/0321185 A1 | 12/2010 | Bernhard et al. | |
| 2011/0211521 A1 | 9/2011 | Baba et al. | |
| 2011/0307205 A1 | 12/2011 | Vassilieff | |
| 2012/0025528 A1 | 2/2012 | Sipilae et al. | |
| 2012/0098518 A1 | 4/2012 | Unagami et al. | |
| 2012/0125363 A1 | 5/2012 | Kim et al. | |
| 2012/0249325 A1 | 10/2012 | Christopher | |
| 2012/0277992 A1 | 11/2012 | Pun | |
| 2012/0316800 A1* | 12/2012 | Shteinhauz | G01M 17/025 702/56 |
| 2013/0057158 A1 | 3/2013 | Josefowicz et al. | |
| 2013/0231819 A1 | 9/2013 | Hung et al. | |
| 2013/0261964 A1 | 10/2013 | Goldman et al. | |
| 2014/0131510 A1 | 5/2014 | Wang et al. | |
| 2014/0167960 A1 | 6/2014 | Argue et al. | |
| 2014/0195104 A1 | 7/2014 | Hammerschmidt | |
| 2014/0203970 A1 | 7/2014 | Taylor et al. | |
| 2014/0232601 A1 | 8/2014 | Ische et al. | |
| 2014/0260517 A1 | 9/2014 | Demerly | |
| 2014/0297122 A1 | 10/2014 | Kouchi | |
| 2014/0306843 A1 | 10/2014 | Merkel et al. | |
| 2014/0343797 A1* | 11/2014 | Naito | B60C 23/064 701/45 |
| 2015/0032371 A1 | 1/2015 | Youssef | |
| 2015/0115936 A1 | 4/2015 | Pratap | |
| 2015/0177020 A1 | 6/2015 | An et al. | |
| 2015/0197266 A1 | 7/2015 | Carter et al. | |
| 2015/0325103 A1 | 11/2015 | Ngyuen et al. | |
| 2016/0033366 A1 | 2/2016 | Liu et al. | |
| 2016/0091317 A1 | 3/2016 | Friend et al. | |
| 2016/0259061 A1 | 9/2016 | Carter | |
| 2016/0288791 A1 | 10/2016 | Park | |
| 2016/0356675 A1 | 12/2016 | Liu et al. | |
| 2017/0049288 A1 | 2/2017 | Knutson et al. | |
| 2017/0056260 A1 | 3/2017 | Olsson | |
| 2017/0059603 A1 | 3/2017 | Zabulon et al. | |
| 2017/0067981 A1 | 3/2017 | Hannah et al. | |
| 2017/0084094 A1 | 3/2017 | Worden et al. | |
| 2017/0186068 A1 | 6/2017 | Dumouchel et al. | |
| 2018/0231577 A1 | 8/2018 | Karlsson et al. | |
| 2019/0277972 A1 | 9/2019 | Carter | |

FOREIGN PATENT DOCUMENTS

| | | |
|---|---|---|
| WO | WO 01/071372 A2 | 9/2001 |
| WO | WO 2006/102300 A2 | 9/2006 |
| WO | WO 2007/025267 A2 | 3/2007 |
| WO | WO 2013/009465 | 1/2013 |
| WO | WO 2016/015000 A2 | 1/2016 |
| WO | WO 2016/144709 | 9/2016 |
| WO | WO 2017/041045 A1 | 3/2017 |
| WO | WO 2018/165178 | 9/2018 |

OTHER PUBLICATIONS

International Preliminary Report on Patentability from corresponding International Patent Application No. PCT/US2018/021177, dated Sep. 19, 2019, in 10 pages.

Assisted GPS, Wikipedia, accessed Apr. 11, 2016.

Afzal, Muhammad Haris, Valérie Renaudin, and Gérard Lachapelle. "Assessment of indoor magnetic field anomalies using multiple magnetometers," ION GNSS. vol. 10, Sep. 2010, pp. 1-9.

Afzal, Muhammad Haris, Valerie Renaudin, and Gerard Lachapelle, "Multi-Magnetometer Based Perturbation Mitigation for Indoor Orientation Estimation," Navigation 58.4, Aug. 2011, pp. 279-292.

Beauregard, Stéphane, and Martin Klepal. "Indoor PDR performance enhancement using minimal map information and particle filters," Position, Location and Navigation Symposium, 2008 IEEE/ION, IEEE, May 2008, pp. 141-147.

Calais, E., The Global Positioning System, Presentation Slides, Apr. 2003, available at http://web.ics.purdue.edu/~ecalais/teaching/geodesy/GPS_observables.pdf.

Dellaert, Frank, et al. "Monte carlo localization for mobile robots." Robotics and Automation, 1999. Proceedings. 1999 IEEE International Conference on. vol. 2. IEEE, May 1999, in 7 pages.

Gustafsson, Fredrik, et al. "Particle filters for positioning, navigation, and tracking," Report No. LiTH-ISY-R-2333, Linkopings Universitet, Sweden, Feb. 2001, in 15 pages.

Kwon, Woong, Kyung-Shik Roh, and Hak-Kyung Sung, "Particle filter-based heading estimation using magnetic compasses for mobile robot navigation," Robotics and Automation, Proceedings 2006 IEEE International Conference on Robotics and Automation. IEEE, May 2006, pp. 2705-2712.

Loy, Matthew, et al., "ISM-Band and Short Range Device Regulatory Compliance Overview", Texas Instruments, May 2005, in 17 pages.

Ozyagcilar, Talat, "Calibrating an eCompass in the Presence of Hard and Soft-Iron Interference", Freescale Semiconductor, Inc., Document No. AN4246, Apr. 2013, in 17 pages.

Ozyagcilar, Talat, "Implementing a Tilt-Compensated eCompass using Accelerometer and Magnetometer Sensors", Freescale Semiconductor, Inc., Document No. AN4248, Jan. 2012, in 21 pages.

Pedley, Mark, "Embedded Development, Electronic Compass: Tilt Compensation & Calibration", Circuit Cellar, The World's Source for Embedded Electronics Engineering Information, Issue 265, Aug. 2012, in 8 pages.

Moeglein, M., et al., "An Introduction to SnapTrack Wireless-Assisted GPS Technology," in GPS Solutions, vol. 4, No. 3, Jan. 2001, pp. 16-26.

(56) References Cited

OTHER PUBLICATIONS

NAVSTAR GPS User Equipment Introduction, Sep. 1996.
NTIA, "1626.5-1660 MHz", https://www.ntia.doc.gov/files/ntia/publications/compendium/1626.50-1660.00_01SEP14.pdf, Sep. 2013, in 5 pages.
Ward, Phillip W., et al., "Chapter 5: Satellite Signal Acquisition, Tracking, and Data Demodulation," in Understanding GPS: Principles and Applications, Second Edition, E. Kaplan and C. Hegarty, Artech House, Mar. 2006, pp. 153-241.
Weston, J.L., et al., "Modern inertial navigation technology and its application", Electronics & Communication Engineering Journal, vol. 12, No. 2, Apr. 2000, pp. 49-64.
Wikipedia, "Multitaper", accessed online on Sep. 2, 2015, in 4 pages.
Wikipedia, "Welch's method", accessed online on Sep. 2, 2015, in 2 pages.
Office Action in corresponding Chinese Patent Application No. 201880030834.3, dated Oct. 21, 2020, in 13 pages.
Extended Search Report in corresponding European Patent Application No. 18764355.6, dated Dec. 17, 2020, in 8 pages.
Caspari, Daniel et al., "Smartphone sensor based algorithms for Dead Reckoning using magnetic field sensor and accelerometer for localization purposes," 2014 2nd International Symposium on Wireless Systems Within the Conferences on Intelligent Data Acquisition and Advanced Computing Systems, IEEE, Sep. 11, 2014, pp. 66-72.
Gupta, Shashank et al. "Experimental validation of a numerical model for subway induced vibrations", Journal of Sound and Vibration, vol. 321, Issues 3-5, Apr. 10, 2009, pp. 786-812.
Konvalin, Christopher, "Compensating for Tilt, Hard-Iron, and Soft-Iron Effects", retrieved from the Internet: http://www.sensorsmag.com/sensors/motion-velocity-displacement/compensating-tilt-hard-iron-and-soft-iron-effects-6475, retrieved on Oct. 11, 2013, Dec. 2009, in 7 pages.
Merkel, Johnny, et al., "Indoor Navigation Using Accelerometer and Magnetometer", Department of Electrical Engineering, retrieved from the Internet: http://www.diva-portal.org/smash/get/diva2:446848/fulltext01.pdf, retrieved on Jul. 25, 2019, Oct. 3, 2011, in 70 pages.
Moafipoor, Shahram, et al., "Adaptive Calibration of a Magnetometer Compass for a Personal Navigation System", International Global Navigation Satellite Systems Society, IGNSS Symposium 2007, The University of New South Wales, Sydney, Australia, Dec. 4-6, 2007, in 12 pages.
Primdahl, Fritz, "Temperature compensation of fluxgate magnetometers," IEEE Transactions on Magnetics, vol. 6, Issue 4, Dec. 1970, pp. 819-822.

\* cited by examiner

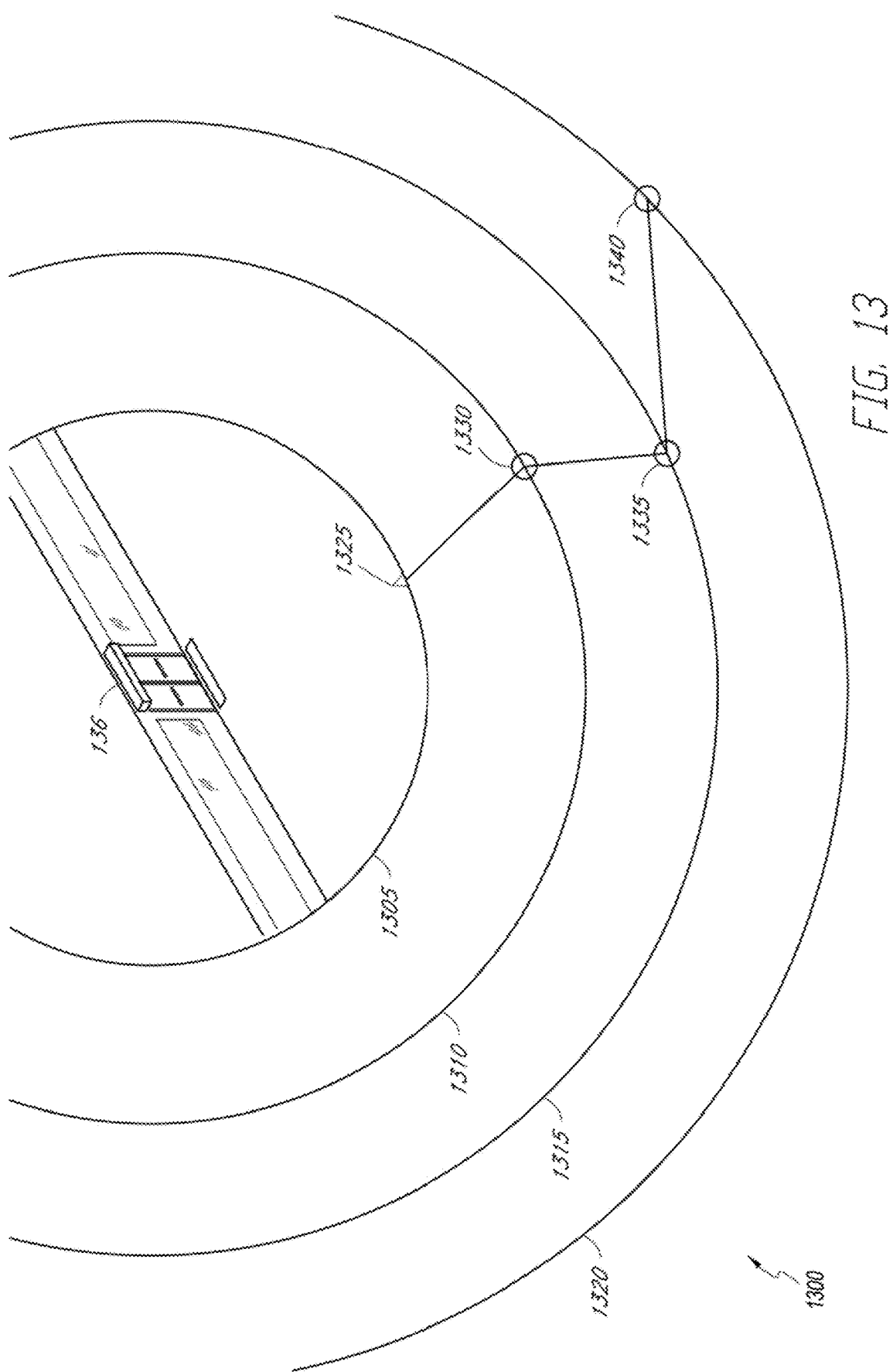

ANTI-THEFT SYSTEM THAT USES SHOPPING CART LOCATION AND VIBRATION DATA

CROSS-REFERENCE TO RELATED APPLICATIONS

This application is a continuation of U.S. patent application Ser. No. 16/275,066, filed Feb. 13, 2019, entitled NAVIGATION SYSTEMS FOR WHEELED CARTS, which is a continuation of U.S. patent application Ser. No. 15/913,468, filed Mar. 6, 2018, entitled NAVIGATION SYSTEMS FOR WHEELED CARTS, which claims the benefit of priority to U.S. Provisional Patent Application No. 62/468,913, filed Mar. 8, 2017, entitled NAVIGATION SYSTEMS FOR WHEELED CARTS, each of which is hereby incorporated by reference herein in its entirety.

BACKGROUND

Field

The disclosure generally relates to systems and methods for locating movable objects and more particularly to systems and methods that use dead reckoning techniques to locate movable objects such as wheeled carts.

Description of the Related Art

A variety of methods has been used to determine the position of an object in a tracking area. For example, a radio frequency (RF) transmitter or tag can be attached to the object, and one or more receivers in the tracking area can monitor tag transmissions to determine object position. However, such methods are disadvantageous if the tracking area is large, which requires installation of many receivers, or if the tracking area contains structures that attenuate the tag transmissions. Other methods utilize a Global Navigation Satellite System (GNSS, e.g., Global Positioning System (GPS)) to determine position. However, GNSS methods can fail if the GNSS signal is blocked or if the visibility of satellites is interrupted. Further, both GNSS systems and RF tag and receiver systems can be expensive and difficult to implement.

SUMMARY

Examples of systems and methods for locating movable objects such as carts (e.g., shopping carts) are disclosed. Such systems and methods can use dead reckoning techniques to estimate the current position of the movable object. Various techniques for improving accuracy of position estimates are disclosed, including compensation for various error sources involving the use of magnetometer and accelerometer, and using vibration analysis to derive wheel rotation rates. Also disclosed are various techniques to utilize characteristics of the operating environment in conjunction with or in lieu of dead reckoning techniques, including characteristic of environment such as ground texture, availability of signals from radio frequency (RF) transmitters including precision fix sources.

Navigation systems and methods can include navigation history and backtracking, motion direction detection for dual swivel casters, use of gyroscopes, determining cart weight (e.g., whether loaded or unloaded), multi-level navigation in a multi-level structure (e.g., buildings with multiple floors), multi-level magnetic measurements (e.g., using multiple magnetometers to perform heading measurements at different heights on the cart), use of lighting signatures to determine cart location (e.g., alone or in combination with dead reckoning), use of multiple navigation systems (for improved accuracy or in case of failure of one of the systems), or hard/soft iron compensation for different cart configurations (e.g., a shopping cart with the child seat open versus the child seat closed).

Such systems and methods can be applied in both indoor and outdoor settings and in, e.g., retail, transportation (e.g., airport, train, subway, bus depots), medical (e.g., hospital or clinic), or warehouse settings.

Details of one or more implementations of the subject matter described in this specification are set forth in the accompanying drawings and the description below. Other features, aspects, and advantages will become apparent from the description, the drawings, and the claims. Neither this summary nor the following detailed descriptions purport to define or limit the scope of the inventive subject matter.

BRIEF DESCRIPTION OF THE DRAWINGS

FIG. 13 illustrates a scenario of dead reckoning aided by received signal strength indicator (RSSI).

Figure 1:
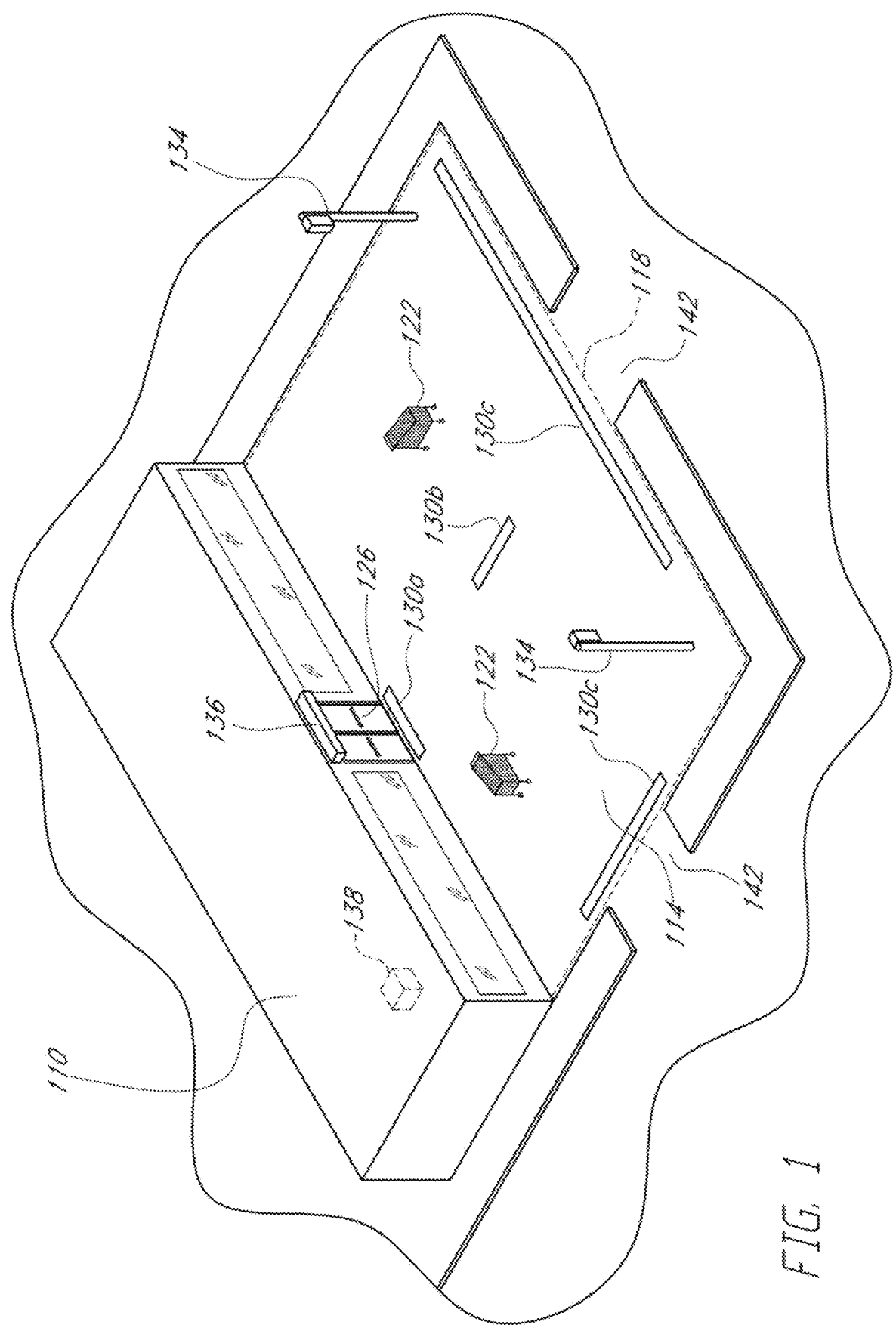
FIG. 1 is a perspective view of a retail store and associated property, illustrating components of a navigation system as a part of a cart containment system.

Throughout the drawings, reference numbers may be re-used to indicate correspondence between referenced elements. The drawings are provided to illustrate example embodiments described herein and are not intended to limit the scope of the disclosure.

DETAILED DESCRIPTION

I. Overview

It is often desirable to track the position of an object as it moves throughout a tracking area. A facility such as, for example, a retail store, a hospital, an airport, or a warehouse, may wish to monitor the location of objects such as vehicles, carts, carriers, transports, and the like. The facility can use object location information, for example, to track inventory movements, to improve access to and retrieval of the objects, to identify clustering, queuing, or traffic patterns, and/or to prevent misplacement, loss, or theft of the objects. In one example, a retail store may wish to track the position of shopping carts so as to prevent the carts from being removed or stolen from a bounded area, such as a parking lot, or to ensure that a shopping cart has passed through a checkout lane before exiting the store. In another example, a facility may wish to map the architectural configuration of a building by using a wheeled object to measure positions of various landmarks.

It can be desirable to estimate the motion track and/or present position of a wheeled object via dead reckoning (DR), e.g., by integrating estimated heading and longitudinal travel (e.g., distance or speed) of the object over time. In some cases it can be desirable to estimate the longitudinal travel by directly counting rotations of a wheel (e.g., with a Hall effect sensor, a rotary encoder, or an ultrasonic tuning fork, where the relevant sensors can have power efficient and/or low latency connections to the processing node performing the dead reckoning calculations). In some cases it can be desirable to estimate the longitudinal travel by other techniques. The wheeled object can be a non-motorized (e.g., human propelled) wheeled object including, but not limited to, a cart (such as, e.g., a shopping cart, a warehouse cart, a luggage or baggage cart, an industrial or utility cart, a pharmacy or hospital cart, etc.), a wheelchair, a hospital bed, a stroller, a walker, etc.

Accordingly, various embodiments of the systems and methods described herein provide for estimating motion of wheeled objects through dead reckoning. Some embodiments can estimate the speed of a wheeled object by remote rotation detection or acceleration sensing, in some cases combined with analysis of a vibration spectrum of the wheeled object as it moves over a surface (e.g., a floor, a parking lot, etc.). Some embodiments can estimate speed of a wheeled object through a low-power mechanism of counting wheel rotations, e.g., an ultrasonic tuning fork in a wheel. Some embodiments can estimate current position of a wheeled object through low-power RF techniques. Such embodiments can find particular application to containment of shopping carts in a retail environment without being limited to this application.

The following describes various example embodiments and implementations. These embodiments and implementations are intended to illustrate the scope of the disclosure and not intended to be limiting.

II. Example Scenario

Example implementations of dead reckoning navigation to the shopping cart containment problem can be found in U.S. Pat. No. 8,046,160 (Navigation Systems and Methods for Wheeled Objects), which is hereby incorporated by reference herein in its entirety for all it discloses. Other examples of systems and methods for estimating motion of wheeled carts are described in U.S. Pat. No. 9,731,744 (Estimating Motion of Wheeled Carts), which is hereby incorporated by reference herein in its entirety for all it discloses.

For purposes of illustration, a sample scenario in which an embodiment of the navigation systems and methods disclosed herein may be used will be presented with reference to FIG. 1. This sample scenario is intended to facilitate understanding of one embodiment and is not intended to limit the scope of the inventions disclosed and claimed.

In the sample scenario shown in FIG. 1, the navigation system is used as part of a loss prevention system by a retail store 110 to reduce the theft of shopping carts 122 from a tracking area 114. The tracking area 114 may comprise, for example, a portion of a parking lot adjacent to the store 110. An objective of the loss prevention system is to prevent, or at least reduce, the unauthorized transport of carts 122 across a boundary (or perimeter) 118 of the lot 114. In one embodiment of the loss prevention system, each cart 122 may include an anti-theft system comprising, for example, an alarm or a mechanism to inhibit motion of the cart 122. Cart motion can be inhibited by providing at least one wheel of the cart 122 with a brake mechanism configured to brake or lock the wheel such as, for example, the brake mechanism disclosed in U.S. Pat. No. 6,945,366, issued Sep. 20, 2005, titled "ANTI-THEFT VEHICLE SYSTEM," which is hereby incorporated by reference herein in its entirety for all it discloses. In other embodiments, cart motion can be inhibited by other wheel brakes, wheel locks, or wheel rotation inhibitors.

To prevent loss, if the cart 122 is moved across the lot boundary 118, the anti-theft system is activated (e.g., the alarm and/or the brake is triggered). In some loss prevention systems, the anti-theft system is activated if the cart 122 detects a signal from an external transmitter positioned near the lot boundary 118. For example, the signal may be a very low frequency (VLF) electromagnetic signal transmitted from a wire buried at the boundary 118, such as described in U.S. Pat. No. 6,127,927, issued Oct. 3, 2000, titled "ANTI-THEFT VEHICLE SYSTEM," which is hereby incorporated by reference herein in its entirety for all it discloses. Such loss prevention systems require external components (e.g., the buried wire) to be installed.

The navigation system disclosed herein may advantageously be used in conjunction with a loss prevention system, because the navigation system autonomously enables the position of the cart 122 to be determined. If the navigation system determines the position of the cart 122 to be outside the lot boundary 118, the anti-theft system can be activated. In one embodiment, the navigation system begins to monitor cart position when the cart 122 leaves a store exit 126. The initial cart position is set to be the position of the exit, and the navigation system updates the position of the cart 122 as it moves throughout the lot 114. In some embodiments, the navigation system is provided with the position of the lot boundary 118, for example, as a set of coordinates. By comparing the present position of the cart 122 with the position of the boundary 118, the system can determine whether the cart 122 is within the lot 114. If the navigation system determines the cart 122 is moving across the lot boundary 118, the navigation system can activate the cart's anti-theft system. In various embodiments, the navigation system can include features of the anti-theft system or vice-versa. Many combinations of the functionality of navigation, theft prevention, wheel locking, and so forth are contemplated and various systems may choose to embody some or all of these functionalities in different combinations.

In other embodiments, the navigation system communicates the position of the cart 122, or other information, to a central processor or controller 138, which determines whether the cart 122 has exited the lot 114 and whether the anti-theft system should be activated. In certain embodiments, the cart 122 comprises a two-way communication system that enables suitable information to be communicated between the cart 122 and the central controller 138 (or other suitable transceivers). A two-way communication system suitable for use with the navigation system is further discussed in U.S. Pat. No. 8,463,540 (Two-Way Communication System for Tracking Locations and Statuses of Wheeled Vehicles), which is hereby incorporated by reference herein for all it discloses.

Other devices and components can be advantageously used by the retail store 110 in this sample scenario. For example, one or more markers 130a-130c can be disposed at various locations throughout the lot 114 to serve as reference locations, landmarks, or beacons. The markers 130a-130c can mark or otherwise indicate the position of, for example, store exits 126 (e.g., marker 130a), the perimeter of the lot 114 (e.g., markers 130c), and/or other suitable reference locations (e.g., marker 130b). In various embodiments, the markers 130a-130c communicate information to the navigation system by, for example, magnetic methods or other electromagnetic methods. The navigation system may use information from a marker 130a-130c to reset the cart's position (e.g., to reduce accumulated dead reckoning errors), to determine that a lot boundary 118 is nearby, or for other purposes. In some embodiments, one or more markers (such as the markers 130c) may be disposed near locations of entrances/exits 142 to the parking lot 114.

In certain embodiments, the markers 130a-130c are configured to indicate a reference direction or other information. For example, the marker 130a may be positioned at the exit 126 and oriented so that its reference direction points outward, toward the lot 114. The navigation system can detect the reference direction and determine whether the cart is entering or exiting the store 110. Similarly, the markers 130c can indicate an outward direction at the perimeter 118 of the lot 114. In some embodiments, some or all of the markers 130a-130c can be configured to communicate other types of information to the navigation system as further described below.

In one embodiment, one or more transmitters 134 are disposed throughout the lot 114 and configured to transmit information to the navigation system in the carts 122. The transmitters 134, in an embodiment, also receive information (e.g., they are transceivers). In various embodiments, the markers 130a-130c (e.g., the transmitters 134 and/or the access points 136) communicate with the carts 122 via one-way (to or from the cart) or two-way (to and from the cart) communication protocols. For example, the markers 130, transmitters 134, and/or access points 136 may be configured to use electromagnetic signals to communicate with the cart 122. These signals may include magnetic signals and/or radio frequency (RF) or VLF signals. As used herein, RF signals comprise electromagnetic signals having frequencies below about 300 GHz, and VLF signals comprise RF signals having frequencies below about 20 kHz.

In other embodiments, one or more access points (AP) 136 are used to create two-way communication links with the carts 122. In FIG. 1, the access point 136 is shown positioned above the exit 126 of the store 110, which beneficially allows the AP to communicate with carts 122 located throughout the parking lot 114. In other implementations, more than one AP can be used, and the AP's can be located throughout the tracking area. Access points 136 can communicate with a transceiver in the cart 122 (e.g., an RF transceiver), which is connected to the navigation system (and/or other components) for purposes of retrieving, exchanging, and/or generating cart status information, including information indicative or reflective of cart position. The types of cart status information that may be retrieved and monitored include, for example, whether an anti-theft system has been activated (e.g., whether a wheel brake is locked or unlocked); whether the cart 122 is moving and in which direction; the wheel's average speed; whether the cart 122 has detected a particular type of location-dependent signal such as a VLF, electronic article surveillance (EAS), RF, or magnetic signal; whether the cart is skidding; the cart's power level; and the number of lock/unlock cycles experienced by the cart per unit time. The access points 136 can also exchange information with the navigation system related to the position of the perimeter 118. In some embodiments, the cart 122 uses a received signal strength indicator (RSSI) to measure the strength of the signal received from the access points 136 to assist in determining the distance from the cart 122 to the access points 136 and whether the cart is moving toward or away from the store 110. In other embodiments, the access points 136 use an RSSI to measure the strength of the signal received from the carts 122 to determine the location and motion of the carts 122.

The navigation system may be used by the store 110 for purposes additional to or different from loss prevention. In some embodiments, the retail store 110 may wish to gather information related to the positions and paths taken by the carts 122. For example, the retail store may wish to determine where in the lot 114 customers leave carts 122 so as to improve cart retrieval operations. In other embodiments, the navigation system can communicate with other devices such as, for example, a mechanized cart retrieval unit.

Although the sample scenario has been described with reference to a loss prevention system for shopping carts 122 in a parking lot 114 outside a retail store 110, in some embodiments, the navigation system is configured to determine the position of a cart 122 within the store 110. For example, the system may be used to determine whether a cart 122 has passed through a checkout lane or whether the cart 122 has passed through selected aisles. In addition, the navigation system may be used to track cart positions so as to gather information related to the clustering or queuing of carts at certain locations inside or outside the store 110.

Many uses are possible for the navigation system, and the discussion of the sample scenario herein is not intended to be limiting.

In some embodiments, the navigation system is disposed in or on the cart 122, while in other embodiments, some of the functions of the navigation system are carried out by components remote from the cart 122 (e.g., the central controller 138). In an embodiment, the navigation system is sized so as to fit within a wheel of the cart 122, a frame of the cart, or a handlebar of the cart. In certain such embodiments, the wheel is a shopping cart wheel (either a front wheel or a rear wheel). In some embodiments, the wheel has a diameter of about five inches, while in other embodiments, the diameter of the wheel is less than about five inches or greater than about five inches. In other embodiments, portions of the navigation system can be disposed in one (or more) of the object's wheels, while other portions can be disposed elsewhere in the cart 122, for example, in a wheel assembly attaching the wheel to the cart 122 (e.g., a caster or a fork), or in another location in or on the cart 122 (e.g., in the handlebars or the frame).

The navigation system can be powered by a variety of sources. For example, the navigation system may use electrochemical sources (e.g., disposable or rechargeable batteries), photovoltaic power sources (e.g., a solar cell), fuel cells, mechanical power sources, or any other suitable source. In some embodiments, the navigation system is powered by a generator that stores a portion of the wheel's rotational kinetic energy as electrical energy such as, for example, the wheel generator disclosed in U.S. Pat. No. 8,820,447 (Power Generation Systems and Methods for Wheeled Objects), which is hereby incorporated by reference herein in its entirety for all it discloses.

The power source may be integral with or remote from the navigation system. For example, in embodiments where the system is disposed in a wheel, the power source may be disposed in the wheel and/or elsewhere in or on the cart 122 (e.g., in the wheel assembly, the handlebars, or the frame). In some embodiments, such as those facilitating a loss prevention system, the navigation system is activated only when a cart 122 has exited the store 110 so as to prevent power loss while the cart 122 is located within the store 110, where theft of the cart is less likely.

Embodiments of the navigation systems and methods may be used in other environments and contexts such as, for example, a warehouse, an industrial plant, an office building, an airport, a hospital, or other facility. Additionally, embodiments of the navigation system and methods are not limited to use with shopping carts but are intended to be used with any other moveable objects and particularly with any other wheeled objects. Many variations of the sample scenario discussed above are possible without departing from the scope of the principles disclosed herein.

III. Dead Reckoning Systems a. Basic Concepts of Dead Reckoning

A dead reckoning system can provide an estimate of the current position of an object with information of a starting position, direction or heading as a function of time, and speed of travel or distance traveled as a function of time. This is further described in the incorporated-by-reference U.S. Pat. No. 8,046,160.

Figure 7:
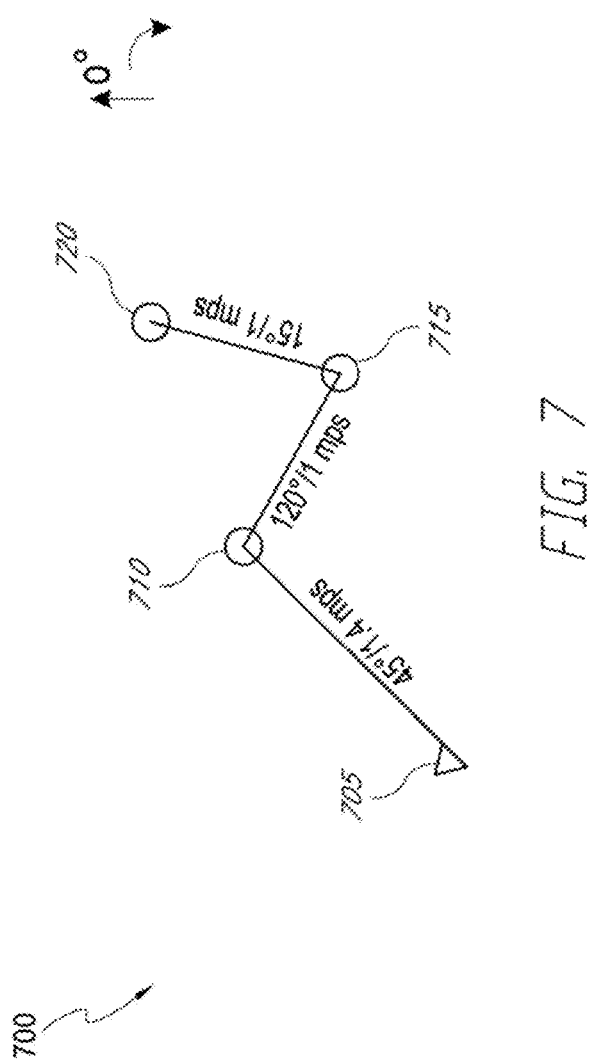
FIG. 7 illustrates a dead reckoning scenario.

FIG. 7 illustrates a simple dead reckoning scenario map 700. An object starts at position 705 and travels at 45° angle (0° points north, and angle measurement increments clockwise) and at 1.4 m/s, arriving at position 710 one second later. The object then travels at 120° angle and at 1 m/s, arriving at position 715 one second later. Finally, the object travels at 15° angle and at 1 m/s, arriving at position 720 1 second later. Dead reckoning can compute a current position (e.g. 720) from an initial position (e.g. 705) through integration (in continuous-time domain) or summation (in discrete-time domain) of velocity (e.g., direction and speed) starting from the initial position.

Dead reckoning can be performed, for example, through data provided by a magnetometer and a wheel rotation counter attached to the wheeled moving object. The magnetometer provides data on heading or direction. The rotation counter provides data through which speed can be derived. The instantaneous heading of a wheeled object can be obtained via a two- or three-axis magnetometer along with the known vector components of the geomagnetic field where the object is located. The magnetometer can be mounted to the body of the object to be tracked and function as a compass. The accelerometer can be used to adjust for the case where the surface on which the wheeled object travels is not level.

Longitudinal speed of a wheeled object can be estimated by measuring the rotation rate of one or more of the wheels. The speed can be computed as the rotation rate (e.g., angular speed of the wheel in revolutions per unit time) multiplied by the circumference of the wheel. Multiple techniques for measuring the incremental rotation of a wheel or axis can be used, e.g., Hall effect sensors and shaft encoders. Examples of such techniques are described in the incorporated-by-reference U.S. Pat. No. 8,046,160.

A. Example Shopping Cart

Figure 2:
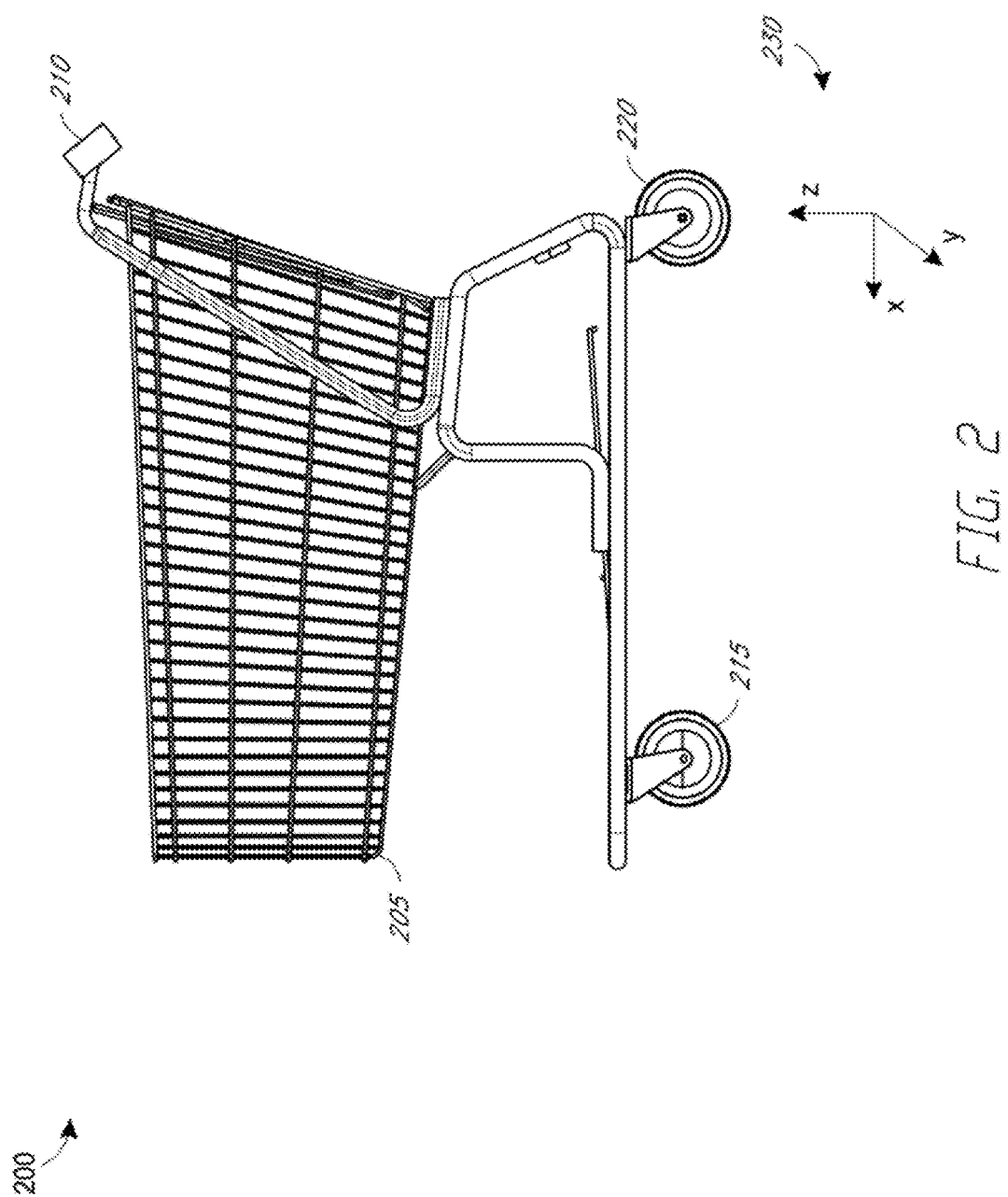
FIG. 2 illustrates a shopping cart with a navigation system and one or more smart wheels.

FIG. 2 shows features of an example shopping cart 205 with features according to the present disclosure. The shopping cart 205 comprises a handle-mounted smart positioning system 210, one or more anti-theft wheels 215 (which can brake, lock, or inhibit rotation of the wheel), and one or more optional ultrasonic vibration enhanced wheels 220. One or more anti-theft wheels 215 can be a smart locking wheel, e.g., a wheel with a sensor, a communication system, and/or a processor in addition to a locking mechanism. The functionalities of the navigation system and the anti-theft system can be distributed between the smart positioning system 210 and the smart locking wheel 215. For example, one or both of the smart positioning system 210 and the smart locking wheel 215 can have exit/entrance event detection capability; the anti-theft functionality of wheel locking can be located in the smart locking wheel 215 while the anti-theft functionality of user warning can be located in the smart positioning system 210. These components are described below. FIG. 2 also shows a coordinate system 230 that can be used for navigation calculations where the x-axis is in the forward direction of cart motion, the y-axis is perpendicular to the x-axis and in the horizontal direction, and the z-axis points vertically upwards.

In this disclosure, the term "user" means the individual who is using a particular cart at a particular time. The term "customer" means the organization, and the suitably authorized individuals therein, which can own a particular installation of the shopping cart containment system, and which can determine the policies that the particular installation of shopping cart containment system implements. For example, the customer can be a retail store that acquires the navigation and shopping cart containment system, and the user can be a consumer who shops at the retail store or a store employee who retrieves shopping carts (e.g., from a parking lot).

B. Example Smart Positioning System/Smart Locking Wheel Implementation

Figure 3:
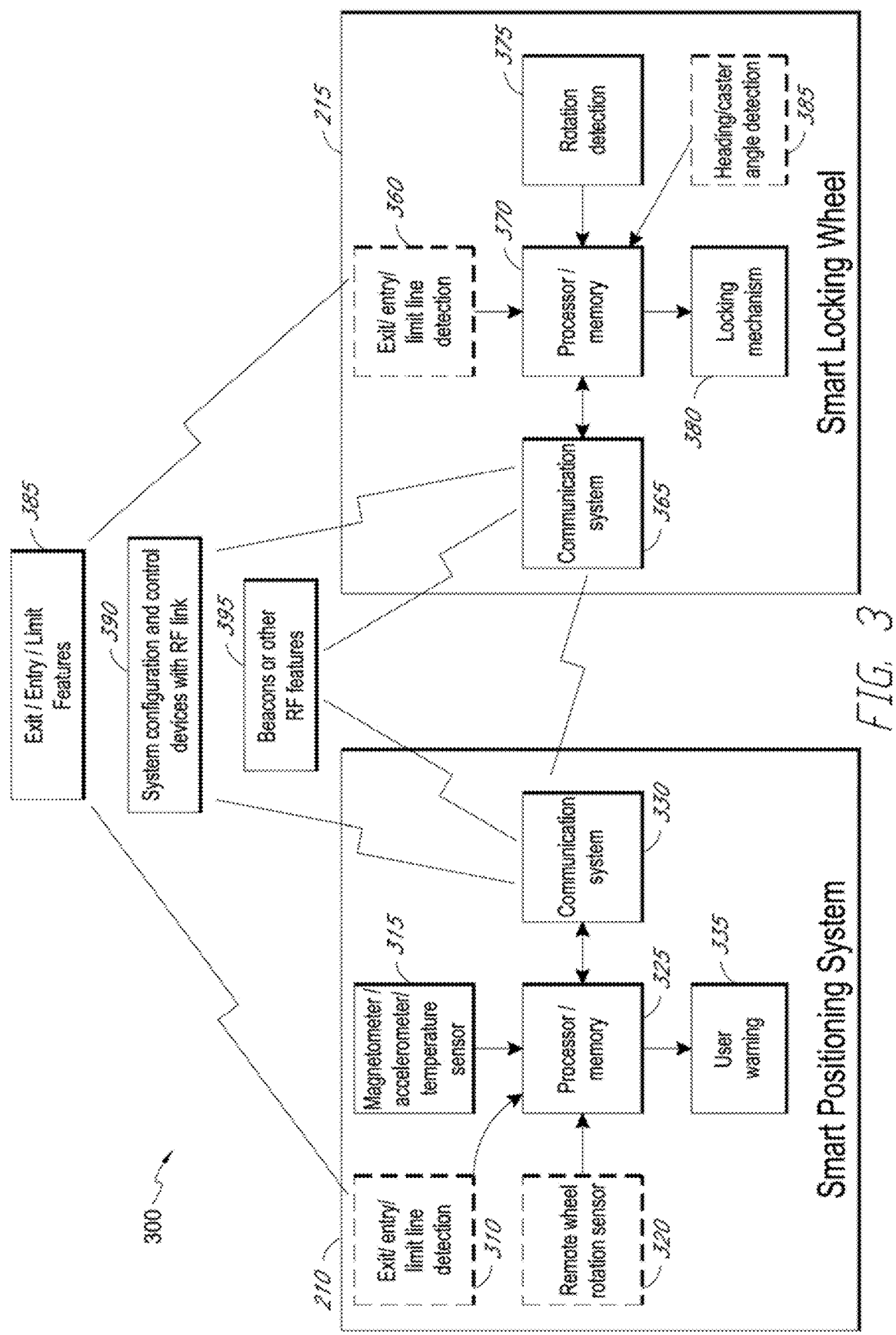
FIG. 3 illustrates the components of an embodiment of a cart containment system.

FIG. 3 shows a component set 300 of an example cart (e.g., a shopping cart) tracking system. The example component set includes the following components: (1) a smart positioning system 210; (2) a smart locking wheel 215; (3) fixed features 385 associated with exits and/or entrances to the store; (4) system configuration and control devices 390; (5) RF beacons or other RF features 395.

The smart positioning system 210 comprises (1) sensor elements 315 to determine the cart's heading and speed (e.g., a magnetometer and/or accelerometer) and, optionally, the temperature of the system (e.g., a temperature sensor); (2) an optional sensor 320 providing data from which wheel rotation rate can be inferred (e.g., without the sensor being in proximity to the wheel), for example, a vibration sensor; (3) a processor and memory 325; (4) a communication system 330 to communicate (e.g., via an RF link) with a smart locking wheel 215, system configuration and control devices 390, and/or RF beacons or other RF features 395; (5) an optional detector 310 configured to determine that the cart is passing through an exit/entrance of a store (an exit/entrance event), and, in some embodiments, whether the motion is exiting the store or entering the store. In some embodiments, circuitry in a wheel performs the actual function of detection; the smart positioning system communicates with the detection circuitry in the wheel to obtain exit/entrance information. Certain embodiments may have detector 360 as a primary detector and detector 310 as a secondary detector; and (6) an indicator 335 (e.g., visual and/or audible) to provide a notification to the user to show that the cart is in a warning zone and/or about to lock. The indicator may include a display configured to output text or images (e.g., a warning to the user that a containment boundary is nearby and the wheel will lock if the wheeled object is moved beyond the containment boundary). The indicator may include a light (e.g., a light emitting diode (LED)) that illuminates or flashes as a notification to the user. The indicator may include audible alerts or notifications. In some embodiments, the indicator comprises a voice synthesizer that can output a human-understandable message such as "cart is approaching a limit and is about to lock." In some such embodiments, a customer and/or a user can select the characteristics of the voice that is synthesized (e.g., language synthesized (e.g., English, Spanish, German, French, Chinese, etc.), sex of the voice speaker (male or female), age of the speaker (e.g., youth, young adult, adult, elderly)). The voice synthesizer can include one or more voice types for each of these characteristics (e.g., voices with different pitches, tones, registers, timbres, etc.). The indicator may provide a selection interface (e.g., drop down menu, selection boxes, etc.) by which the customer and/or the user can select (or hear a sample) of a desired voice. The indicator can include a speaker to output the audible notification. The smart positioning system 210 may also include a light detector 333 for detecting ambient light signatures for use in navigation or a vertical position detector 337 (e.g., a pressure sensor) used for determining on which level of a multi-level structure the smart positioning system is located. The functionalities of these components are further described below.

The smart locking wheel 215 comprises (1) a locking mechanism (e.g., a brake) 380 configured to inhibit rotation of the wheel when the locking mechanism is actuated; (2) a wheel rotation detector 375, e.g. a tuning fork and a striker (e.g., the part which hits the tuning fork as the wheel rotates); (3) a processor and memory 370; (4) a communication system 365 configured to communicate with the smart positioning system 210, system configuration and control devices 390, and/or an RF beacon or other RF features 395; (5) an optional detector 360 configured to detect an exit/entrance event, and, in some embodiments, whether the motion is exiting the store or entering the store; and (6) an optional heading/caster angle detector 383 configured to detect the heading of a (castered) wheel.

The fixed features 385 can be associated with exits and entrances to the store. The proximity of these features can be detected by the detector in either the smart positioning system or in the smart locking wheel. The fixed features can be used to provide an accurate reference position to the smart positioning system (e.g., for resetting any accumulated dead reckoning position errors).

The system configuration and control devices 390 can perform housekeeping tasks such as configuration and control. The devices 390 can communicate with the communication system 330 in the smart positioning system and/or the communication system 365 in the smart locking wheel. The system configuration and control devices 390 can be the central processor or controller 138.

The RF beacons or other RF features 395 can transmit RF signals for entrance/exit detection and/or precision position fix.

An embodiment may be implemented with more or fewer than the features/components described above. Furthermore, an embodiment may be implemented with a different configuration than that described above, e.g., a rotation detector may be implemented in one of the smart positioning system and the smart locking wheel, RF beacon may communicate with one rather than both of the communication systems 330 and 365. Additionally, the functionality of the components in FIG. 3 can be combined, rearranged, separated, or configured differently than shown.

The smart positioning system can be disposed in one or more places in the wheeled object. For example, some or all of the smart positioning system can be disposed in a cart's handle, frame, caster, wheel, etc. The smart positioning system described herein can be used for applications other than cart containment. For example, the systems can be used for estimating the position, path, or speed of a wheeled object. Further, in cart containment applications, the cart can include one or more wheels configured to inhibit cart movement when activated, for example, by including a wheel brake. For example, the wheel can lock or resist rotation when the brake is actuated. Examples of cart wheels that can inhibit cart movement are described in U.S. Pat. Nos. 8,046,160, 8,558,698, and 8,820,447, all of which are hereby incorporated by reference herein in their entireties for all they disclose.

Figure 4:
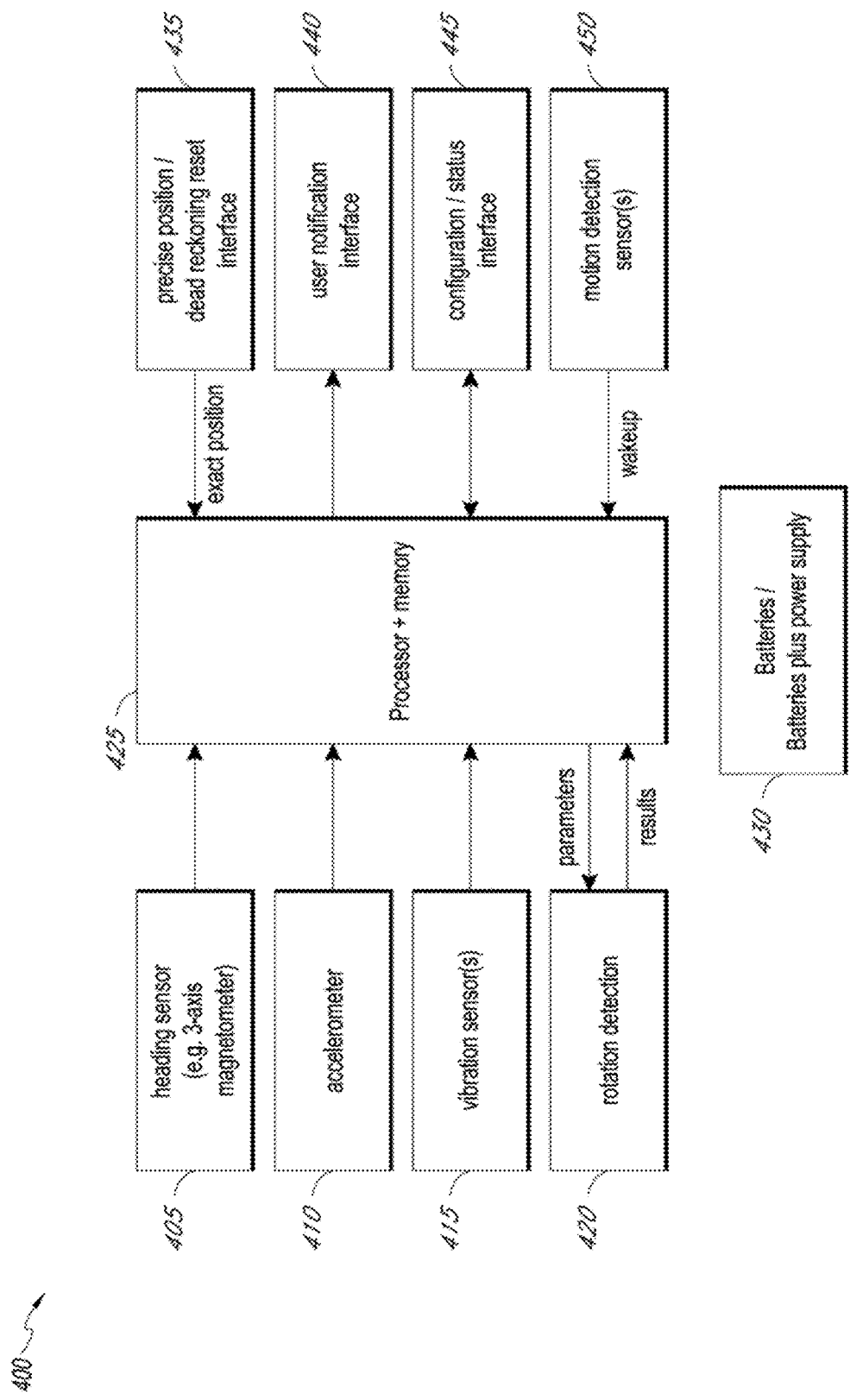
FIG. 4 illustrates the components of an embodiment of a smart positioning system.

An example architecture 400 for a navigation system containing the sensor and processing elements used to perform dead reckoning and/or precision fix is shown in FIG. 4. This architecture can be a representation of the smart positioning system 210 and the smart locking wheel 215.

The processor/memory unit 425 provides processing and data storage functions for the system. The memory can comprise nonvolatile and/or volatile memory components. For example, nonvolatile memory can be used to store program instructions, program data, and/or state variables which can persist across loss of power.

The heading sensor 405 can comprise a three-axis magnetometer. The heading sensor may additionally include a gyroscope. In some implementations, the three-axis magnetometer functionality can be provided by separate two-axis magnetometer (e.g., for the horizontal components of the local magnetic field) and a single-axis magnetometer (e.g., for vertical component of the local magnetic field). In some implementations, a two-axis magnetometer can be used, likely with less precision than an implementation with a three-axis magnetometer.

The accelerometer 410 can be of various technologies, e.g., a microelectromechanical systems (MEMS) accelerometer, a piezoelectric accelerometer, etc. Some implementation may use a three-axis accelerometer; while some other implementations may use a two-axis or a single-axis accelerometer, e.g., in cases where the wheeled object is externally limited to level surfaces.

The vibration sensor(s) 415 can include any suitable vibration sensor such as the vibration sensor described in the incorporated-by-reference U.S. Pat. No. 8,558,698, a disturbance switch, a motion switch, an acceleration switch, etc. In some embodiments, the vibration sensing function is performed by the accelerometer 410 and the vibration sensor(s) 415 is not a separate component.

The rotation detection component 420 can provide data from which wheel rotation rate can be inferred. As described in connection with FIG. 3 above, this component can be located in the smart positioning system 210 and/or the smart locking wheel 215. In embodiments where the rotation detection component 420 is located in the smart locking wheel (e.g., 420 is mapped to 375), the processor 325 in the smart positioning system can communicate with the rotation detection component 375 through communication systems 330 and 365 and processor 370. An example of a rotation detector is a vibration sensor as stated above in description of remote wheel rotation sensor 320.

In some embodiments, the rotation detection component 420 can utilize other technologies. For example, a rotation detecting wheel may comprise electronic/non-electronic components in its nonrotating/rotating portion, respectively. One such embodiment can have a rotation detecting wheel comprising a Hall effect sensor in its nonrotating portion and a magnet in its rotating portion. The processor 425 can be configured to send detection threshold and/or duty cycle as parameters to the rotation detection Hall effect sensor 420. In some embodiments, the parameters may comprise a valid range of speed of the wheel. The rotation detection component 420 can filter results based on this range before sending measurement results to the processor 425. This may advantageously reduce the overall system power consumption. In some embodiments, the rotation detection component 420 may not require any parameters from the processor 425. In some embodiments, the rotation detection component 420 comprises a tuning fork and a striker.

The motion detection sensor(s) 450 can detect motion or movement of an object to which it is attached, e.g., a wheeled object. Motion detection can be used to wake up the smart positioning system from a low-power (e.g., sleep) state. This can help preserve energy consumption by the smart positioning system.

The precise position/dead reckoning reset interface 435 can receive a precision location fix input. Such an input can be any external stimulus, e.g., RF beacons 395, entrance/exit fixed features 385, etc., which can be used to significantly reduce the error in the estimated position of the cart. After receiving a precision location fix input, the interface 435 can reset the position of the wheeled object according to the location in the input. This can clear any errors that may accumulate in position estimates through dead reckoning. Alternatively or additionally, the precise position interface 435 can provide a position estimate through techniques other than or in conjunction with dead reckoning, e.g., radius fix, hyperbolic fix, RSSI-aided dead reckoning, etc.

In some implementations, the locations of the reference points (e.g., in coordinates such as the coordinate system shown in FIG. 14 and discussed below in the section titled Example Installation and Calibration) can be preloaded into the smart positioning system, e.g., in a site configuration file. In some embodiments, reference points and smart positioning systems are time synchronized. In some embodiments, the precision location fix input can distinguish between on-demand and fixed reference points.

An on-demand reference point can transmit, e.g., beacon signals in response to a request from a smart positioning system. The smart positioning system can transmit a location fix request to an on-demand reference point to obtain a fix, e.g., to reset accumulated error through dead reckoning. The smart positioning system can be configured to request precision location fix from an on-demand reference point on an as-needed basis. This can reduce energy consumption of the on-demand reference point and/or the smart positioning system related to precision location fix and can be advantageous in installations where either or both units are energy constrained. A reference point can be configured to receive location fix requests only during certain time intervals. The smart positioning system can be configured to send a request, when needed, during a time interval when the reference point can receive requests. A site configuration file can contain location, listening time interval, and type of power source (e.g., line-powered or battery-powered) of reference points. The smart positioning system can incorporate such information in its determination of sending precision location fix requests, e.g., having a higher/lower threshold of dead reckoning estimate error for a request to a battery-/line-powered reference point, respectively. To reduce the likelihood of collisions between or among location fix requests from more than one smart positioning system, the smart positioning system can implement a collision avoidance/backoff protocol, e.g., pseudorandom backoff, exponential backoff.

A fixed reference point can broadcast its location periodically. A smart positioning system can derive broadcast time from, e.g., site configuration file downloaded to and stored in its memory. The smart positioning system can activate its precision location component only at the broadcast time. This can reduce energy consumption of receiving precision location fix input incurred by the smart positioning system.

Examples of a precision location fix input include a radio frequency (RF) beacon at a known location and a GNSS receiver integrated with the cart (e.g. in the smart positioning system).

The user notification interface 440 can provide information, messages, and/or warnings, etc. to a user of the smart positioning system. A user notification interface 440 can comprise audio components such as a buzzer, an audio amplifier, etc., and/or visual components such as an LED display, an LCD display, etc.

The configuration/status interface 445 can provide configuration and/or status information to service and/or maintenance personnel. In some embodiments, the configuration/status interface 445 can share hardware components with the user notification interface 440. In some embodiments, the configuration/status interface 445 may be implemented remotely, e.g., on a system configuration and control device 390.

The power supply 430 supplies electrical power to the smart positioning system. The power supply 430 can comprise, e.g., one or more batteries.

Functions shown as separate in the example architecture do not necessarily correspond to separate hardware components in an implementation; for example, the vibration sensing 415 and motion detection 450 functions may be performed by a single hardware component, or either function may be performed by the accelerometer 410.

C. Example Dead Reckoning System/Locking Smart Wheel Operation

Figure 5:
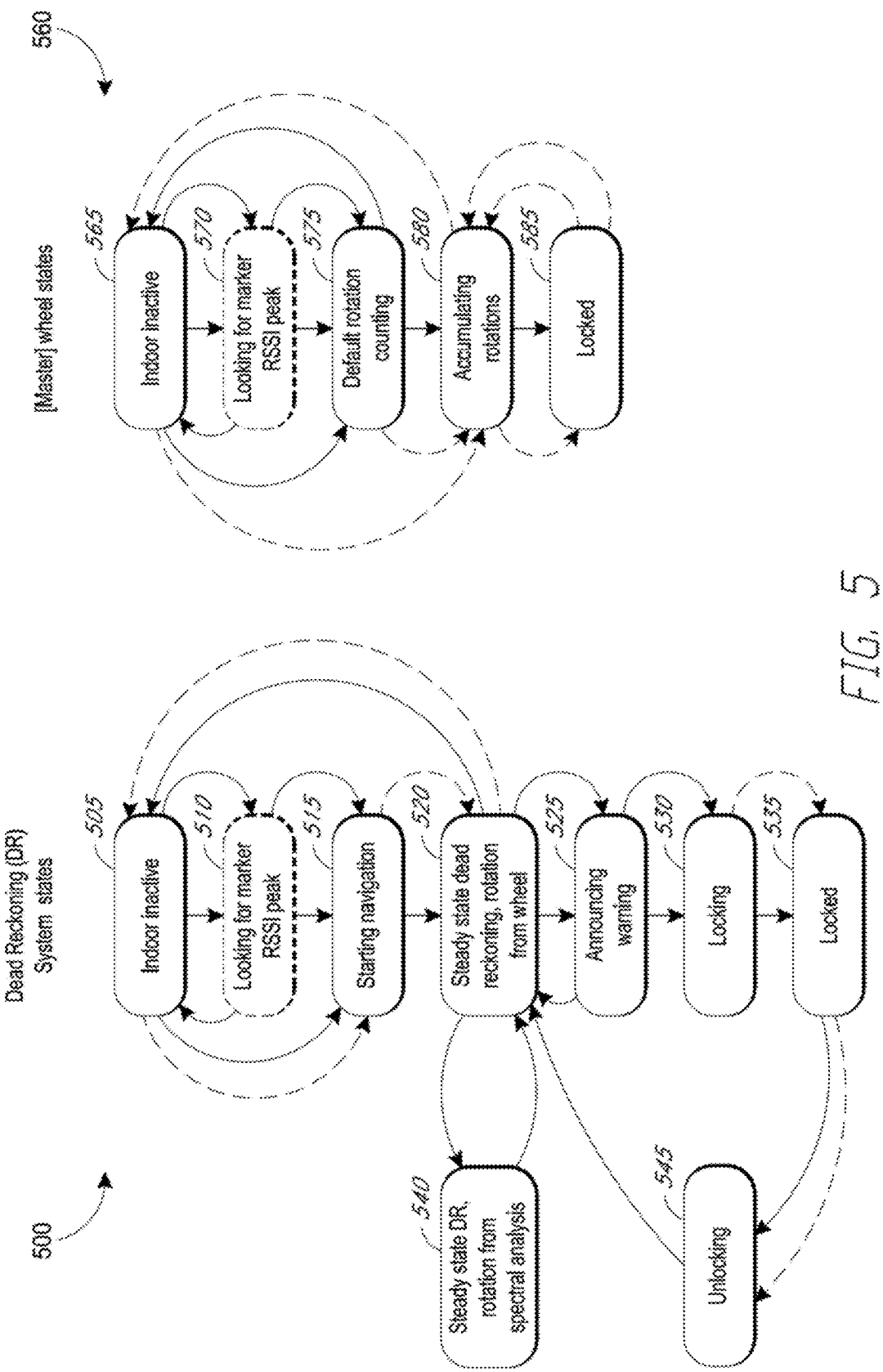
FIG. 5 is state transition diagram for an embodiment of a dead reckoning system working in conjunction with a smart locking wheel.

FIG. 5 shows a state diagram 500 of dead reckoning system logic and a state diagram 560 of smart locking wheel logic in an embodiment of a shopping cart containment system. A dead reckoning system can be an embodiment of a smart positioning system which uses dead reckoning as the primary technique for position estimation. In FIG. 5, arrows with dashed lines denote transitions initiated by the other unit (e.g., a state transition in the dead reckoning system initiated by the smart locking wheel, or vice versa). Arrows with solid lines denote transitions initiated within the respective unit itself.

For the purpose of illustration, the state transition diagrams 500 and 560 do not cover indoor navigation: the dead reckoning navigation process starts when the cart exits the store and stops when the cart reenters the store. An embodiment according to the present disclosure can have indoor navigation mode (for example, see section below titled Indoor Modes). Such an embodiment can have different state transition diagrams.

The state diagram 500 for a dead reckoning system begins at state 505, wherein a shopping cart is indoor with the dead reckoning system in an inactive mode. State 505 is selected as the initial state for the purpose of illustration, not by way of limitation. An implementation of a dead reckoning system may work its way through the state diagram from another operating state. A sensor for exit/entry/limit line detection such as 310 can monitor the presence of an exit marker. Until the sensor detects an exit marker, the dead reckoning system can remain in state 505. After the sensor detects an exit marker, the dead reckoning system can transition to state 510.

Exit markers can be located at or near an exit from the building (e.g. in the door frame, in the threshold of the door, etc.). Exit markers can use 2.4 GHz transmitters, magnetic barcodes, EAS, etc. Transmission from an exit marker may sometimes be received farther inside the building (e.g., a store) than desirable for detecting an exit event because the transmitter power of the exit marker may need to be high enough that shopping carts can consistently and reliably detect exit events. Such a high level of power can result in an exit detector 310 and/or 360 sometimes detecting an exit marker while the cart is still inside the store (e.g., a customer picking up merchandise that is along the front edge of the store). In state 510, the navigation system can analyze or learn the marker's RSSI over time to reduce the likelihood of false positive detections. For example, an embodiment can correlate an increasing level of RSSI followed by a decreasing level of RSSI (with the intervening peak likely indicating a close distance from an exit marker) with a concurrent change in vibration signatures (e.g., from vibrations on smooth indoor flooring to vibrations on concrete, indicating an exit event). A positive correlation can increase the confidence level of a true positive detection of an exit event. If no RSSI peak is found, the logic transitions back to state 505. If an RSSI peak is found, the logic transitions to state 515.

The logic may also enter state 515, directly from state 505, via two mechanisms. First, a precision exit detection by the dead reckoning system can cause the logic to transition directly from state 505 to state 515 (denoted by the solid line). As described herein, a dead reckoning system can include a feature such as beacon detection which can be used to detect an exit event. Secondly, a wake-up signal from the smart wheel can cause the logic to transition directly from state 505 to state 515 (denoted by the dashed line). An installation of a cart tracking system within a single store may use one or a plurality of technologies for entrance/exit markers, e.g., 2.4 GHz transmitters, 8 kHz transmitters, magnetic barcodes, EAS, etc. Thus, an exit/entrance event may be detected by either the smart wheel or the dead reckoning system, which can inform its counterpart of the detected event.

At state 515, the dead reckoning system starts dead reckoning navigation mode. The system can synchronize its state with the smart wheel and transition to state 520. In an embodiment, the smart wheel and dead reckoning system can have periodic, two-way communications for housekeeping purposes when the cart is not in the dead reckoning navigation mode. The period of such communications can result from a trade-off between latency and power consumption and can be, for example, 1 to 2 seconds, e.g., 1.8 seconds. When the cart is in the dead reckoning navigation mode, the period of such communications may be decreased, e.g., to less than 1 second. When the cart is in or near a warning zone and/or the containment boundary, the period may be decreased, e.g., to its lowest operational value such as less than 0.75 or 0.5 second (or some other value). Outside the business hours of the store, or if the cart has not been active for a long time (e.g., 30 minutes, an hour, etc.), the period may be increased, e.g., to minutes or tens of minutes. At the start of the dead reckoning navigation mode, there can be a burst of communications between the smart wheel and the dead reckoning system for the purpose of navigation. The burst of communications can synchronize the states of the two units.

At state 520, the system can receive rotation data from the smart wheel in a steady state of dead reckoning functionality. The system can perform speed estimation directly from wheel rotation data and/or acceleration data if such data is available and reliable (state 520). Additionally or alternatively, the system can perform wheel rotation rate or speed estimation through data analysis (e.g., spectral analysis and/or acceleration data analysis) if wheel rotation data is not available or is unreliable (state 540). Spectral analysis is described below.

If an entrance event (e.g., the cart is moved into the store through an entrance) is detected by either the dead reckoning system or by the smart wheel, the logic can transition from state 520 back to state 505. If the cart is detected to have entered a warning zone, the logic can transition to state 525. The system can announce warning, e.g., through audio and/or visual outputs from user warning component 335. If the cart is detected to have exited the warning zone toward the store, the logic can terminate the warning and transition back to state 520. On the other hand, if the cart is detected to have exceeded the containment boundary, the logic can transition to state 530. At state 530, the dead reckoning system can initiate a locking sequence of the smart wheel. When the smart wheel communicates to the system that the locking sequence is completed, the logic can transition to state 535.

When the cart is moved back into the store from the parking lot, an entrance event sometimes may not detected, and the system does not transition back to state 505 (DR inactive). This may be due to error conditions that cause the cart to miss detecting a door marker. For example, the exit/entry/limit line detector 310, 360 may not detect a marker at a store entrance/exit. In such a situation, the dead reckoning system may continue to be active while the cart is inside the store. This may be disadvantageous, because the smart positioning system will continue to process dead reckoning navigation data, which consumes battery power and shortens the time to when the battery needs to be recharged or replaced. Further, the cart may make multiple trips around the store (before exiting out to the parking lot), and accumulated navigation error inside the store may cause the smart positioning system to incorrectly infer that the cart is near a lock perimeter. This may cause a spurious transition to states 530, 535 in which the smart wheel locks inside the store, which may inconvenience the shopper or store staff.

To reduce the likelihood of inadvertent in-store operation, the store can include one or more RF beacons 395 disposed in the store. For example, FIG. 14 (further described below) shows an RF beacon 1411 disposed in store interior 1410 (e.g., toward the center of the store). The signal strength or the directional antenna pattern of the RF beacon 1411 can be set such that the RF output of the beacon has a level that is perceivable by the communication systems 330, 365 of the smart positioning system 210 or the smart locking wheel 215 substantially only within the store interior 1410 and not outside the store (e.g., in an adjacent store or the parking lot). If the signal from the RF beacon 1411 is detected by the smart positioning system, the system logic can assume that the cart is actually inside the store (because the RF signal does not extend beyond the store boundaries), and the system state transitions from state 520 (steady state DR) to state 505 (DR system inactive), even though an entrance event was not detected. The RF beacon 1411 thereby acts somewhat like a kill-switch to shut off dead reckoning within the store. Because the RF signal strength or antenna pattern of the beacon can be adjusted not to extend beyond the store boundaries, this kill-switch behavior of the beacon 1411 will not inadvertently shut off dead reckoning outside the store (e.g., in the parking lot). In the locked state 535, if the system detects that the cart has moved back to within the containment boundary, e.g., by being dragged backwards, the logic may transition to state 545. The logic may also transition from state 535 to 545 after receiving a retrieval command. A retrieval command can come from a handheld unit (e.g. in the hand of a store employee) such as a CartKey remote control, or from a CartManager powered retrieval unit, both available from Gatekeeper Systems (Irvine, Calif.). Either way, the retrieval signal can unlock the wheel and can keep the wheel unlocked for a certain period of time (e.g., several seconds to a few minutes) after the retrieval signal stops even if the cart may still be outside the containment boundary. The cart can continue to perform dead reckoning navigation while it is being retrieved.

At state 545, the system can initiate an unlocking sequence of the smart wheel. When the smart wheel communicates to the system that the unlocking sequence is completed, the logic can transition to state 520.

The state diagram 560 may be applied to a smart locking wheel 215. For a cart with a plurality of smart locking wheels, one can be selected as the master wheel. The state diagram 560 may then be applied to the master wheel. The state diagram 560 begins at state 565, wherein a shopping cart is in an indoor inactive mode. Similar to what is stated above for state diagram 500, state 565 is selected as the initial state for the purpose of illustration, not by way of limitation.

At state 565, a sensor for exit/entry/limit line detection such as 360 can monitor the presence of an exit marker. Until the sensor detects an exit marker, the smart locking wheel can remain in state 565. After the sensor detects an exit marker, the smart locking wheel can transition to state 570.

The description above of state 510 can be applicable to state 570, including the causes of transitions into and out of the state. An embodiment may have a sensor for exit/entry/limit line detection in the dead reckoning system, the smart locking wheel, or both. Depending on the system configuration, e.g., the number and/or location of such sensors, states 510 or state 570 may be omitted from the respective diagrams.

The logic may enter state 575 directly from state 565 via precision exit detection by the smart wheel. As described above in connection with FIG. 3, a smart wheel can include a feature such as beacon detection which can be used to detect an exit event. An embodiment can have such a feature in the smart wheel and/or the dead reckoning system. Depending on the system configuration, e.g., the number and/or location of such features, the direct transition from state 565 to state 575 or the direct transition from state 505 to state 515 (the solid line) may be omitted from the respective diagrams. At state 575, the smart wheel can initiate rotation counting functionality. For a smart wheel capable of detecting an entrance event (e.g., a smart wheel with sensor 360), upon detecting an entrance event, the logic can transition back to state 565 from state 575. Without detecting an entrance event, or upon a synchronization request from the dead reckoning system (e.g., during the transition from state 515 to state 520), the smart wheel can synchronize its state with the dead reckoning system and transition to state 580.

A smart wheel may also enter state 580 directly from state 565 upon receiving a command from the dead reckoning system to begin counting rotations. An embodiment of the system can perform synchronization between the dead reckoning system and the smart wheel in connection with this command, such that at the beginning of state 580 the two units are synchronized. The smart wheel may exit state 580 back to state 565 upon receiving a command from the dead reckoning system to stop counting rotations.

Upon receiving a lock command from the dead reckoning system, the smart wheel can transition to state 585, wherein the locking mechanism of the smart wheel is engaged. Upon receiving an unlock command or a retrieval command from the dead reckoning system, the smart wheel can transition back to state 580 from state 585.

As described above, in some circumstances a smart locking wheel may miss detection of an entrance marker when the cart enters a store. To prevent dead reckoning inside the store (which, e.g., may reduce battery life or lead to inadvertent wheel locking), the communication system 365 of the wheel can detect an RF signal from the RF beacon 1411, and the wheel can transition to state 565 (indoor inactive) while inside the store.

D. Example Dead Reckoning System Processing

Figure 6A:
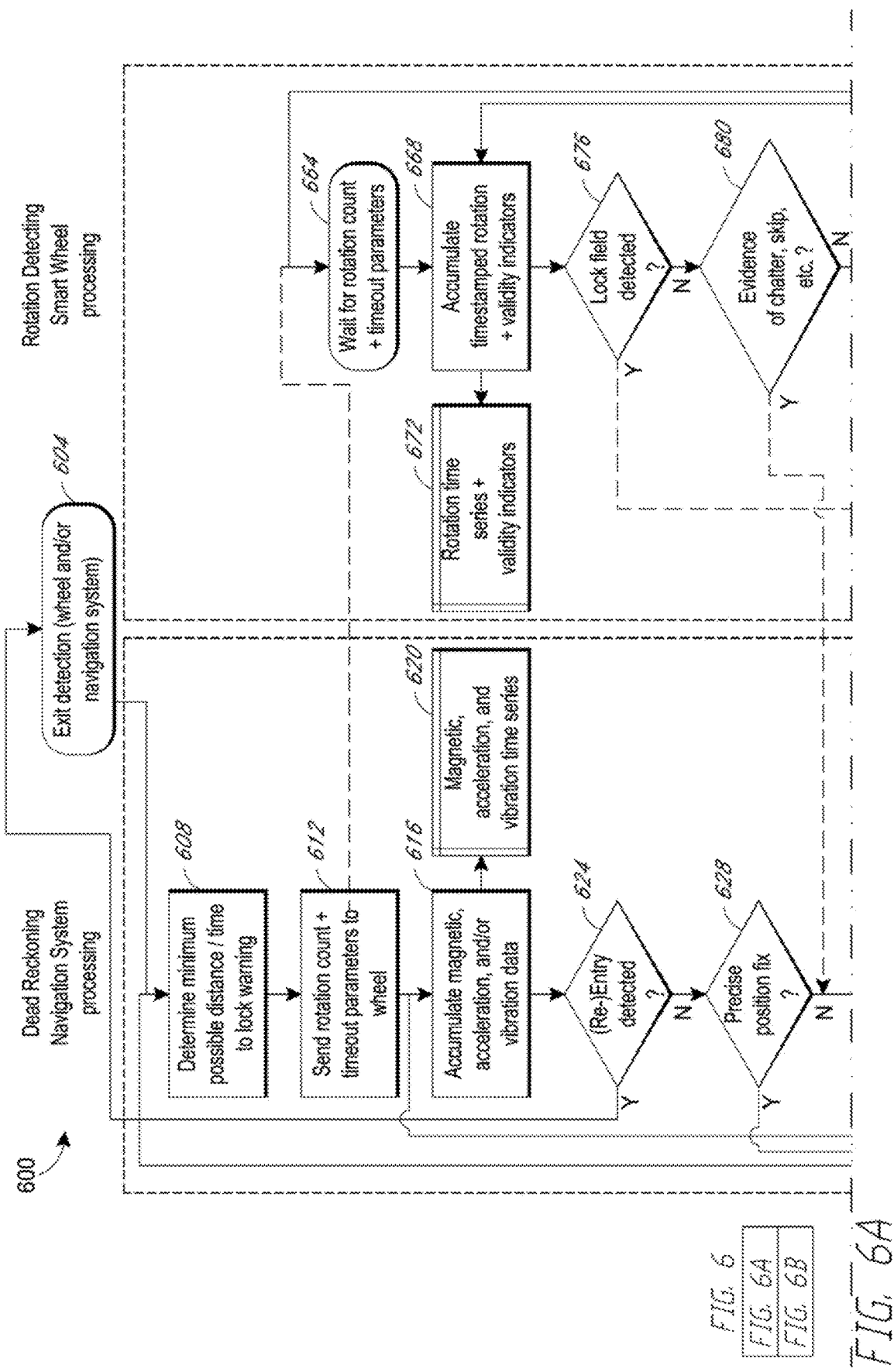
FIGS. 6A and 6B are an update loop flowchart of an embodiment of dead reckoning system with a rotation detecting smart wheel.
Figure 6B:
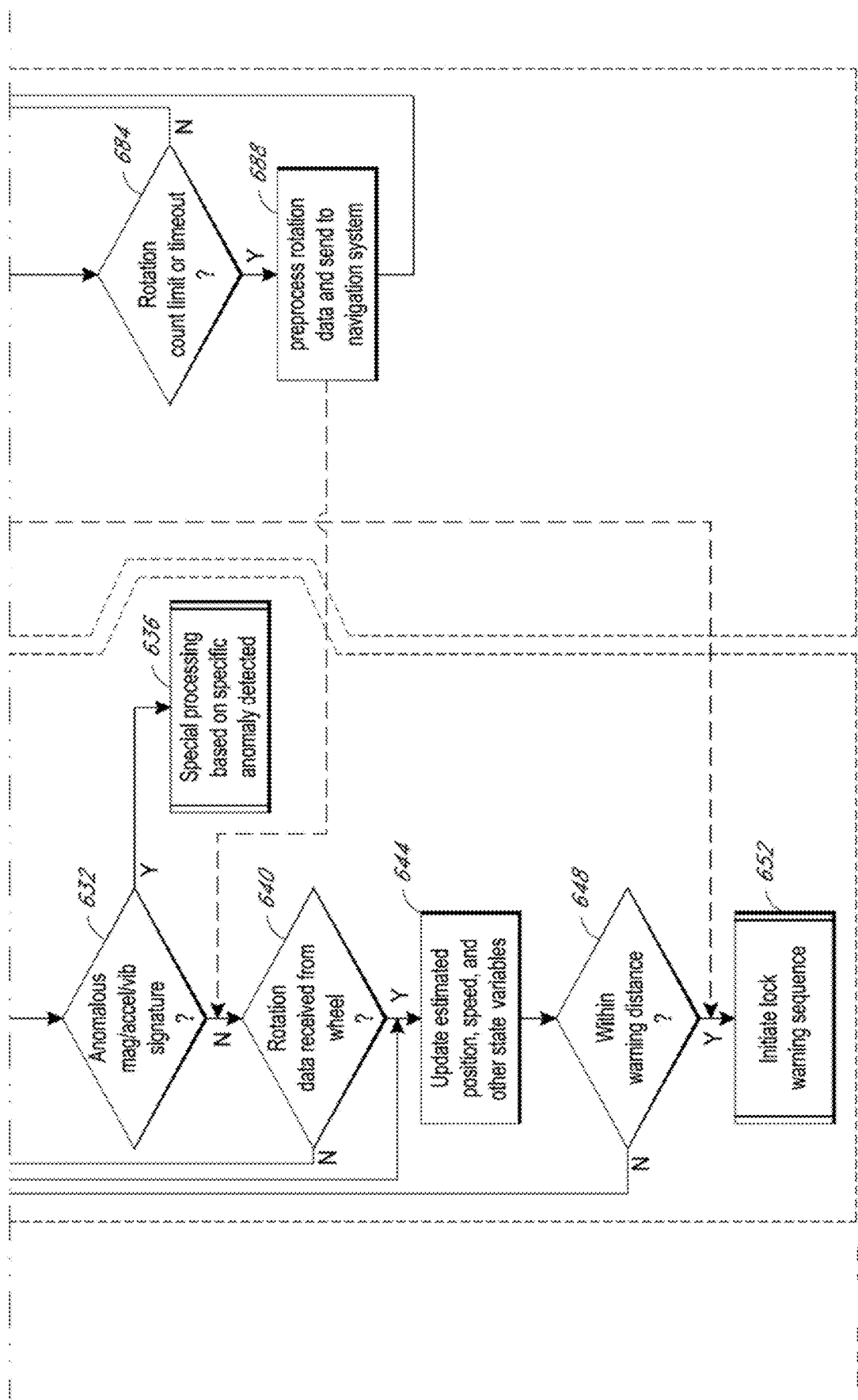

FIGS. 6A and 6B shows an example of the basic update loop under conditions where rotation is being reliably detected in the wheel. The blocks on the left side comprise processes in a dead reckoning system; the blocks on the right side comprise processes in a rotation detecting smart wheel.

For purposes of illustration and not for limitation, the loop starts at block 604. At block 604, the dead reckoning system and/or the smart wheel detects an exit event. At block 608, the dead reckoning system can determine a minimum possible distance and/or time to emitting a warning. At block 612, the dead reckoning system can send wheel rotation counts and/or timeout parameters to the smart wheel. The timeout parameters may be determined based, at least in part, on the minimum possible distance and/or time as determined in block 608. For example, if the minimum possible distance is small, the timeout period can be short, and vice versa. A choice for a timeout period can be a period which under worst case conditions and/or assumptions is still too short for the cart to cross the nearest containment boundary.

At block 616, the dead reckoning system can accumulate magnetic, acceleration, and/or vibration data. Time series may be formed from accumulated data, as represented in block 620. The time series can be processed through signal processing techniques to derive useful information. For example, acceleration data can be used to estimate the frequency of wheel rotations, as described below in the section titled Longitudinal Speed Estimation via Vibration Analysis.

At block 624, the dead reckoning system determines whether entry or reentry into the store is detected. If yes, the flow returns to block 604 and repeats therefrom. If no, the flow proceeds to block 628. At block 628, the dead reckoning system determines whether a precision position fix has been received through, e.g., precise position interface 435 in FIG. 4. If yes, the process proceeds to block 644. Otherwise the process proceeds to block 632.

At block 632, the dead reckoning system determines whether one or more signatures of the magnetic, acceleration, and or vibration data are anomalous. If yes, the dead reckoning system can proceed to perform special processing based on the specific anomaly detected, as shown in block 636. After special processing is completed, the flow may continue from a suitable block, e.g., block 640 if wheel rotation data is used in processing, block 644 if wheel rotation data is not used. If no, the process proceeds to block 640, in which the dead reckoning system can determine whether rotation data has been received from the smart wheel since the last iteration. If no, the process returns to block 616. Otherwise the process proceeds to block 644.

An anomalous magnetometer signature may, as an example, be produced when the magnetometer is in the vicinity of a vehicle, e.g., a large sports utility vehicle. The vehicle may distort the magnetometer reading such that vector magnitude of the reading deviates significantly from the expected geomagnetic field for the location. This deviation can produce an anomalous signature in the magnetometer data.

As another example, an anomalous signature may be produced by caster chatter (e.g., a castered wheel swinging rapidly back and forth). Normally, the wheel magnetometer may output a nominal caster angle relative to local magnetic north of arctangent2(Y axis magnetic field, X axis magnetic field), where the coordinate axes match those of the cart. The smart positioning system magnetometer, after the heading estimation processing described below in FIG. 12A, can provide the cart's heading relative to local magnetic north. An embodiment can process both the caster axis measurements and the cart heading through a bandpass filter with passband, e.g., 0.5 Hz to 25 Hz, 0.1 Hz to 50 Hz. When the phenomenon of caster chatter is present, the filtered caster axis residual sum of squares (RSS) value can be both greater than three to seven (e.g., five) degrees per second and greater than 2.5 to 3.5 (e.g., 3) times the cart heading rate of change over the same period.

Special processing for caster chatter can comprise: 1) ignoring rotation data from the wheel for the purposes of dead reckoning; 2) using spectral analysis to estimate wheel rotation rate; 3) optionally applying a notch filter to the cart X-axis vibration data, where the center notch frequency can be located at or near the center frequency of the caster oscillation.

A third example of anomaly can occur when a rotation-indicating wheel has poor contact with the ground, e.g., the wheel rotates at a fairly constant speed and stops rotating quickly due to friction in the bearings. Under this condition, the acceleration in the cart's X coordinate as measured by a low pass filtered accelerometer output may be less than the acceleration implied by the rotation count by a significant ratio, e.g., less than half, two-thirds, etc.; An embodiment may impose an additional requirement for the condition that the intervals between successive rotation detections over a period of at least two rotations indicate an acceleration or deceleration in excess of 1 m/sec$^2$ (=0.1 gee). As an example, if the cart's X-axis acceleration (e.g., as measured by the accelerometers in the smart positioning system rotated to the cart reference frame) when low pass filtered at, e.g., 3 to 5 Hz indicates a much smaller number than 1 m/sec$^2$, e.g., less than 0.5 m/sec$^2$, it can be inferred as a signature of anomaly of poor wheel contact with the ground. Additionally, an embodiment may compare the sign of acceleration (e.g., negative means deceleration) reported by the accelerometer versus the wheel. If the signs are the opposite, the embodiment can infer poor wheel-ground contact.

Special processing consists for poor wheel contact with the ground can include: 1) ignoring rotation data from the wheel for the purposes of dead reckoning; 2) using spectral analysis to estimate wheel rotation rate; 3) monitoring the rotation data to determine if or when good ground contact has resumed. For example, the wheel acceleration/deceleration implied by the rotation intervals has been either: a) of the same sign and within a factor of two in magnitude of the low pass-filtered cart X-axis acceleration as described above; or b) less than 0.3 to 0.7 (e.g., 0.5) m/sec$^2$ in magnitude for some programmed interval (e.g. five to ten seconds).

At block 644 the dead reckoning system can update estimated position, speed, and/or other state variables. If the process enters block 644 directly from block 628, the position update can comprise resetting the estimates of position and other state variables based, at least in part, on data from the precise position fix. If the process enters block 644 from block 640 or 636, the update to estimates of position and other state variables can comprise estimates based, entirely or partially, on dead reckoning.

At block 648, the dead reckoning system determines whether the cart is within a warning distance from a cart containment boundary, e.g., within a warning zone. If no, the process returns to block 608. If yes, the dead reckoning system can proceed to block 652, where in the system can initiate a lock and/or warning sequence, e.g., as illustrated in state 525 through 535 in FIG. 5.

As shown on the right of FIG. 6A, at block 664, the rotation detecting smart wheel can wait for rotation counts and/or timeout parameters from the dead reckoning system (sent at block 612). At block 668, the smart wheel can accumulate time stamped rotation and/or validity indicators. A validity indicator indicates whether the rotation counts are valid, e.g., if measured data shows poor wheel-ground contact, the validity indicator indicates an invalid count, e.g. via a low state. Time series may be formed from accumulated rotation data, as represented in block 672.

At block 676, the smart wheel determines whether a lock field is set (e.g., to 1). A lock field can be set in the smart locking wheel when the cart has exceeded the containment boundary. FIG. 6 describes an embodiment in which the smart wheel can determine if conditions for locking the cart are satisfied. FIG. 5 describes an alternative embodiment in which the dead reckoning system can make such a determination. If yes, the smart wheel can communicate with the dead reckoning system, which can in turn initiate a lock sequence at block 652. Otherwise, the smart wheel processing can proceed to block 680.

At block 680, the smart wheel can determine whether the accumulated timestamp rotation and/or validity indicators show evidence of chatter, skip, etc. If yes, the smart wheel can communicate with the dead reckoning system, which can in turn perform detection of anomalous signature detection at block 632. If no, the smart wheel processing can proceed to block 684, in which the smart wheel can determine whether a rotation count limit or timeout has been reached. This can help reduce the frequency of communication from the smart wheel to the dead reckoning system, thereby possibly reducing energy consumption. If a rotation count limit or timeout has been reached, the smart wheel can preprocess rotation data and send the preprocessed data to the dead reckoning system. The preprocessing may reduce the amount of data transmitted to the dead reckoning system, thereby possibly reducing energy consumption. For example, preprocessing can comprise data compression to reduce the energy cost of, e.g., the radio transmission if RF communication is used. If a rotation count limit or timeout has not been reached, the processing can return to block 668 where data accumulation continues.

In some embodiments, the wheel accumulates timestamped rotation data in its local memory. Optional additional data such as magnetometer values and/or accelerometer values may be captured as well, to be used for assessing the reliability of the rotation values (e.g., for determining whether the caster is chattering).

As described above in connection with block 684, after either some number of rotations has been detected, or a given amount of time has elapsed, the smart wheel can send the accumulated data to the dead reckoning system. For example, the wheel may be electrically connected to the dead reckoning system or may communicate with the dead reckoning system using wired or wireless techniques.

While the wheel is accumulating the rotation data, the dead reckoning system accumulates raw magnetometer, accelerometer, and vibration data. An embodiment can be configured to collect only a subset of these types of data, or to collect another type of data, e.g., gyroscope data. Some combinations of data types can advantageously improve the accuracy of dead reckoning estimates. For example, as described below in section titled Steady State Speed Estimate Update Loop, rotation data can be used to derive accelerometer offsets. As another example, wheel rotation data from both a front castered wheel and a rear axle wheel can be used in conjunction with magnetometer data in heading estimates.

In some embodiments, in steady state dead reckoning navigation, the wheel accumulates rotation timestamps (e.g., a time offset from some reference time to the detection of the Nth rotation of the wheel, where N is an integer); the dead reckoning system accumulates the data which can be processed to produce attitude and heading information (e.g., magnetometer and accelerometer data).

IV. Dead Reckoning Methods

Some shopping cart containment embodiments can have constraints which may make otherwise practical solutions challenging or impractical to implement. Some of these constraints can also apply in other contexts or applications. These constraints include: heading estimate accuracies of wheel; asymmetric energy constraints between the dead reckoning system versus the smart wheel; a lack of a viable connection between a rotation sensor and a dead reckoning system. It is advantageous to minimize the effects caused by these constraints.

a. Reducing Error in Heading Estimation

Several factors may make it difficult to obtain an accurate heading from a magnetic sensor placed inside a shopping cart wheel, e.g., caster effects, 50/60 Hz coupling, and/or buried ferromagnetic objects.

A typical front wheel of a shopping cart is castered about the vertical axis. If the caster is bent from vertical, then the wheel can often rapidly oscillate about the caster axis, e.g., with a frequency on the order of 0.5 Hz to less than 10 Hz. The oscillation can be quasi-periodic, but not exactly so. If a low pass filter is used to damp the caster oscillation effect on the heading estimate, the cutoff frequency of the low pass filter would be less than 0.5 Hz, much lower than the cutoff frequency of a few Hz as described in U.S. Pat. No. 8,046,160. Thus, the responsiveness of the magnetometer plus the low-pass filter to actual changes in the cart heading may be too slow for accurate dead reckoning.

Large currents at power line frequency or its harmonics (such as the second harmonic driven by fluorescent lighting, multipole harmonics from electric motors starting up) on buried power lines can produce substantial magnetic fields at the wheel. While these can largely be filtered out with bandstop filters, the induced fields at the cart can be strong enough to induce significant nonlinearities in a cart-mounted, low-power magnetometer. In some implementations, these nonlinearities can be challenging to filter out and can cause inaccuracies in heading estimates.

Large ferromagnetic objects such as structural steel or iron pipes can produce a substantial soft iron distortion up to several centimeters above the surface. The induced fields at the wheel can be strong enough to induce significant non-linearities in a wheel-mounted magnetometer.

The accuracy of the heading estimate can be improved using one or more of the following techniques: (1) For an embodiment including a three-axis magnetometer rigidly mounted to the body of the wheeled object and a three-axis accelerometer mounted in a fixed angle relationship to the magnetometer, the magnetometer can be compensated for tilt. Tilt of the ground surface can affect the accuracy of the magnetometer. A higher grade of slope for tilt results in a greater projection of the vertical component of the geomagnetic field onto the reference horizontal frame of the cart, which is parallel to the (sloped) ground. This can cause greater inaccuracies in the magnetometer output. (2) Performing hard and soft iron calibration of the magnetometer as mounted to the body of the wheeled object. This is the subject matter of U.S. Pat. Pub. No. 2017/0067981, titled "Magnetometer and Accelerometer Calibration for Cart Navigation System," which is hereby incorporated by reference herein in its entirety. (3) Applying digital filter algorithms to the raw magnetometer output to reduce noise, in particular removing the local power line frequency (e.g., 50 or 60 Hz, depending on geographic location) and its harmonics. (4) Combining the magnetometer output with a gyroscope output (e.g., a MEMS gyroscope) via a filter such as a Kalman filter. A gyroscope can provide heading information which can be used in conjunction with or in place of magnetometer data. A gyroscope may provide better response time to quick heading changes and/or tight turning radius than a magnetometer or an accelerometer because a gyroscope can output turn rate directly. The better response time can result in more accurate dead reckoning tracking. A gyroscope can provide data to corroborate outputs from other sensors. For example, inconsistent data from the magnetometer versus the gyroscope may be an indication of an anomaly. For a cart in a parking lot, passing vehicles may distort magnetometer data and the resulting heading estimate. An embodiment of a dead reckoning system can use gyroscope data to confirm the heading estimate based on magnetometer data or combine magnetometer data with gyroscope data in heading estimates. Another embodiment of a dead reckoning system may be configured to perform heading estimates based only on gyroscope data when the system is in a busy parking lot, e.g., during peak shopping hours.

In the more common type of shopping cart, the front wheels swivel on casters and the axles of the rear wheels are rigidly fixed to the cart frame; thus, the cart's instantaneous motion vector (e.g., the derivative with respect to time of the track formed over time by the cart's center of mass) is normal to the line between the two rear wheels.

Explicit hidden variables in the state estimator for a longitudinal pitching motion and axial rolling motion may be useful to dead reckoning estimates. In the cart's coordinate system, yawing motion can be considered compensated by the front swivel wheels. The hidden variables of a state estimator for the cart motion include the instantaneous 3-D heading and the instantaneous speed in the frame-centered coordinate system. In situations where vibration data can be noisy, e.g., due to a rotation detecting wheel in poor contact with the ground, one or more hidden state variables can be used to improve vibration analysis accuracy. For example, a wheel having a flat surface portion but in good contact with the ground may produce data with a regular time-domain signature from the flat surface coming in and out of contact with the ground. An embodiment can use such data, for example, to filter the roll component from vibration data. This may improve accuracy of vibration analysis. Another embodiment may be configured to use one or more of such hidden state variables instead of performing vibration analysis in dead reckoning. This may have the advantage in an energy-constrained system because extracting a signature from a hidden state variable less noisy than corresponding vibration data may require fewer samples, lower sample rate, and/or less computation.

A physical effect which produces unreliable rotation information can sometimes affect the vibration signature. As a counterexample, a wheel which is completely not in contact with the ground (e.g., because the cart frame has been bent) may not have much effect on the vibration signature. As another counterexample, a wheel which has very poor traction, e.g., due to snow, ice, or sand on the ground, may not have much effect on the vibration signature. On the other hand, a wheel in contact but with heavy caster chatter can create a vibration signature at the frequency of the caster chatter, and potentially at harmonics thereof. An embodiment can distinguish the caster chatter frequency from the rotation frequency. The frequencies can be distinguished by 1) recognizing that the caster chatter frequency may typically be greater than the rotational frequency; and 2) using the estimate of the chatter frequency provided by the magnetometer in the wheel in the search algorithm for vibration peaks—not associating peaks with characteristics matching the chatter frequency estimate with rotation frequency.

The practically achievable yaw rate (changing in heading or direction) of a human-propelled shopping cart may be less than ninety degrees per second. A Kalman filter with observables including corrected three-axis magnetometer readings and a simple gravity vector can be sufficient to output heading information to sufficient accuracy. The latent variables of the heading estimator can be the three-axis heading vector and the heading rate vector.

b. Reducing Error in Longitudinal Speed Estimation

As described above, longitudinal speed of a wheeled object can be estimated by measuring the rotation rate of one or more of the wheels. However, in some cases it may be advantageous to estimate the longitudinal speed of the wheeled object by techniques other than counting wheel rotations. For example, in the case of a retail store shopping cart, it can be desirable to mount the magnetometer-based compass rigidly to the cart handle. Furthermore, for reasons of cost and ease of logistics, it can be desirable that the entire electronics assembly be mounted to the cart handle. Similar considerations apply to luggage carts such as those used in airports, train stations, etc., and other applications to other wheeled objects as well.

However, in many cases it can be a challenge to provide direct measurements of wheel rotation to an electronics assembly which is mounted not on the wheel (e.g., to the cart handle) while simultaneously achieving both acceptably low cost (including relative ease of installation, robustness and longevity in operational usage, etc.) and long battery life for the wheel. Advantageously, for the longitudinal speed estimation, a state estimator based not on wheel rotation data can be used, e.g., an estimator based on accelerometer data.

However, low cost, low power MEMS accelerometers may not have properties such that accelerometer output can simply be directly double integrated (first into velocity, with velocity then integrated into position) with acceptable accuracy to determine the position of the wheeled object.

For example, the KMX62 Tri-axis Magnetometer/Tri-axis Accelerometer, available from Kionix, Ithaca, N.Y., has a nominal accelerometer DC offset error after calibration of 25 milligee or 0.25 m/sec$^2$. A one degree error or change in the alignment of the accelerometer vertical (z) axis to the cart longitudinal (x) axis, as caused for example by the cart frame reversibly bending due to a heavy load being placed in the basket, results in another 17 milligee error in longitudinal acceleration. Linearity errors from the accelerometer axis with the highest vertical component can easily contribute many more milligees to the longitudinal error depending on how the accelerometer axes are mounted relative to the cart's longitudinal axis. An uncorrected error of 0.25 m/sec$^2$ in longitudinal acceleration will produce a positioning error of 12 meters after a mere ten seconds through simple double integration of the acceleration. Clearly this is not a viable solution for estimating the position of a wheeled object.

The longitudinal speed state estimator as described in this disclosure can use vibration data to compensate for the accuracy limitations of such low-cost, low-power accelerometers.

c. Example Constraints

For certain embodiments of the vibration-based state estimator, one or more of the following constraints may be applicable: (1) The wheeled object has a frame which is approximately rigid to within the needed accuracy of motion estimation. (2) Quasi-random roughness in the surface on which the wheeled object travels (e.g., a floor or a parking lot) has a size scale much smaller than the wheelbase of the wheeled object (and may be much smaller than the diameter or circumference of the wheel). For example, the wheelbase of a cart can be about one meter or more (and the wheel diameter, a few to 20 cm), and the quasi-random roughness of a moderately heavily worn asphalt parking lot is on the order of one to five millimeters Root Mean Squared (RMS). The range of surface roughness (RMS) for many parking lots (asphalt or concrete) can be from about 0.1 mm to 10 mm, 0.5 mm to 8 mm, 1 mm to 5 mm, or some other range. In some cases, the range of surface roughness (RMS) for many parking lots (asphalt or concrete) can be measured relative to the wheel diameter (D), and may range from about 0.001D to 0.1D, 0.01D to 0.05D, or some other range. (3) It may not be practical to obtain reliable rotation data from a wheel which is in continuous, non-skidding contact with the ground. In some implementations, where reliable wheel rotation data can be obtained, the reliable wheel rotation data can be used additionally or alternatively to the techniques described below.

To improve a continuous, non-skidding contact between a wheel and the ground, the wheel may be comprise a suspension device, e.g., a spring-loaded caster. Such a device can be especially useful where the ground is uneven, when the wheel is worn, and/or if the cart frame is bent.

d. Longitudinal Speed Estimation via Vibration Analysis

Figure 8:
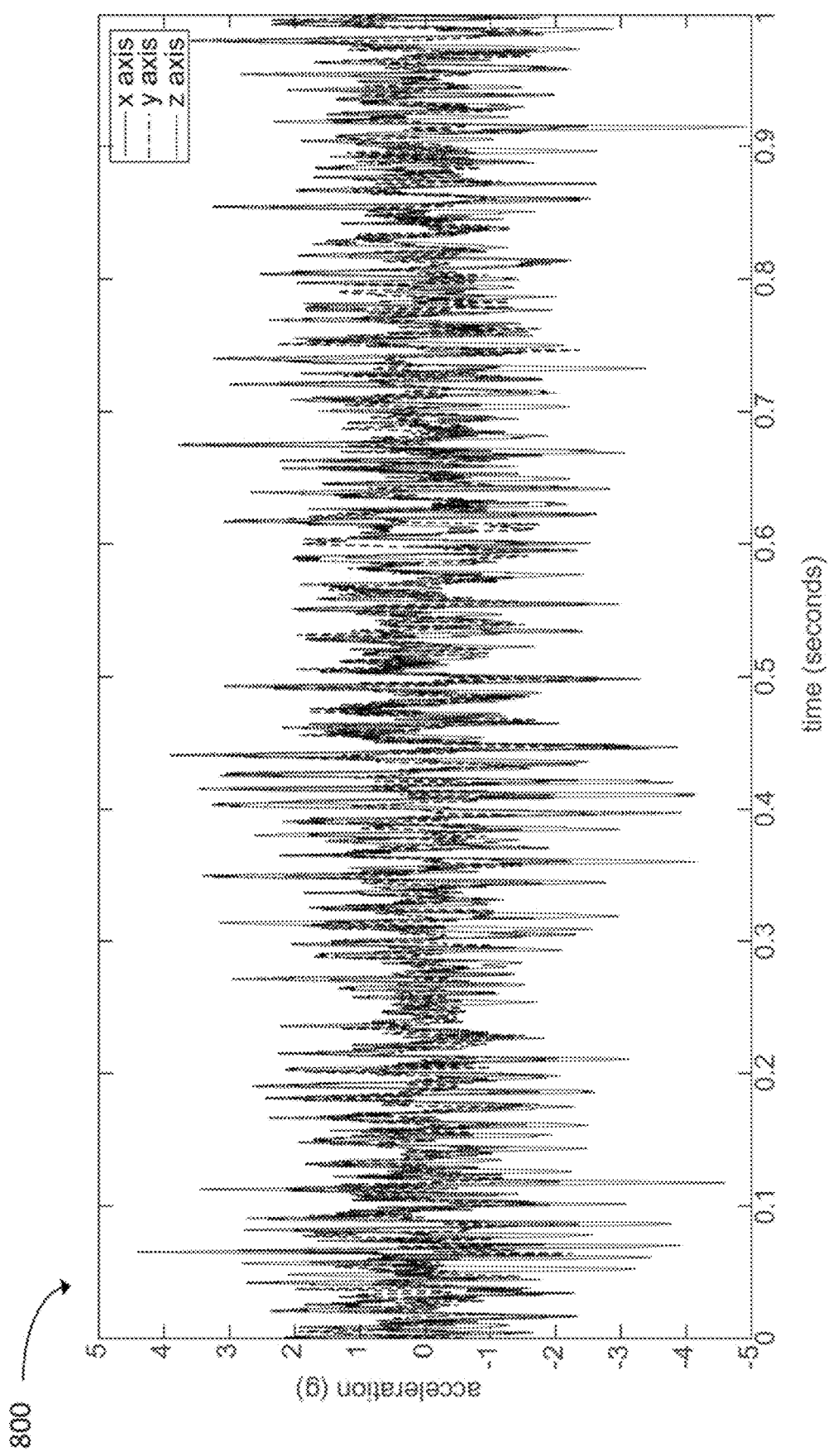
FIG. 8 shows an example graph of acceleration versus time measured on a shopping cart.

An example filtered accelerometer time series (of one second duration) as measured at a shopping cart handle is shown in FIG. 8. The graph 800 in FIG. 8 shows acceleration (in "g"s, where g is standard gravity) as a function of time (in seconds) for three components of the acceleration, with x in the direction of forward (or, equivalently, rearward) cart movement in the horizontal plane, y perpendicular to x in the horizontal plane, and z in the vertical direction (perpendicular to the surface over which the cart travels), as illustrated by coordinate system 230 in FIG. 2. Data in the graph 800 was measured on a somewhat rough asphalt surface, using a typical grocery store shopping cart loaded with about 15 kg in the main basket. Sampling rate was 20,000 samples per second (sps) using a 6 kHz bandwidth three-axis piezoelectric accelerometer (Measurement Specialties (Hampton, Va.) model 832M1 accelerometer). The applied filtering algorithm was 1-D median filter followed by Savitsky-Golay smoothing (order 3, window length 7) and detrending over the displayed width. The root-mean-square (RMS) amplitude of this particular signal is about 1.4 g in the x axis, 1.2 g in the z axis, and 0.7 g in they axis.

Figure 9:
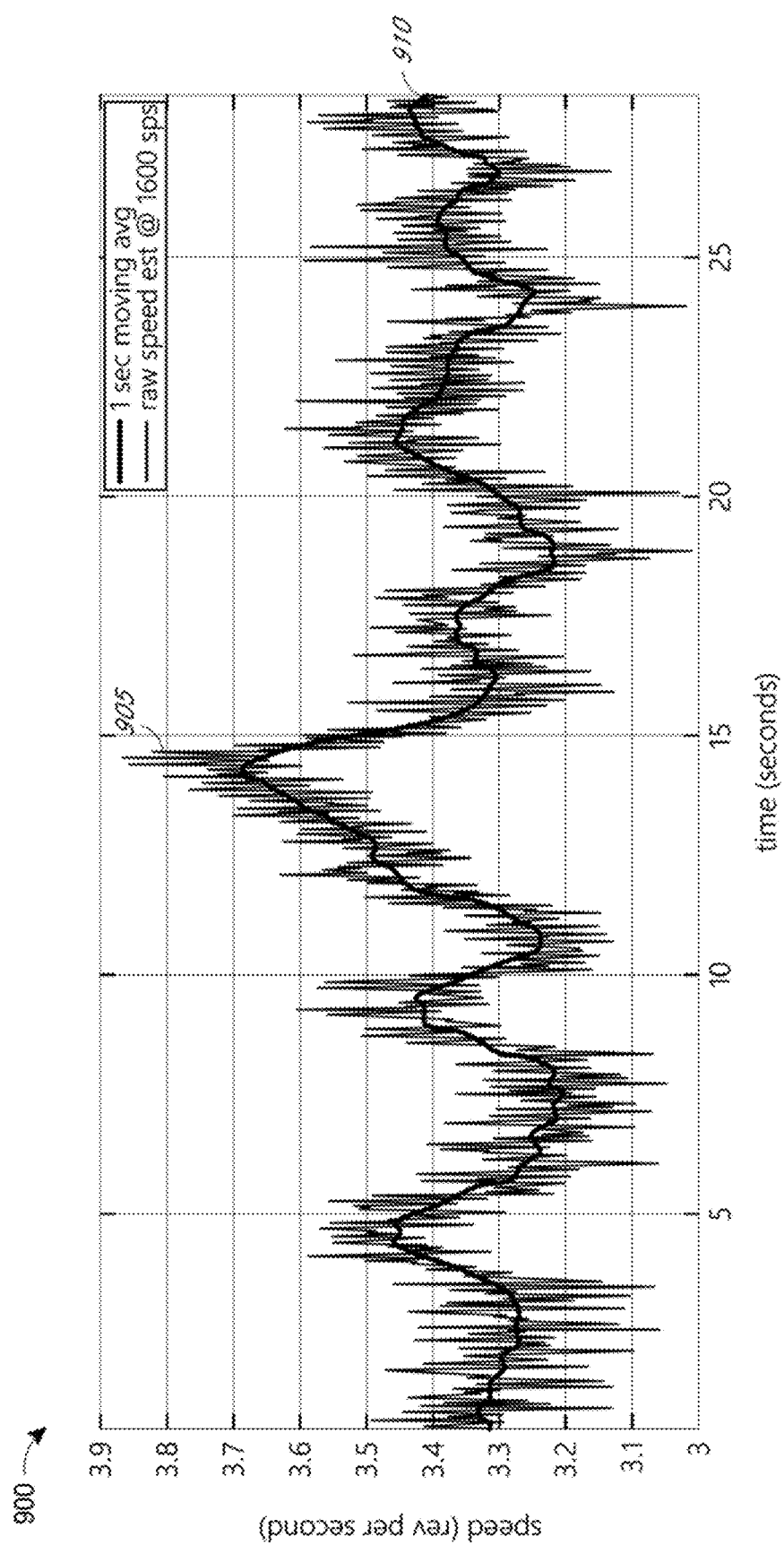
FIG. 9 shows an example wheel rotation rate versus time measured under the same condition as FIG. 8.

FIG. 9 shows an example of the wheel rotation rate versus time profile of the same shopping cart under the same conditions. The wheel speed is measured by parabolic interpolation of the output of a precision Hall effect sensor sampled at 1600 sps (the raw speed, shown in thin line 905). In an embodiment, the sample rate of the vibration data sensor can be roughly 5 to 10 times the system bandwidth for the purpose of signal processing. A realistic system bandwidth can be 10 to 20 times the maximum wheel rotation rate (e.g., 100-200 Hz for a maximum wheel rotation rate of 10 cycles per second). The interpolated speed (1 second moving average) is shown by thick line 910. The rapid oscillation of the speed in the raw speed data with frequencies in the tens of Hz is caused by small scale roughness in the asphalt surface. In this example, the estimated (e.g., interpolated) wheel speed is in a range from about 3.2 revolutions per second to about 3.7 revolutions per second. As discussed herein, the linear speed of the wheel (and cart) is the speed in revolutions per second multiplied by the circumference of the wheel.

Figure 10A:
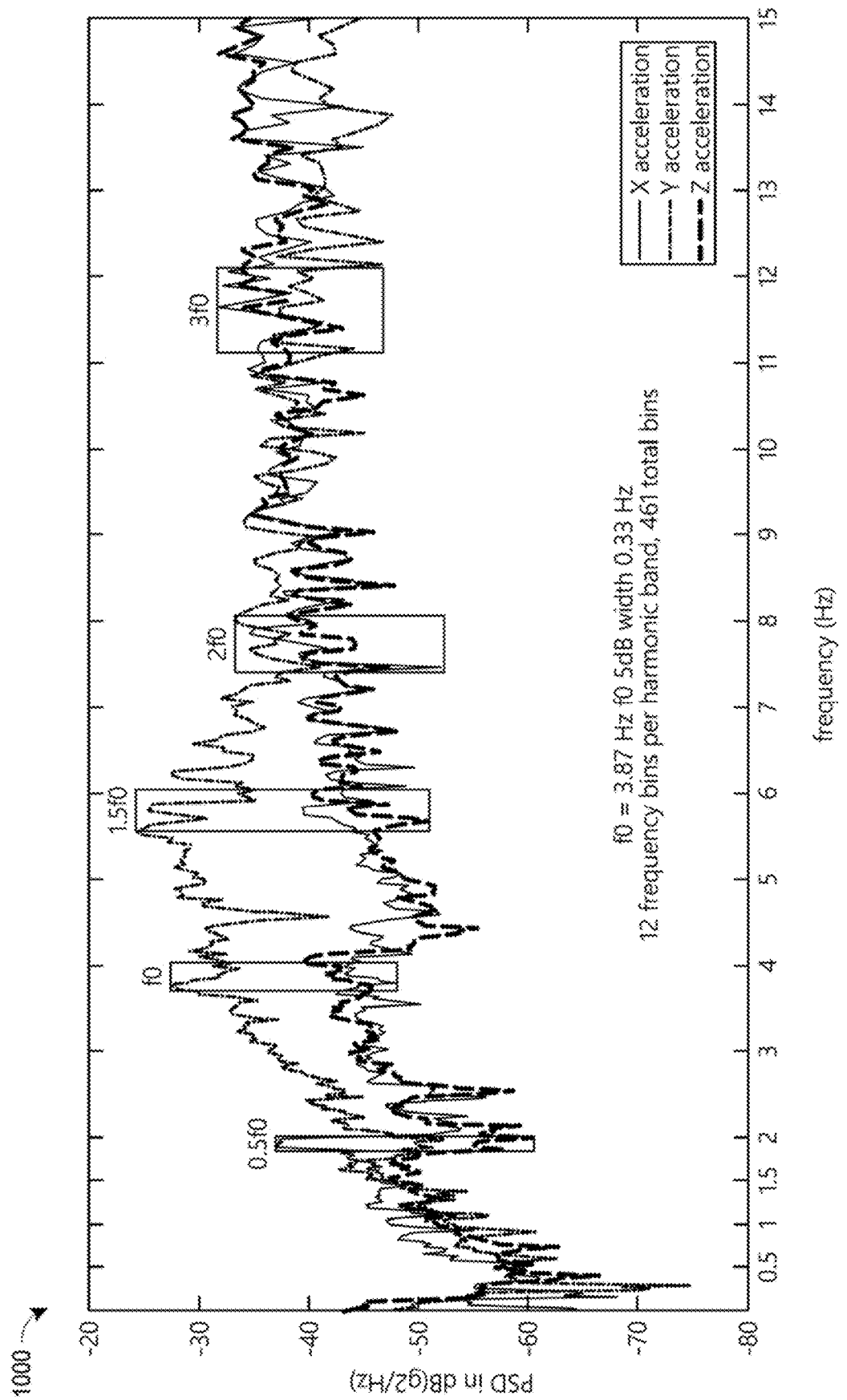
FIG. 10A shows the power spectral density versus frequency for the data shown in FIG. 9.

FIG. 10A shows the Power Spectral Density (PSD) of the same data set, but calculated using Thomson's multitaper method as implemented in the MATLAB® Signal Processing Toolbox pmtm function. Other conventional methods for calculating the PSD (e.g., Welch's method) may not provide suitable PSD data, possibly due to the rapid oscillation in the raw speed data (see, e.g., line 905 in FIG. 9). The horizontal axis represents frequency in Hz. The vertical axis represents PSD in $g^2/Hz$ in logarithmic scale, units commonly used to measure vibration amplitude.

Referring to FIG. 10A, the X-axis is in the direction of motion of the cart, the Y-axis is perpendicular to the direction of motion and parallel to the surface over which the cart travels (e.g., in the horizontal plane), and the Z-axis is perpendicular to the surface over which the cart travels (e.g., in the vertical plane). The frequency f0 is the nominal rotation rate of the cart's wheels (assuming that all the wheels are of the same diameter as is usually the case; carts with multiple wheel diameters may need additional processing), averaged over the length of data capture interval. In other words, for N total rotations over a time interval T, f0=N/T. In FIG. 10A, f0 is approximately 3.9 Hz, which translates to a speed of 1.6 meters/second or 3.5 miles per hour for a shopping cart wheel with a diameter of 5 inches. The value of f0, of course, depends on the speed of the wheels.

The 5 dB width is the range of rotation frequencies centered on f0 such that 68% (1 standard deviation for normal distribution) of the frequencies fall within the range $[f0-0.5*BW_{5dB}, f0+0.5*BW_{5dB}]$. Rotation frequencies can be calculated as the inverse of the interval between the same phase point in two successive rotations.

Figure 10B:
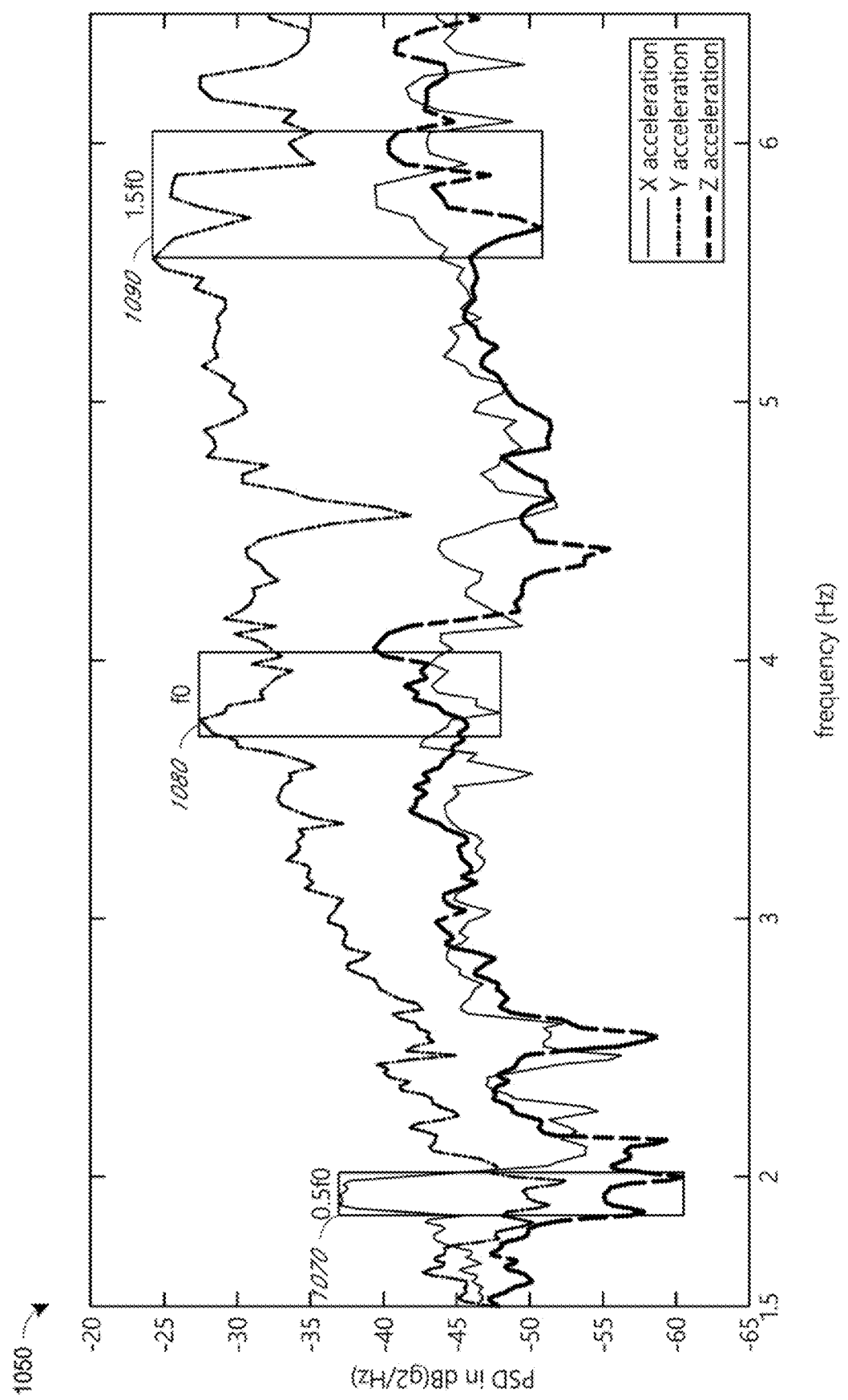
FIG. 10B shows a different range of the same power spectral density versus frequency data.

FIG. 10B shows the same data as displayed in FIG. 10A, but in the frequency range 1.5 Hz to 6.5 Hz, to make the spectral features near f0/2 more visible. The nominal rotation rate can be determined through the presence of a strong peak and/or a weak peak in the PSD. A strong peak can be defined as an amplitude at least, e.g., 5 dB greater than any value of the given acceleration axis PSD to a distance of plus or minus, e.g., 3 times the 5 dB bandwidth of the rotation spectrum, where the 5 dB bandwidth is calculated as described above. For example, for the data in FIG. 10B, the 5 dB bandwidth of the f0 signal is about 0.3 Hz, so the f0/2 peak in the X axis at about 1.9 Hz is considered "strong" because is it more than 5 dB greater than any other peak over the range 1.9+/−0.9 Hz. Weak peaks can be described as having amplitudes less than, e.g., 5 dB but greater than, e.g., 2 dB relative to their local region in the PSD space (plus or minus 3 times the 5 dB bandwidth of the driving frequency). Different embodiments may use different values for the amplitude and/or bandwidth parameters depending on cart and/or installation site characteristics. For example, one installation may use 5 dB, 2 dB, and 3 times the 5 dB bandwidth as described above. Another installation may use 6 dB, 3 dB, and 4 times the 6 dB bandwidth instead. Yet another installation may use 4 dB, 2 dB, and 3 times the 4 dB bandwidth. Typically, increasing the search bandwidth may make it easier to catch a relatively low peak in the vibration spectrum (e.g., as may occur when the cart is jerkily accelerating or decelerating, which "smears" the peaks out), but may also increase the risk of a false positive (e.g., identifying a peak not caused by wheel rotation, for example, a pseudo-harmonic because of some feature in the asphalt that has constant spacing. The value of these parameters can be determined during the design phase, or during the installation of a site.

For the cart design corresponding to FIG. 10B, the most reliable discriminant for detecting f0 is the presence of a strong peak at f0/2 in the X axis acceleration spectrum along with the absence of a peak in the Y and Z axes acceleration spectrum (indeed, a local near-minimum in the Z axis acceleration spectrum), as shown in box 1070. A candidate f0 value can be validated by the presence of a weak local peak at f0 in the Y axis acceleration spectrum and at 1.5*f0 in the X axis acceleration spectrum (e.g., the first odd harmonic of the fundamental driving frequency at f0/2).

In an embodiment, once the dead reckoning system determines f0, the forward speed of the cart can be determined by multiplying f0 by the circumference of the wheel. For example, for a US shopping cart wheel with a diameter of 5 inches, the circumference is 15.7 inches (e.g., 7C times the diameter), and for the example value of f0=3.94 Hz determined from the example PSD in FIGS. 9 and 10, the estimated forward speed of the cart is 61.9 in/s=5.16 ft/s=3.52 miles per hour=1.57 m/s.

Accordingly, embodiments of the dead reckoning system may utilize vibration sensor data to estimate a rotation rate of the wheel of a wheeled object (e.g., a cart) and estimate a forward speed of the cart based on the estimated rotation rate and a circumference of the wheel. The vibration sensor data can include a short time series of acceleration data in one, two, or three directions. The short time can be in a range from about ½ of a wheel rotation period to five to 10 rotation periods (or more). For example, for certain carts the short time is in a range from about 0.1 to about 5 seconds. In situations in which valid rotation data is intermittently available, an embodiment can use the periods when the wheel is in good ground contact to update the vibration signature. The directions for the acceleration data can include a first (forward) direction of the wheeled object, a second direction perpendicular to the first (forward) direction, and/or a third direction perpendicular to the first and the second directions. For example, the second direction can be in a horizontal plane (the plane in which the wheeled object is moving) and the third direction can be in a vertical plane. The horizontal plane can be generally parallel to the surface over which the wheeled object travels.

The dead reckoning system can estimate the wheel rotation rate based at least in part on identifying a peak in an acceleration spectrum associated with the acceleration data. The peak can be associated acceleration data in the direction of motion of the wheeled object. The estimated wheel rotation rate can be twice the frequency of the peak. Some implementations can validate an estimated wheel rotation rate by determining a presence of a second peak in the acceleration spectrum at 1.5 times the estimated wheel rotation rate. Some implementations may, additionally or alternatively, validate the estimated wheel rotation rate by determining the presence of a third peak at the estimated wheel rotation rate in an acceleration spectrum associated with horizontal accelerations of the wheeled object perpendicular to the direction of motion of the wheeled object.

The specific features to be extracted from the vibration spectrum may be different for different shopping cart constructions (e.g. stainless steel wireframe cart basket versus plastic cart basket) and for different applications or surfaces over which the shopping carts move. Vibration signatures in FIGS. 8, 10A, and 10B are an example for a particular scenario.

Algorithms useful for feature extractions to obtain signatures include: (1) Bulk Fast Fourier Transform (FFT) at high spectral resolution, searching for clear harmonic content; (2) Discrete Fourier Transform (DFT) over a range of frequencies corresponding to the plausible range of the wheels' instantaneous angular velocities, searching for maximum energy migration into plausible harmonic peaks. For many shopping cart applications, the range of wheel angular frequencies is from about 1 Hz to about 5 Hz or about 1 Hz to about 10 Hz. (3) Time domain windowing methods looking for impulse peaks (e.g. associated with flat spots on the wheels).

For Bulk FFT, the minimum required spectral resolution can be derived from the spectral width of features to resolve. For example, the spectral width of the f0/2 peak in FIG. 10B (1070) is about 0.1 Hz wide. To clearly resolve the peak may require about four to six (e.g., five) distinct frequency bins, for a required spectral resolution of 0.016 to 0.25 (e.g., 0.02) Hz.

Clear harmonic content in the context of Bulk FFT can be defined in terms of peaks and their harmonic ratios. Referring back to FIG. 10A, a candidate peak may be defined as one where three successive frequency bins at or near the center of the candidate peak, have an amplitude more than 3 dB greater than any other value within a quarter octave range centered on the candidate peak (e.g., from candidate peak center frequency divided by the fourth root of two to the candidate peak center frequency multiplied by the fourth root of two) and more than 5 dB greater than the RSS value of across the half octave range.

The nominal center frequency of a candidate peak can be defined via parabolic interpolation in logarithmic amplitude of the highest frequency bin within the candidate peak and the immediately lower and higher frequency bins. Candidate peaks can be in a harmonic ratio if the ratio of their center frequencies is an integer, e.g., 2 or 3, to within the precision set by two to three times the spectral resolution. For an outdoor surface (e.g., asphalt), an embodiment may not consider harmonics higher than the third harmonic to be a candidate because higher harmonics may be too noisy. For a smooth indoor surface (e.g., linoleum), an embodiment may consider higher harmonics as candidates.

Figure 11A:
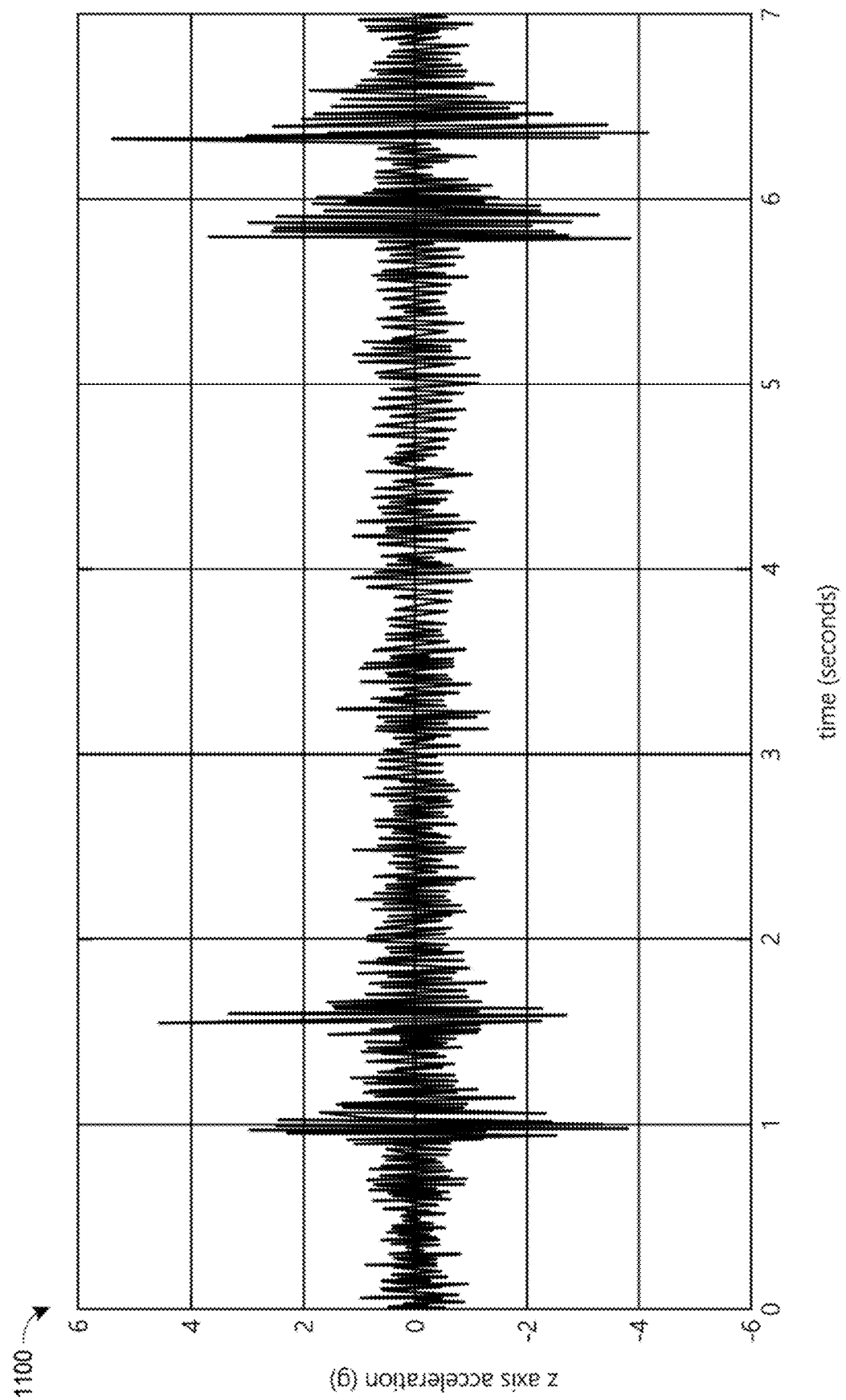
FIGS. 11A and 11B show vertical acceleration versus time measured on a shopping cart rolling across a concrete surface.
Figure 11B:
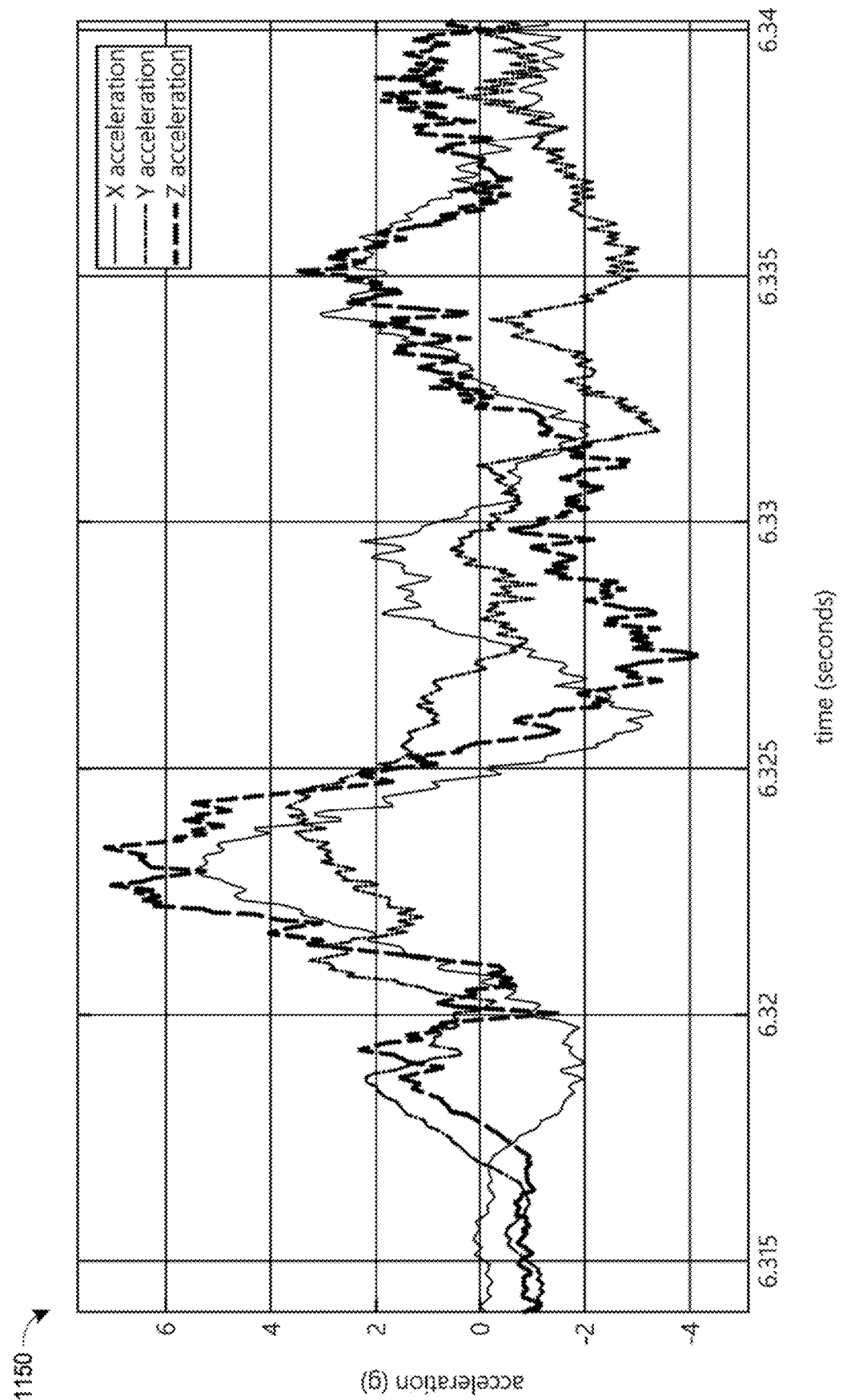

In some cases candidate peaks may be additionally qualified by the relationships in candidate peaks between difference vibrational axes. Referring back again to FIG. 10B, the f0/2 peak (1070) is characterized by the combination of a high prominence peak in the X axis with the absence of a peak in the Y or Z axis at the same frequency, while the f0 peak (1080) is characterized by a peak in the Y axis and the absence of a defined peak in the X and Z axes. Peak in the Y axis at f0 may not be considered a candidate peak by the criteria described above, since the peak amplitude of −27.4 dB (g2/Hz) at 3.77 Hz is only 2.8 dB above the peak amplitude at 4.16 Hz. More elaborate peak-finding algorithms can be used. Such an algorithm can locate peak in the Y axis at f0, e.g., by comparing the peak amplitude of the peak to the RSS amplitude of the two highest values in the quarter octave range rather than to the highest value; by that criterion peak in the Y axis at f0 can be recognized.

e. Longitudinal Speed Estimation Via Acceleration Analysis—Concrete Joint Example An example accelerometer time series as measured on a shopping cart rolling on concrete flooring is shown in FIGS. 11A and 11B. The cart under measurement contains about 15 kg of payload. The cart rolls across two concrete expansion joints in a fairly straight line. Plot 1100 shows acceleration in the vertical axis (e.g., the Z axis) versus time. The burst of vertical acceleration at t=1.0 and t=1.5 and then at t=5.8 and t=6.3 are results of the front and rear wheels, respectively, hitting the expansion joint. The greater amplitude of the second burst (at t=1.5 and 6.3) are results of the rear wheel on this cart not being castered, and hence without a shock absorbing effect of the caster as there is on the front wheel. A cart crossing an expansion joint at a significant angle may have up to four different events, one for each wheel of a four-wheel cart. With knowledge of the spacing between concrete expansion joints and the time it takes for a cart to cross successive joints (e.g., 6.3-1.5=4.8 seconds in plot 1100), the speed of the cart can be estimated.

FIG. 11B shows a zoomed-in plot around t=6.3 second corresponding to FIG. 11A. t=6.3 second corresponds to the time when the rear wheels hit the second concrete expansion joint. Plot 1150 shows the Z acceleration going negative at t=6.319. This corresponds to the rear wheel dropping over the first edge of the expansion joint. The strong peak at t=6.323 corresponds to the time when the wheel hits the bottom of the joint. Plot 1150 shows the peak acceleration in the Y axis lagging the simultaneous peak in Z and X by about 1 millisecond. This lag may be due to the cart swaying because of not hitting the expansion joint exactly straight on.

f. Example State Estimator

An embodiment can implement a state estimator that is a linear quadratic estimator (LQE—a standard Kalman filter). However, the disclosure is not limited to LQEs. Other implementations may involve a combination of a hidden Markov model and continuous latent variable estimation (such as an extended Kalman filter, unscented Kalman filter, etc.).

Available observables for the continuous estimator can include:

A three-axis accelerations of the body frame of the cart, which can be coupled to an electronics system, measured by a moderate bandwidth (e.g. up to about 100 Hz) DC coupled three-axis accelerometer. An example accelerometer is the accelerometer system of the FXOS8700CQ digital sensor and 3D accelerometer, available from Freescale Semiconductor. Another example is the 3D accelerometer system of the KMX62 tri-axis magnetometer/tri-axis accelerometer, available from Kionix, a Rohm Group Company (Kyoto, Japan).

A three-axis magnetometer readings, which can be in the same reference frame as the accelerometer. An example magnetometer is the one included in the Freescale FXOS8700CQ digital sensor and 3D accelerometer. Another example magnetometer is the one included in the KMX62 tri-axis magnetometer/tri-axis accelerometer. In some embodiments, the accelerometer and the magnetometer can be separate components.

Features extracted from the high frequency, AC-coupled vibration spectrum of the cart frame, which can be coupled to the electronics system but not necessarily coupled via the same circuitry as the accelerometer. The features can include the estimated wheel rotation rate f0. The number of independent axes of vibration measurement can depend on the mechanical construction of the cart. For example, it may not be accurate to assume that the three Cartesian axes of vibration are independent at high frequency.

Types of sensors for measuring vibration that may be appropriate to this disclosure include (1) a cantilevered piezoelectric beam with optional point masses to tune the response spectrum; (2) a small magnet on a cantilevered beam of nonmagnetic material, e.g., stainless steel, operating within the elastic limit of the beam, with optional point masses to tune the response spectrum, e.g., by inducing an electromagnetic force (EMF) in a coil; (3) a cantilevered magnet plus sense coil, which can be a small, cheap, and low power component set for a high bandwidth vibration sensor; (4) a high bandwidth MEMS accelerometer, e.g., KX123 (available from Kionix, Ithaca, N.Y.).

As shown in section titled Longitudinal Speed Estimation via Vibration Analysis and FIGS. 10A and 10B, the bandwidth of the vibration sensor may not be critical in some implementations. For example, there are no components of interest above about 15 Hz in the example data in FIG. 10A. However, a high sample rate can be used to provide sufficient frequency resolution over fairly short time periods, e.g. when the cart's rotational speed is changing.

g. Heading Estimation

Figure 12A:
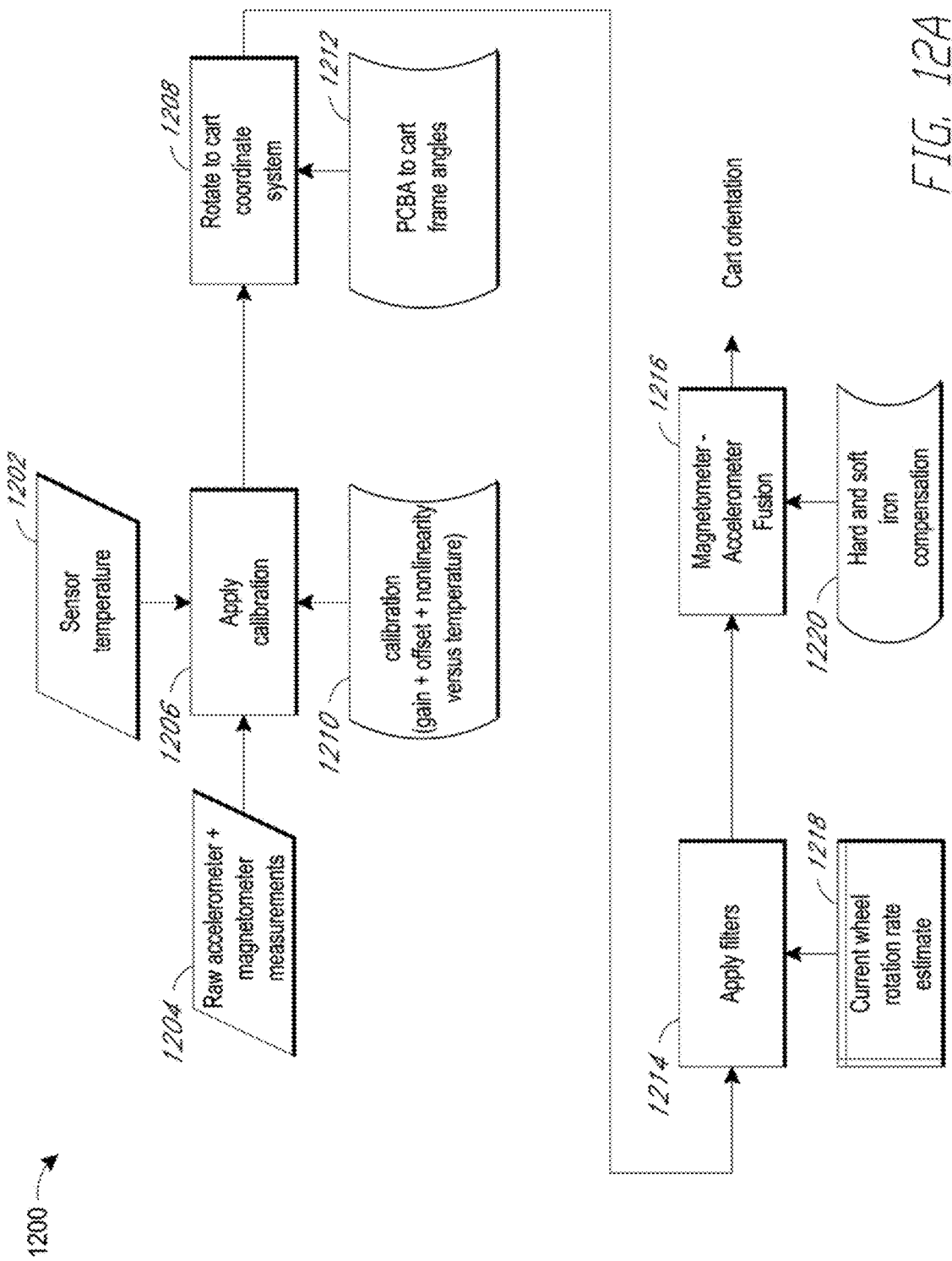
FIG. 12A shows an example method for heading estimation using a dead reckoning system.

FIG. 12A shows an example method flowchart 1200 by which an embodiment of the dead reckoning system can determine an estimated heading in the coordinate system of the wheeled object (e.g., coordinate system 230).

Flowchart 1200 can start at block 1206, wherein the magnetometer/accelerometer can be compensated for offsets/errors resulting from a plurality of factors. Calibration data can comprise the gain, offset, and nonlinearity of each sensor axis as a function of temperature 1210. An embodiment may calibrate all axes of both the accelerometer and the magnetometer. Another embodiment may not calibrate the horizontal axes (e.g., x and y axes in coordinate system 230) for the accelerometer. For example, for the Kionix KMX62, the accuracy of the dead reckoning solution may not be affected significantly by errors in the accelerometer. On the other hand, the change in offset and gain of the magnetometer axes over temperature may significantly affect the accuracy of the dead reckoning estimates. Accordingly, an embodiment can calibrate each axis of the magnetometer over temperature individually. A system with a magnetometer whose characteristic does not vary significantly over temperature or an installation with operating temperatures over a narrow range may not need individual calibration of each axis of the magnetometer.

With some sensor types, including the Kionix KMX62, the magnetometer offsets can change significantly after being exposed to the high temperatures of the solder reflow process (e.g., about 260° C. according to IPC/JEDEC J-STD-020C). Thus, the sensors can preferably be calibrated after the PCBA has been assembled, e.g., during a post-assembly production test process. During calibration, the database "calibration (gain+offset+nonlinearity versus temperature)" 1210 can be created. The database can be stored in the flash memory of the processor, e.g., memory 425 in FIG. 4. When calibration is applied at block 1206, a temperature sensor can provide temperature data 1202, the magnetometer/accelerometer can provide their raw measurements 1204, and the database 1210 can provide calibration data. The raw measurements 1204 can be in the coordinate system of the accelerometer/magnetometer sensor package.

Magnetometers typically have a nonlinear response to the applied magnetic field over the field strengths of interest (e.g., from −100 to +100 µT). Taking the KMX62 as an example, the worst case error over that field range is around 2%. The factory calibration process can provide, on a per magnetometer basis, the actual curve for each axis, e.g., output voltage=offset+gain*applied_field+F_nonlinear_error(applied field).

An embodiment can invert the nonlinear error function into a lookup table and store the table in a memory as part of the factory calibration procedure. At runtime, the system can look up the true field as a function of both the magnetometer output and the temperature sensor output. Accordingly, the output of block 1206 can be temperature-compensated and linearized magnetometer/accelerometer readings.

At block 1208, the system can rotate the temperature-compensated and linearized readings to the cart's coordinate system, e.g., coordinate system 230. This rotation provides measurements in the cart's body frame coordinate system. The database "PCBA to cart frame angles" 1212 can be populated during or after the installation of the dead reckoning system onto the cart, e.g., by putting the cart on a known level surface and reading out the accelerometers' DC values.

At block 1214, the system can apply digital filters to produce filtered, noise-reduced measurements. The applied digital filters can have frequency response curves which vary with the current estimated cart speed or wheel rotation rate 1218. In some embodiments, the applied digital filters may have fixed frequency response curves. In an embodiment, each filter (e.g., per rotated axis) can be a two-pole low-pass Chebyshev filter, with the cutoff frequency lower than half of the rotation rate to suppress vibration noise at f0/2 (see, e.g., reference 1070 in FIG. 10B) but not being too low to cause a slow response to the cart actually turning (e.g., too low a cutoff frequency can cause the heading estimate to lag the true heading, which in turn can cause dead reckoning errors). An example cutoff frequency can be the current rotation rate times 0.375, 0.4, 0.425, etc.

At block 1216, the system can combine the magnetometer and the accelerometer data, producing cart heading in geomagnetic field coordinates, e.g. North-East-Down (NED) coordinates. The database "Hard and soft iron compensation" 1220 can be created after the dead reckoning system is installed on the cart. One way to generate database 1220 is to spin the cart around its vertical axis (e.g., z axis in the coordinate system 230) a few times. Another way to generate the database is using some fixtures suitable for the purpose.

Instead of the flow shown in FIG. 12A, an embodiment can implement an alternative flow for heading estimation. For example, a processing unit, e.g., processor 425, can read data from the one or more accelerometers. The embodiment can transform the accelerometer data to cart frame coordinates, e.g., coordinate system 230. This can provide an estimate of tilt at the current location and a reference frame for the magnetometer output. The system can read data from the one or more magnetometers. The embodiment can correct for hard and soft iron distortion. The correction can be computed based at least in part on iron distortion correction constants stored in memory associated with the processor. The system can also filter to remove or reduce noise caused by the local power line frequency, as described in the section above entitled Reducing Error in Heading Estimation. The heading can be relative to the geomagnetic field where the wheeled object is located. Correction of estimated accelerometer alignment and offsets can reduce error in this transformation.

h. Steady State Speed Estimate Update Loop

Figure 12B:
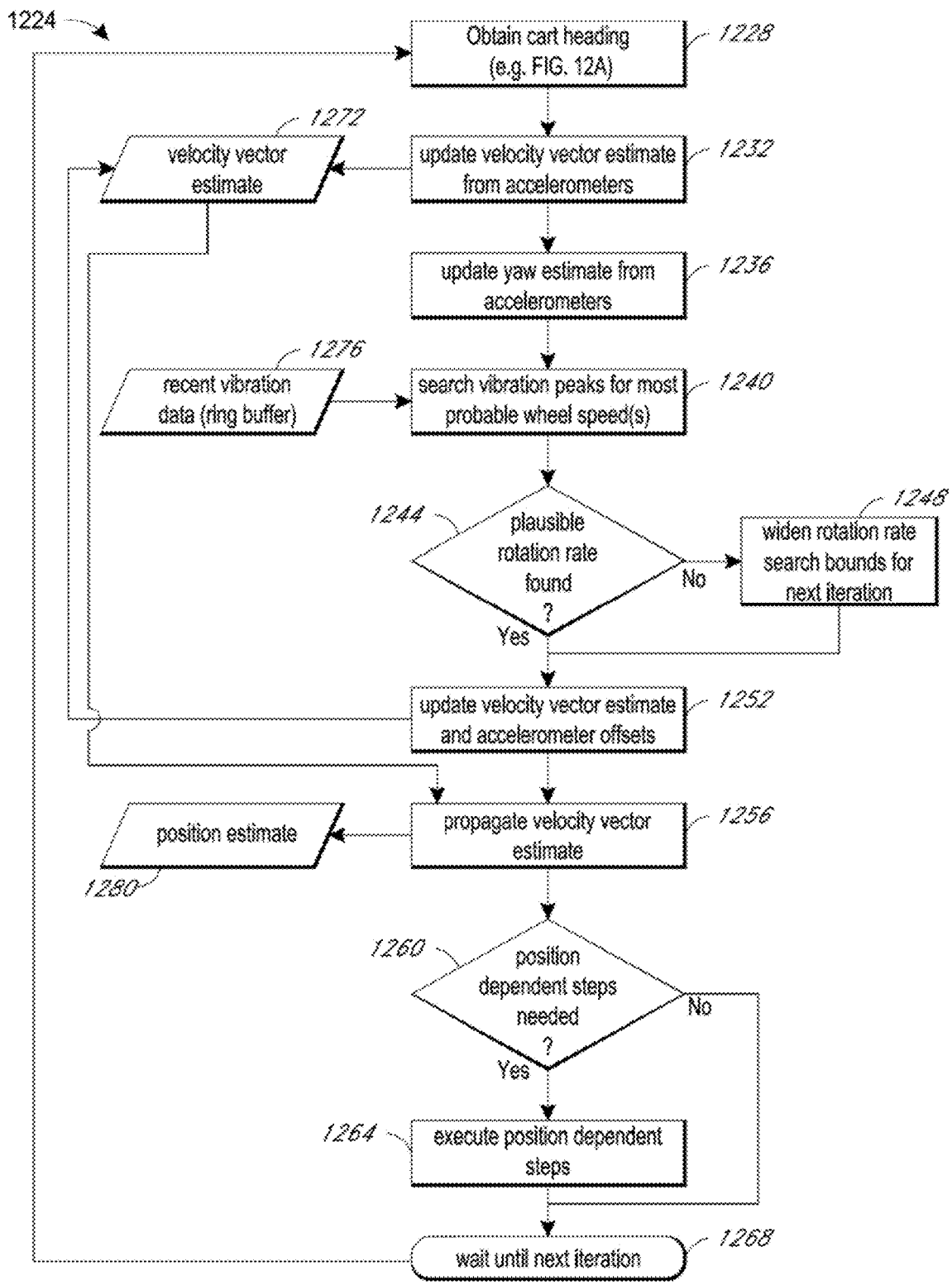
FIG. 12B shows an example method for position estimation using a dead reckoning system.

FIG. 12B shows an example method flowchart 1224 by which the dead reckoning system can determine an estimated position of the wheeled object (e.g., shopping cart).

FIG. 12B can start from block 1228, wherein the processor can obtain cart heading data in NED coordinates. The cart heading data can be derived from flowchart 1200 in FIG. 12A, the alternative embodiment described above, or some other method. At block 1232, the processor can update velocity vector estimate, illustrated as data block 1272, from the one or more accelerometers. At block 1236, the processor can update yaw estimates from accelerometer data. At block 1240, the processor can search the power density spectrum of vibration data for spectral peaks to determine the most probable frequency of wheel rotation and hence the speed of the wheel. This can be done, for example, using the method described above in the section titled Longitudinal Speed Estimation via Vibration Analysis. The time series of vibration data, illustrated as data block 1276, may be stored in a ring buffer such that old data is automatically overwritten with new data. The size of the ring buffer can be dependent on the length of the time series data needed for the vibration analysis.

At block 1244, the processor can determine whether a plausible frequency of wheel rotation is found through the analysis, for example, by finding a spectral peak of the X axis acceleration data at a first frequency and finding another spectral peak of the Y axis acceleration data at the third harmonic of the first frequency, as explained above in the section titled Longitudinal Speed Estimation via Vibration Analysis. If a plausible frequency is found, the process proceeds directly to block 1252. Otherwise, the process proceeds to block 1252 through block 1248, wherein the rotation rate search bounds can be widened for the next iteration to improve the likelihood of finding a plausible frequency.

At block 1252, the processor can update velocity estimate and accelerometer offsets. The velocity estimate can be based on estimated heading as determined in block 1228 and speed estimate as determined before block 1252. The velocity estimate can be used to update data block 1272. The accelerometer may have time-varying offsets. These offsets can change slowly and can be derived as a constant for the duration of one iteration of loop 1224. For example, an embodiment can determine accelerometer offset during a time interval using wheel rotation data in the same time interval, which provides a measurement of speed and hence of acceleration, e.g., the difference between measured speed in the current iteration versus the last iteration. Some embodiment may update accelerometer offsets for time intervals in which good wheel rotation data is available, and not update the offsets for time intervals in which the wheel rotation data is noisy.

At block 1256, the processor can propagate velocity estimate to produce a position estimate, e.g., data block 1280. This propagation can comprise, for example, summation of time series of velocity data and can velocity vector estimate 1272. At block 1260, the processor can determine whether position-dependent steps are needed. If yes, the process proceeds to block 1268 through block 1264, wherein the processor can execute position-dependent steps. Otherwise, the process proceeds directly to block 1268. At block 1268, the processor can wait until the next iteration starts and repeat the process from block 1228. Position-dependent steps can include, for example, initiating a warning sequence if the cart is in a warning zone.

For the purposes of illustration and simple explanation, FIG. 12B is drawn as a sequential process. In some embodiments, some operations, e.g., the input/output (I/O) operations such as reading the accelerometer and magnetometer, can be overlapped or performed in parallel.

i. Ongoing Magnetometer Calibration

There are at least three sources of error in a cart heading derived from magnetometer readings for a dead reckoning system: 1) errors in the magnetometer sensor itself. With such errors, the sensor reading is not the true value of the magnetic field at the exact location of the sensor (e.g., what would be output by an infinitely accurate magnetic field sensor sampling at the exact same time and location as the actual magnetometer in the dead reckoning system); 2) errors in the estimate of how the true magnetic field at the sensor is related to the known geomagnetic field, e.g., distortions caused by magnetically active material in the near vicinity of the magnetometer. The standard term of art for this is hard iron and soft iron errors, hard iron being material that has a permanent magnetic moment in the absence of an externally applied magnetic field, and soft iron being material without a permanent moment but which magnetizes in the presence of an applied field; and 3) errors in the estimate of the relationship of the magnetometer coordinate system to the cart frame coordinate system.

For certain specific magnetometer types, including the implementation within the Kionix KMX62, that error 1) can be basically fixed after PCBA reflow for any given individual magnetometer (e.g. the specific KMX62 on a given PCBA), within certain constraints of temperature and applied magnetic field. For the KMX62 the exposure limits within which the gain and offset do not permanently change are >125° C. and 500,000 µT, conditions which the cart would not experience in operation. The correction of error 1) corresponds to block 1206 in FIG. 12A. The section below titled Example off-Line Calibration contains additional related descriptions.

Error 3) can be caused, for example, by the cart handle being bent via abuse, or the angle of rotation of the dead reckoning system about the cart handle axis being changed. Block 1208 in FIG. 12A can provide the correction to rotate the sensor outputs to match the cart coordinate system, but the database that block 1208 uses (block 1212) is normally set once after the system is installed and then not updated in operation. If the data in block 1212 become inaccurate because of, e.g., the abuse mentioned above, accuracy of the dead reckoning system may likely decrease.

An embodiment can detect the probable cases of significant change in block 1212 by the fact that when the cart is dead stop on a known level surface, the rotated accelerometer readings is expected to be one gee down and zero gee north or east. If they are not, an embodiment can correct the rotation matrix 1212 such as to produce the correct output.

The remaining problem for heading accuracy is that error 2) can and does change over time, e.g., dynamically due to a large vehicle passing by. In particular, many shopping carts are made out of ferromagnetic material (e.g. mild steel). Residual magnetization of such material can change over time (e.g., if a cart is stored over a long period of time in a particular orientation, the magnetic domains can slowly align in accordance with the magnetic field the cart experiences). The changing magnetization of the cart can cause errors in the estimated heading, because the magnetic field being measured by the magnetometer may likely be different from the geomagnetic field.

A standard solution to this general problem, when highly accurate compasses are needed (e.g., for ship or aircraft navigation in the pre-GNSS days) is to periodically align the thing to which the compass is mounted (ship or airplane) to a series of pre-surveyed known headings, observe the compass reading at each of those pre-surveyed headings, and note the compass error at each. The standard term for this, during the Second World War and earlier, was a compass deviation card, which was a handwritten, frequently updated list of the compass errors.

A standard solution for devices like smartphones is to force the user to rotate the device multiple times over all three axes, measuring the three axis magnetometer outputs all the while. If the magnetometer were perfect and there were no error 2), the cloud of points described by the three-axis magnetometer output would all be on the surface of a sphere. In practice, however, because of errors 1) and 2), the cloud of points forms an offset ellipsoid. The cloud can be processed to form estimates of errors 1) and 2). The standard term for this is hard iron and soft iron correction. This process is described in the art, e.g., in Freescale Application Note AN4246, "Calibrating an eCompass in the Presence of Hard and Soft-Iron Interference."

However, there are some difficulties applying this standard solution to a magnetometer mounted on a wheeled object such as the shopping cart: 1) it requires the magnetometer, as installed, to be rotated over three approximately orthogonal axes. Doing that three-axis rotation with a shopping cart may not be easy; 2) because this standard solution does not involve temperature compensation, the calibration is only valid over a small temperature range. For devices like smartphones, this may not present a concern because even the best smartphone compass calibration rarely produces an accuracy that can be affected by small errors caused by short term drift over a modest temperature range. But for the usage applications based on this disclosure, a much higher degree of compass accuracy over a wide ambient temperature range, e.g. −15° to 50° C., is desired; 3) the process has to be repeated if the external magnetic influence (error #2) changes, which can be dynamic as noted above.

Advantageously, an embodiment according to the present disclosure can overcome these difficulties. A dead reckoning system according to the present disclosure can have the true value of the geomagnetic field at the location where the system is installed (e.g., from Table 1, Index 2 in section below titled Example Site Configuration File) and can separately compensate for error 1) as described above.

A shopping cart normally only rotates about its Z axis, which is usually with a few degrees of vertical. To initially populate data in block 1220 of FIG. 12A, the installer can deliberately spin the cart around the Z axis in an area where the magnetic field can be trusted to be very close to the geomagnetic field, e.g., outdoor and not too close to any large ferromagnetic objects (e.g., at least three to five meters from a large sports utility vehicle and two to three meters from a car). The installer may spin the cart one, two, three or more times. The set of points which are output from block 1214 in FIG. 12A can form a thin slice near the equator of an ellipsoid (e.g., if the cart is perfectly level and there is no error 2), the points would form a perfect circle). With information on the actual magnitude of the horizontal component of the geomagnetic field, an embodiment can solve for both soft and hard iron effects on the cart's XY plane. It may be possible in theory to solve for hard and soft iron on all three axes by deliberately spinning the cart on a non-level plane, but in practice the extra potential accuracy in the heading estimate may not be worth the effort.

After block 1220 is populated as described above, the cart can be put into service. In operation, an embodiment can continuously (e.g., periodically) monitor the output of process 1214 during periods when the system knows the cart is outside (because the geomagnetic field is generally quite distorted inside buildings). If at any time the system obtains a sufficient number (e.g., 5, 10, or more) of adequately spread heading points (these points have already been heavily low pass filtered by block 1214) over a sufficiently short period of time (e.g., a few minutes, less than 30 minutes, less than 1 hour), the system can re-execute the process described above after initial installation.

If the hard and soft iron calibration calculated by this operational process is significantly different from the value stored in block 1220, the system can update the value of 1220. The updated value enables the system to compensate for error 2) which may be changing over time.

What may constitute a "sufficient number" of distinct heading points "adequately spread" over a sufficiently short period of time can be at the discretion of a system designer. One example implementation has the following:

The system examines a sliding window of the past 10-20 (e.g., 16) seconds worth of points and bins those points into four magnetic quadrants in the horizontal plane (+X+Y, −X+Y, −X−Y, +X−Y). If at least 10% to 15% (e.g., 12.5%) of the points are in each quadrant, and at least two quadrants each contains at least 25% of the points, the system may consider the points to be adequately spread.

Using the existing value of the hard and soft iron compensation matrix 1220, if the vector magnitude of the geomagnetic field associated with any of those points is significantly different from the known geomagnetic field, the point can be rejected on the grounds that it was probably taken near some distorting external ferromagnetic object. This is a bootstrapping process—the initial calibration process to populate 1220 should preferably occur in a known magnetic field (e.g., the geomagnetic field at the location of the cart), but afterward the system can use existing value of data in block 1220 to know when the system is getting valid data for recalibration.

Another embodiment may not attempt to recalibrate hard and soft iron unless a certain number of points (e.g., all but those at or below a threshold such as 0%, 1%, etc., over the sample 10-20 seconds) indicate an absence of external distortion—fewer points than the threshold are rejected for being significantly different from the known magnetic field.

1. Shopping Carts with Adjustable Child Seats

Figure 16A:
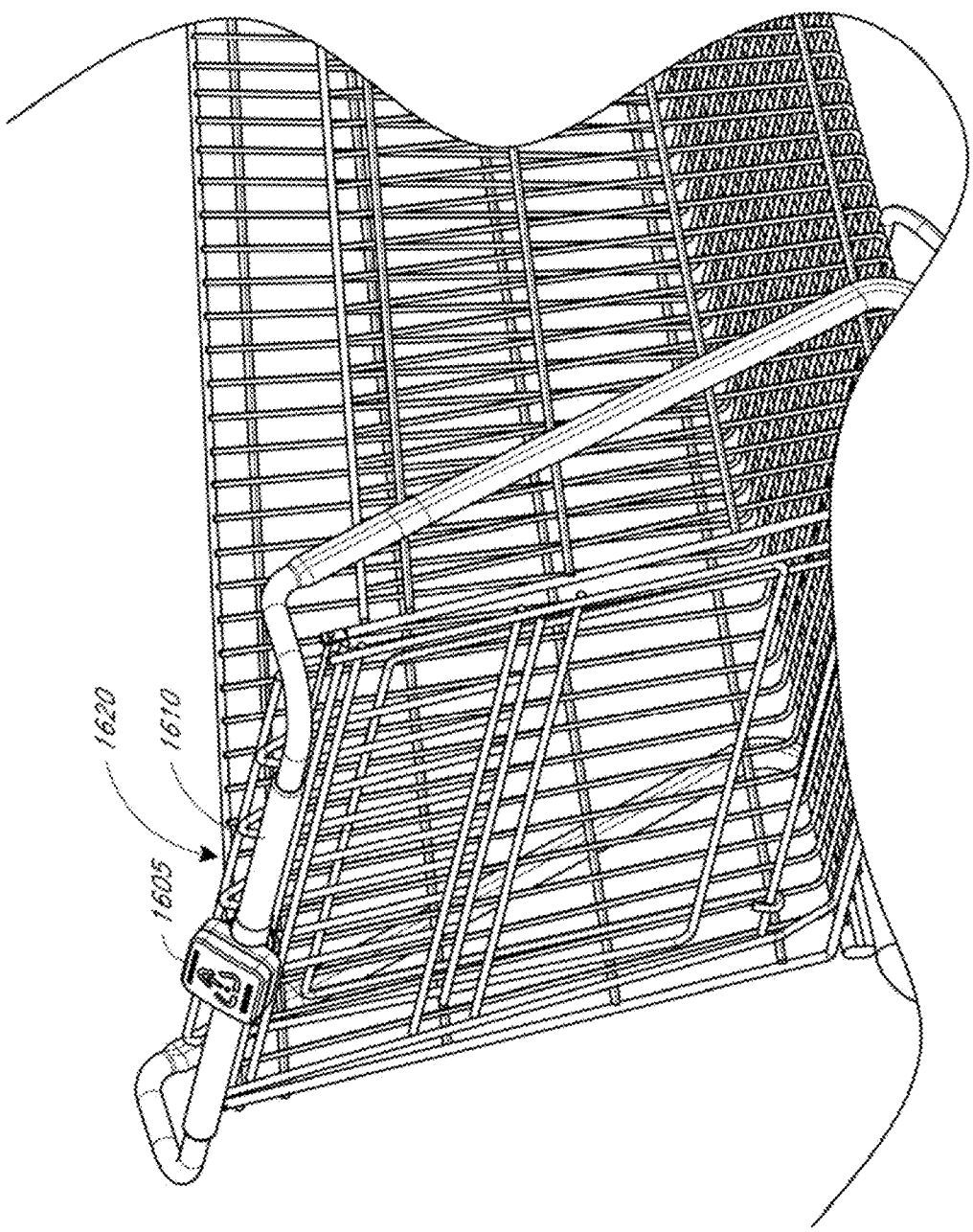
FIG. 16A shows an embodiment of a shopping cart having a smart positioning system with a display mounted to a handle of the cart. In this figure, the cart has a child seat that is in a closed position (child seat up).
Figure 16B:
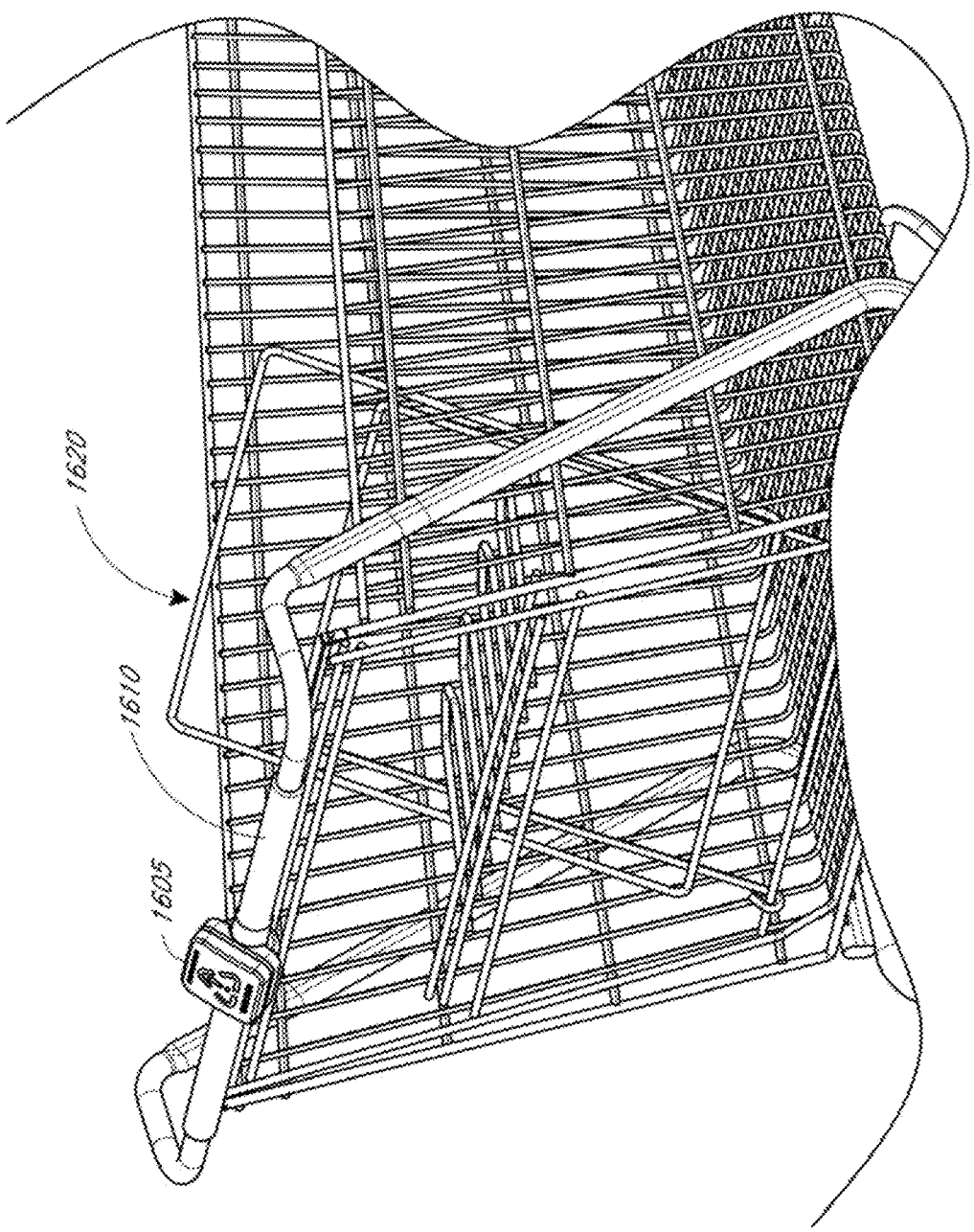
FIG. 16B shows the shopping cart of FIG. 16A with the child seat in an open position (child seat down).

Some shopping carts include a user-adjustable child seat that can be moved between a position where the child seat is closed and a position where the child seat is open, permitting a shopper to place a child (or other items) on the seat portion. With reference to FIG. 16A (described further below), this figure shows an example of a cart 1600 in which a child seat 1620 is in the closed position (which is sometimes referred to as child seat up, because the child seat portion is substantially vertical). In many carts, the shopper can push a metal frame of the child seat 1620 away from a handle 1610 of the cart 1600, which causes the seat portion to move to a horizontal position (e.g., the seat portion rotates down from the vertical position of FIG. 16A to the horizontal position). The open position is thus sometimes referred to as child seat down. FIG. 16B shows a shopping cart 1600 with the child seat 1620 in the open or child seat down position. In general use, it has been found that a majority of shoppers operate carts with the child seat down, which permits a child, a purse or shopping bag, or store items to be placed on the horizontal seat portion. Further, it has been found that the position of the child seat (e.g., up or down) typically does not change during a single navigating trip by the shopper.

When the child seat is up (in the closed position, e.g., FIG. 16A), the metal frame (often steel) of the child seat is relatively close to the handle 1610 of the cart 1600 and thus may be relatively near to the magnetometer of the smart positioning system 1605 mounted to the cart handle 1610. When the child seat is down (in the open position, e.g., FIG. 16B), a substantial part of the child seat is farther away from the magnetometer of the handle-mounted smart positioning system 1605. Thus, the amount of magnetic interference of a partially magnetized, metallic child seat on the magnetometer is generally measurably different between the child seat up and down positions. If the differing amounts of magnetic interference between the child seat up and down positions are not calibrated for, heading errors of several degrees to tens of degrees or more may be introduced into the navigation procedures, leading to inaccurate dead reckoning positions.

For many shopping carts, the heading error is typically approximately a sinusoid, with a maximum error at about 90 and 270 degrees heading. The metal seat typically is constructed out of ferromagnetic wires where the individual wires are aligned mostly left to right, e.g., along the Y-axis according to the cart coordinate system 230 shown in FIG. 2. Thus, when the cart is heading in one of those directions (e.g., 90 or 270 degrees magnetic heading), the geomagnetic field induces the greatest field distortion in the metal seat. The amplitude of the heading error sinusoid can be as much as 90 degrees for an intensely magnetized cart, but a more typical value is about 20 to 30 degrees (so the root sum of squares (RSS) value of the error for a uniformly distributed true heading is about 0.5*maximum error at 90/270 degrees heading).

Examples of techniques for calibrating magnetometers in carts having adjustable child seats are described below. Some such techniques may utilize two different hard/soft iron calibrations: one for when the child seat is up and another for when the child seat is down. Use of these techniques can reduce cart heading error associated with the seat being up and near the magnetometer to about 2 to 3 degrees.

The following is an example of a dual calibration implementation for a shopping cart with an adjustable child seat. At installation time (or at another calibration time), the installer can spin the cart around the Z axis two (or more) times: at least once with the child seat up and at least once with the child seat down. The data reduction from raw data to populating the hard/soft iron compensation data for block 1220 of FIG. 12A can be based on whether the child seat was up or down during each spin of the cart. Thus, two sets of hard/soft iron compensation data can be generated and stored at block 1220: one for the child seat up position and one for the child seat down position. If the cart had more than two operating configurations, compensation data for some or all of these configurations can be stored at block 1220.

During navigation, block 1216 of FIG. 12A can be performed as follows. As the cart navigates, the system can operate with a default hypothesis regarding the child seat position. In some implementations, the default hypothesis is that the child seat is open (child seat down). As the cart begins navigating at an exit (e.g., state 520 of state diagram 500), the system can compare the heading calculated based on the current child seat position hypothesis with the heading calculated based on the negation of the hypothesis.

On leaving the exit, the cart heading is (generally) known to be within a 180 degree arc of the direct path through the exit (e.g., as will be described further with reference to FIG. 14, a ground plan 1400 can include a compass orientation of each exit). In many cases, only one child seat position hypothesis will turn out to be consistent with a plausible cart direction (e.g., the measured magnetic field vector as transformed by the hard and soft iron compensations, which are then projected onto the cart's local horizontal plane). If both seat position hypotheses are plausible, the system may execute the navigation algorithm twice, once with each seat position hypothesis, until one hypothesis fails (for example, if the cart changes heading very much, e.g. by more than about 60 degrees, one of the two position hypotheses typically becomes impossible, namely, the magnetometer measurements do not correspond to any possible heading of the cart given one seat position hypothesis).

In some embodiments, the system can use the foregoing procedure to dynamically estimate whether the child seat is in the up position or in the down position. For example, if the navigation algorithm is executed twice, and fails for one of the hypothesized seat positions, then the other hypothesized seat position must be true, and the system can accordingly dynamically update the navigation to reflect the deduced true position of the child seat.

These techniques are not limited to shopping carts with child seats adjustable between an up and down position. These techniques are generally applicable to any type of cart having multiple operating configurations, where the magnetic influence of cart materials on the magnetometer may be different in the different operating configurations. Different soft/hard iron calibrations can be generated for some or all of the operating configurations and used to reduce heading errors induced by the different magnetic interference experienced by the magnetometer in the different configurations.

j. RSSI-Aided Dead Reckoning

Dead reckoning estimates of absolute position can become increasingly inaccurate as error accumulates through successive estimates. Estimates of incremental position changes through dead reckoning, on the other hand, can be fairly accurate where the method is carried out correctly with sensors of sufficient accuracy. As described above, the accuracy of absolute position estimates through dead reckoning can be improved through position reset using a precision position fix, such as signals from an exit marker and/or an RF beacon. The accuracy of absolute position estimates through dead reckoning may also be improved through incorporating other observables, e.g., RSSI, in the estimate process.

RSSI can provide an estimate of the distance between a transmitter, e.g., an access point 136, and the receiver, e.g., a dead reckoning system. Referring to FIG. 13, a single RSSI measurement may indicate that the dead reckoning system is somewhere on the circle, e.g., 1310, of a certain radius (the distance indicated by the RSSI measurement) away from the access point. A series of RSSI measurements can indicate that the dead reckoning system is somewhere on one of the concentric circles at each measurement time.

FIG. 13 illustrates this concept. As shown, a series of four RSSI measurements may indicate that the dead reckoning system is on circle 1305 at the time of the first measurement, on circle 1310 and the time of the second measurement, etc. The dead reckoning system may compute an incremental position change between the first and the second measurements to be $D_1$ meters at X degrees (from 1325 to 1330). The dead reckoning system may further compute an incremental position change between the second and the third measurement to be $D_2$ meters at Y degrees (from 1330 to 1335), and $D_3$ meters at Z degrees between the third and the fourth measurement (from 1335 to 1340). There may only be one (or a plurality of—less likely with a longer series) set of points on the concentric circles which satisfy the series of measured distance/angle changes. Thus, in theory, the estimates of incremental position changes plus distances or radii indicated by RSSI can be used to determine the absolute position of a dead reckoning system. By eliminating accumulated errors in dead reckoning, such estimates may be more accurate than absolute position estimates through dead reckoning alone.

In practice, both RSSI and dead reckoning estimates can have errors and ranges (e.g., a range with normally distributed confidence level). Accordingly, the estimates of incremental position changes plus distances or radii indicated by RSSI may not provide absolute position estimates with pinpoint accuracy. However, such estimates can still be used to improve the accuracy of absolute position estimate through dead reckoning because the RSSI can increase the number of observables in (or can place additional constraints on) the estimate.

Heading estimate supplied by a dead reckoning system, together with information on the location of the access point, e.g., from a site configuration file, can be used to improve accuracy of RSSI. For example, the antenna receiving the access point signal may not have a hemispherical antenna pattern. The heading estimate and location information can be used to compensate directional gain of the antenna, increasing the accuracy of RSSI.

Similar improvements may also be achieved through the use of other observables. The disclosed concept is not limited to an application of RSSI. Increased accuracy of position estimates can provide the benefit that position reset points, e.g., RF beacons, can be spaced further apart. This can reduce total system cost, or improve compliance with local code (e.g., local government ordinance and/or landlord rules) imposing constraints on installations and/or locations of transmitters.

V. Example System Implementation—Shopping Cart Containment a. Example System Site FIG. 14 shows an example of a ground plan 1400 of a retail store system installation. The ground plan comprises the following: (1) an area ("Store interior") 1410 where a cart's navigation behavior can be different (e.g., not tracking position at all, except for detecting that the cart has entered or exited the store interior; tracking dwell time (merchandise aisles/shelves where consumers spend much or little time)); (2) a containment boundary 1420 which may not be permissible for the cart to cross. The containment boundary is in turn defined by the set of edges between an ordered set of vertices (six vertices 1425 in FIG. 14), and may form either an open or closed polygon; (3) entrances and exits (in this particular example, two exits 1415 which also function as entrances). Physical barriers can prevent carts from entering or leaving the store other than through an entrance or exit; and (4) identified sections 1430 of, e.g., concrete, as distinguished from a different surface type, e.g., asphalt 1440. As discussed above, shopping cart containment is one possible application for the disclosed technology but other applications are relevant as well (e.g., tracking or monitoring luggage or warehouse carts, utility carts, etc.). FIG. 14 uses a shopping cart containment application for illustration, not by way of limitation. Further, as described below, plans for floors other than a ground level can be generated and used for cart containment and navigation purposes in multi-level structures.

The coordinate system, for simplicity, can be referenced to the major axes of the store. The <x,y> coordinates of each relevant feature can be determined relative to the center point 1405 of the front face of the store in this particular example. In some embodiments, the choice of <x,y> coordinate system can be made for the convenience of the installation design (e.g., referenced to architectural plans or property boundaries which may determine some of the containment boundaries).

Store exits 1415 are bidirectional in this particular example, that is, carts are permitted to enter and leave the store through either exit/entrance. In some embodiments, a store's interior may be designed such that certain portals are only permitted to be entrances or only permitted to be exits.

b. Example Site Configuration File

Table 1 shown below includes an example version of the site configuration file which corresponds to the example ground plan 1400. In some embodiments, the master copy of the site configuration file can be maintained in the site controller 1435. In some embodiments, the site configuration file can be transmitted to the navigation systems via their communication system, e.g., wireless RF techniques such as Bluetooth Low Energy (BLE).

In some embodiments, the configuration file can be created during the installation design process as described in section titled Example Installation and Calibration. In some embodiments, the configuration file of an operational system can be updated based on changes after the initial installation. A configuration version and/or a configuration timestamp (e.g., a date) can be included in the site configuration file. An embodiment of a navigation system can determine whether to request a download of the current version of site configuration file from the site controller based on the values of configuration version and/or timestamp field (collectively "version number") in the site controller's version versus the navigation system's local version. The site controller can broadcast its master version number periodically. This can advantageously reduce energy consumption associated with updating the site configuration file. In another embodiment, each parameter in the master site configuration file can have an associated version number. The navigation system can transmit the version number of its local version of site configuration file to the site controller. The site controller can parse through the master site configuration file and can transmit to the navigation system only those parameters with a version number later than the navigation system's version number. This too can advantageously reduce energy consumption associated with updating the site configuration file.

In Table 1, attributes which are in italic type are those which may be detected and/or updated during the learning process in this example. For instance, during site installation or during operation, a navigation system may detect a vibration signature associated with concrete expansion joints at certain coordinates. The navigation system can derive parameters such as spacing and/or width associated with the expansion joints, using its estimated position obtained via, e.g., dead reckoning and/or precision position fix. As another example, a navigation system may detect a vibration signature associated with asphalt at certain coordinates. The navigation system can derive parameters such as roughness or coordinates of the boundaries associated with the asphalt surface. The navigation system may update its memory, e.g., in the site configuration file, with such updated information.

This learning process may take place over time. For example, detecting expansion joints at certain coordinates, e.g., in concrete section 1, may be the start of a learning process. Over time, as the navigation system has traversed through the entire area of concrete section 1, it can determine the spacing between the joints. In some embodiments, the navigation system can upload the information acquired during the learning process to a central processing unit for the site. For example, an embodiment can transmit the information through a communication system 330 to the system configuration and control device 390, as illustrated in FIG. 3. The central processing unit can be configured to process the new information and integrate it with its master version of ground plan and/or site configuration file. The central processing unit can be configured to download the new information to other navigation systems. The upload/download can occur at a choke point where the shopping carts are expected to pass, e.g., an entrance and/or an exit. Different embodiments may include different sets of attributes to be detected and/or updated during the learning process.

An embodiment of a navigation system can adapt its processing algorithms based on the ground plan as described in the site configuration file. For example, the navigation system may use different vibration analysis algorithms for different surface types (e.g., concrete, asphalt, indoor, etc.) and/or for different roughness factor for a particular surface type.

TABLE 1

Example Site Configuration File Content

| Index | Item | Attribute: value | Attribute: value |
|---|---|---|---|
| 1 | Site | name: YourStore #42 | location: <latitude longitude> |
|   |   | WarningDistance: 5 feet | UnlockPolicy: CommandOnly |
|   |   | MainsFrequency: 60 Hz |   |
|   |   | Configuration version: 7 | Configuration date: xx-xx-201x |
| 2 | Geomagnetic field | coordinate system orientation: 30° | strength: 49 μTesla |
|   |   | inclination: 59° | declination: 13° |
| 3 | Exit structure | # of exits: two |   |
| 3.1 | exit A | coordinates: <−45, 1> | exit direction: 180° |
|   |   | detection type: magnetic, code 1 | exit/entry type: both directions |
| 3.2 | exit B | coordinates: <45, 1> | exit direction: 180° |
|   |   | detection type: 8 kHz, code 2 | exit/entry type: both directions |
| 4 | Containment | # of containment vertices: 6 |   |
| 4.1 | vertex 1 | coordinates: <60, 70> | close with next vertex: yes |
| 4.2 | vertex 2 | coordinates: <90, 70> | close with next vertex: yes |
| 4.3 | vertex 3 | coordinates: <90, −75> | close with next vertex: yes |
| 4.4 | vertex 4 | coordinates: <−115, −75> | close with next vertex: yes |
| 4.5 | vertex 5 | coordinates: <−115, 0> | close with next vertex: yes |
| 4.6 | vertex 6 | coordinates: <−60, 0>: | close with next vertex: no |
| 5 | Surfaces | # of standard surfaces: 2 |   |
| 5.1 | Standard surface 1 | Surface type: asphalt | roughness factor: 5 |

TABLE 1-continued

Example Site Configuration File Content

| Index | Item | Attribute: value | Attribute: value |
|---|---|---|---|
| 5.2 | Standard surface 2 | Surface type: concrete | roughness factor: 2 |
| 5.2.1 | Concrete | # of concrete sections: 2 | |
| 5.2.1.1 | Concrete section 1 | end 1 coordinate: <−115, 5><br>modal line spacing: 10<br>detected lines: <empty> | end 2 coordinate: <60, 5><br>width: 10 |
| 5.2.1.2 | Concrete section 2 | end 1 coordinate: <−115, −78><br>modal line spacing: 6<br>detected lines: <empty> | end 2 coordinate: <90, −78><br>width: 6 |
| 6 | Precision fix points | # of precision fix points: 1 | |
| 6.1 | Precision fix point1 | Coordinates: < ><br>Beacon MAC address: a:b:c:d:e:f | Precision fix type: Bluetooth beacon, iBeacon protocol |
| 7 | User warning configuration | Policy: standard | Language: English |
| 7.1 | Approach warning | WarningDistance: 10<br>Voice string: <reference to audio stored in Smart Positioning System> | LED flash pattern: 1<br>Volume profile: 85 dBA |
| 7.2 | Lock warning | WarningDistance: 3<br>Voice string: <reference to audio stored in Smart Positioning System> | LED flash pattern: 2<br>Volume profile: 90 dBA |
| 8 | Time of Day Dependent behavior | Standard calendar:<br>open 0600-2200 MTuWThFSa,<br>0900-2000 Su/Holiday | Holiday list: 12/25 |
| 8.1 | Closed hours behavior | Only inbound motion during closed hours | Outbound motion tolerance: 6 |

In an installation, it may be possible for the site configuration to change over time during normal operation. For example, a change in the parking lot arrangement could result in a change to the containment vertices. The site controller can propagate changes by, e.g., updating the "Configuration version" field of the system broadcast. A cart, e.g., the cart's smart positioning system and/or the smart locking wheel—can be updated wirelessly, via near field communication (NFC), or from a download from a flash memory card, etc. The site configuration file or ground plan 1400 can be stored in non-transitory memory 325 by the smart positioning system.

c. Example Shopping Cart Modes

A shopping cart within an example system can be in one of several modes at any given time. Major operational modes include but are not limited to: (1) outdoor, navigating (standard surface, e.g. asphalt); (2) outdoor, navigating (concrete, tile, or other special surfaces with periodic features); (3) indoor, not navigating; (4) indoor, navigating; (5) outdoor, locked, detecting return direction; and/or (6) being retrieved by a powered shopping cart retriever such as the CartManager XD available from Gatekeeper Systems (Irvine, Calif.).

In addition to the operational modes, there can be multiple offline or maintenance modes, e.g., for firmware updates. In some embodiments, the dead reckoning system can be configured to dynamically change modes of dead reckoning calculation, e.g., if the vibration signature remains relatively unchanged and indicates that the cart is traveling over a relatively smooth surface (e.g., indoors), the dead reckoning system may assume the cart speed is roughly constant until the vibration signature changes substantially to indicate that the cart is changing speed or moving over a substantially rougher surface (e.g., an asphalt parking lot). The change in the vibration signature can be detected via an increase in vibration sensor signals (e.g., in "g"s), an increase in vibration power in a vibration power spectrum (e.g., PSD), etc.

d. Exit Detection and Exit Identity Discrimination

A shopping cart can be expected to traverse through an entrance and/or an exit of a retail store. In some embodiments, entrances and exits can be interchangeable, e.g., a store customer can push a cart into the store or push a cart out of the store through the same physical opening. In other embodiments, dedicated entrances (only permitting entrance) or exits (only permitting exit) can be used.

For stores with a single exit, it is sufficient to detect that the cart is passing through an exit, which in that case is the only exit. For stores with multiple exits, the exit detection approach can identify which specific exit the cart is passing through. The function of determining which exit a cart is passing through may be called exit identity discrimination. An embodiment can support exit identity discrimination if its positioning uncertainty is less than the minimum distance between each exit and the centroid of other exits.

The present disclosure provides several different ways of discriminating between exits. Methods of providing both detection and discrimination with a single feature include:

A beacon, preferably of controlled and relatively narrow beamwidth, either RF (e.g. 2.4 GHz) or ultrasonic, placed near the exit in such a way that a cart can be determined to be in the beam versus not in the beam to a spatial accuracy compatible with the overall required system accuracy (e.g., within a few yards or meters accuracy), where the beacon broadcast encodes the specific exit's identity. Directional antennas such as the embodiments described in the incorporated-by-reference U.S. Pat. No. 8,558,698 can also be used. Beacons may but need not be Bluetooth Low Energy (BLE) beacons implementing a beacon protocol such as iBeacon from Apple Computer (Cupertino, Calif.) or Eddystone from Google (Mountain View, Calif.).

A magnetic structure in the floor, for example, the magnetically coded floor mats described in the incorporated-by-reference U.S. Pat. No. 8,046,160 (see, e.g., FIGS. 9 and 10 and the relevant specification text).

A VLF field where the VLF field is modulated with a unique code which identifies the specific exit. The VLF codes can be similar to those described in the incorporated-by-reference U.S. Pat. No. 6,127,927.

It may be advantageous to separate the precision detection function from the discrimination function. For example, in an embodiment which incorporates a low cost method to determine with high spatial accuracy that the cart is passing through an exit but not which exit the cart is passing through, the total cost of implementation may be lowered by implementing the discrimination function separately.

e. Entrance Detection

In some embodiments, the navigation process may not be used indoors, e.g., inside a retail store. In some such embodiments, entrance detection terminates the dead reckoning navigation process (until the cart exits the store again). It may not be necessary to determine an entrance event to particularly high spatial accuracy.

An entrance can be detected by using the same features as listed in the section immediately above in combination with a compass/magnetometer. For example, the detection of one of the markers of an entrance/exit along with the heading is sufficient if all the entrances and exits are along the same face of the store.

f. Resetting Accumulated Dead Reckoning Errors

Errors can accumulate in dead reckoning systems. Some embodiments can use an external reference (whose position is accurately known) to provide a reference position to a cart's dead reckoning system. The dead reckoning system can use the reference position as a new starting position for subsequent dead reckoning determinations. This can reduce or eliminate dead reckoning errors that were previously accumulated. Any of the beacons, directional antennas, magnetic structures, or VLF fields described herein for entrance/exit detection or discrimination can be used to provide the reference position to the cart.

g. Example Smart Positioning System Implementation

Figure 15A:
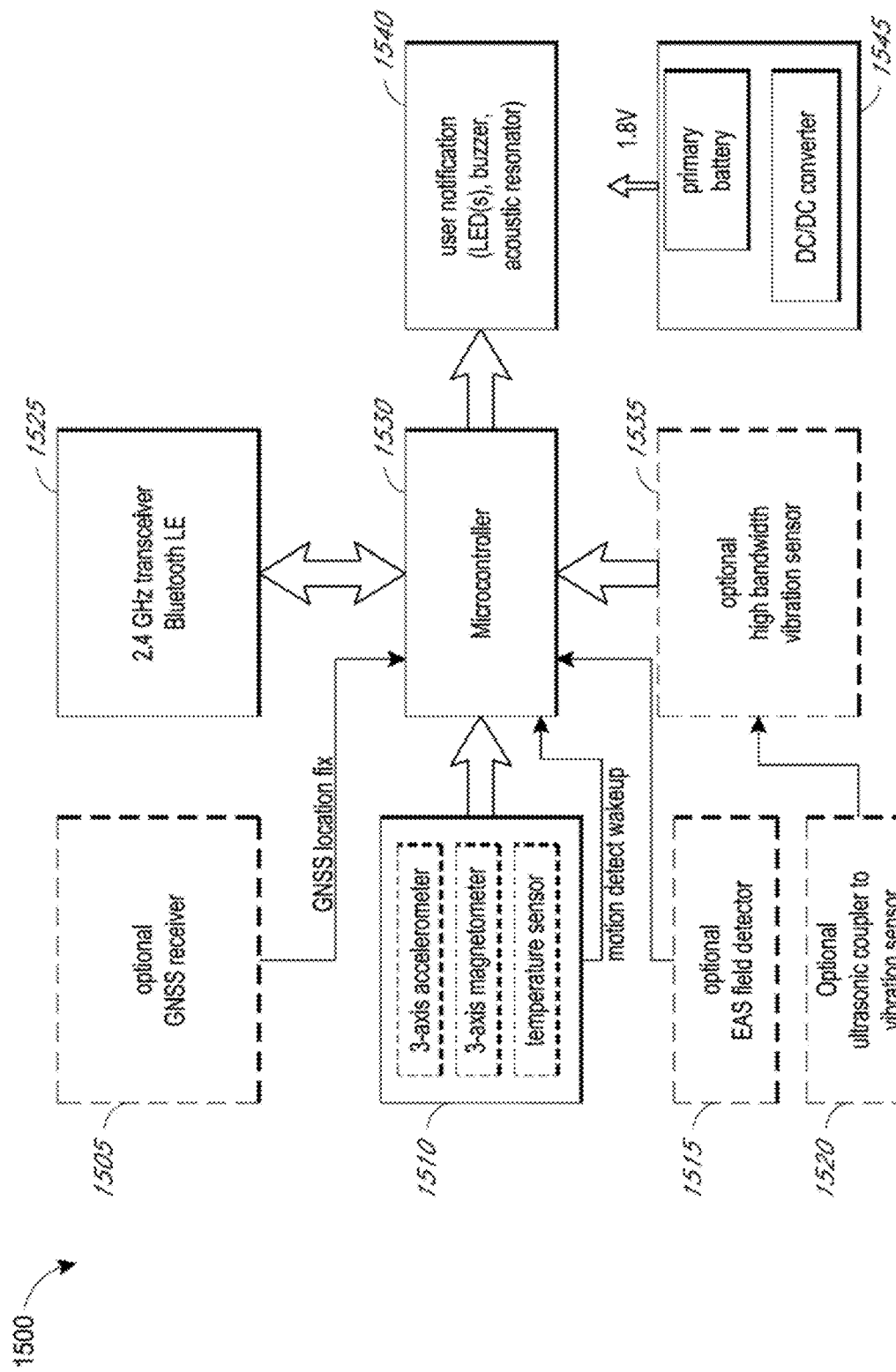
FIGS. 15A and 15B illustrate the components of two embodiments of a dead reckoning system.

FIG. 15A shows a block diagram 1500 of an embodiment of the smart positioning system for the shopping cart application. The microcontroller 1530 can provide processing functions for the system. The microcontroller can have access to nonvolatile and/or volatile memories. The optional GNSS receiver can provide a GNSS location fix to the system, e.g., to the microcontroller 1530. Alternatively or additionally, an optional EAS field detector 1515 can provide an EAS location fix to the system. A GNSS and/or EAS location fix, when available, can be used to reset the location to the precise GNSS and/or EAS fix and can be used to clear out any accumulated estimation error through dead reckoning. An installation can use the optional GNSS receiver when the system is outdoors, e.g., in unobstructed view of GNSS satellites, and use the optional EAS field detector when the system is indoors, e.g., where EAS transmitters are located. Another installation may have EAS transmitters located indoors as well as outdoors and can use the optional EAS field detector both indoors and outdoors. Yet another installation may have indoors GNSS pseudolites and can use the optional GNSS field detector both indoors and outdoors.

The accelerometer/magnetometer 1510 can provide data used in heading estimation. The accelerometer/magnetometer can output a wake-up signal to the microcontroller. The wake-up signal can be activated to bring the microcontroller into an active state when the accelerometer/magnetometer detects motion. Advantageously, the microcontroller can stay in an interactive, low-power state in the absence of an activated wake-up signal, thereby reducing power consumption of the system.

The optional ultrasonic coupler 1520 and vibration sensor 1535 can provide wheel rotation information to the system. This is described below in the section titled Enhanced Rotation Indicating Wheel.

The transceiver 1525 can provide communication functions via Bluetooth Low Energy. System information such as site configuration file can be communicated to the system via the transceiver. The transceiver can also provide location fix through reception of signals generated by a source at a known, fixed location. The transceiver can also be used for features such as location-based advertising.

The user notification interface 1540 can provide information, messages, and/or warnings, etc. to a user of the smart positioning system. A user notification interface 1540 can comprise audio components such as a buzzer, an acoustic resonator (e.g., a sound-producing instrument), etc., and/or visual components such as an LED display, an LCD display, etc.

The power supply component can comprise a primary battery, e.g., a CR123A lithium battery, and a DC/DC power converter, e.g., TI TPS62740. Using the battery as input, the DC/DC power converter can output a plurality of DC supply voltages needed by the various components of the system.

Table 2 shows a mapping of the functions in the abstract architecture of FIG. 4 to specific hardware realizations in the example embodiment in FIG. 15A:

TABLE 2

Example Abstract Function to Realization Mapping

| Abstract Function | Realization | Explanation/Notes |
|---|---|---|
| Processor + memory 425 | Microchip ATSAMS70 300 MHz ARM Cortex M7 1530 or Microchip ATSAMG55 1530 | The ATSAMG55 is a suitable single chip microcontroller for this application. In particular, it is extremely power efficient for computation, provides hardware floating point and a DSP instruction set, both of which are convenient for implementing many of the required algorithms, and contains a power-efficient high-speed ADC which is convenient for capturing data from the vibration sensor(s). |

TABLE 2-continued

Example Abstract Function to Realization Mapping

| Abstract Function | Realization | Explanation/Notes |
|---|---|---|
| heading sensor 405 and accelerometer 410 and motion detection sensor 450 | Kionix KMX62 or Freescale FXOS8700CQ 1510 | The FXOS8700CQ includes both a three-axis magnetometer and a three-axis MEMS accelerometer, along with some built-in processing elements. In particular, the FXOS8700CQ provides a very low power motion detection capability, whereby the FXOS8700CQ interrupts the processor to bring it out of sleep after a programmable acceleration threshold is achieved, e.g., from someone pushing the cart. See FXOS8700CQ data sheet section 7.4 and Freescale app note AN4074. |
| vibration sensor 415 | discrete implementation 1535 + 1520 | |
| precise position/ dead reckoning reset interface 435 | NXP KW31Z 1525; optional GNSS receiver 1505 and/or EAS field detector 1515 | Precise location index received via 2.4 GHz message from wheel or via localized 2.4 GHz transmitter (e.g., either received via transceiver 1525 or EAS field detected by EAS field detector 1515). |
| user notification interface 440 | LED plus speaker plus optional buzzer 1540 | A series of LEDs flash to indicate that the cart's wheel is about to lock. A small loudspeaker can be used to broadcast voice messages in the standard language(s) of the locale where the cart containment system is located. Optionally, a buzzer such as a piezoelectric resonator is usable to draw the shopper's attention to the LED. |
| configuration/ status interface 445 | NXP KW31Z 1525 | |
| Battery plus power supply 430 | CR123 LiMnO2 batteries plus DC/DC converter, e.g., TI TPS62740 1545 | |

A low-cost, high-sample rate, low-power consumption vibration sensor could be constructed out of a MEMS process similar to that used in commodity low bandwidth MEMS accelerometers. A suitable example of an accelerometer with a high sample rate is the Kionix KX123 accelerometer (available from Kionix, Ithaca, N.Y.) with 25.6 kilo samples per second (ksps) per axis. In some embodiments, the vibration sensor and the accelerometer are the same device. Such embodiments can filter the output of the device to obtain vibration data and acceleration data. For example, vibration data may be obtained by high pass filtering the output; acceleration data may be obtained by low pass filtering (including the DC component) the output.

Figure 15B:
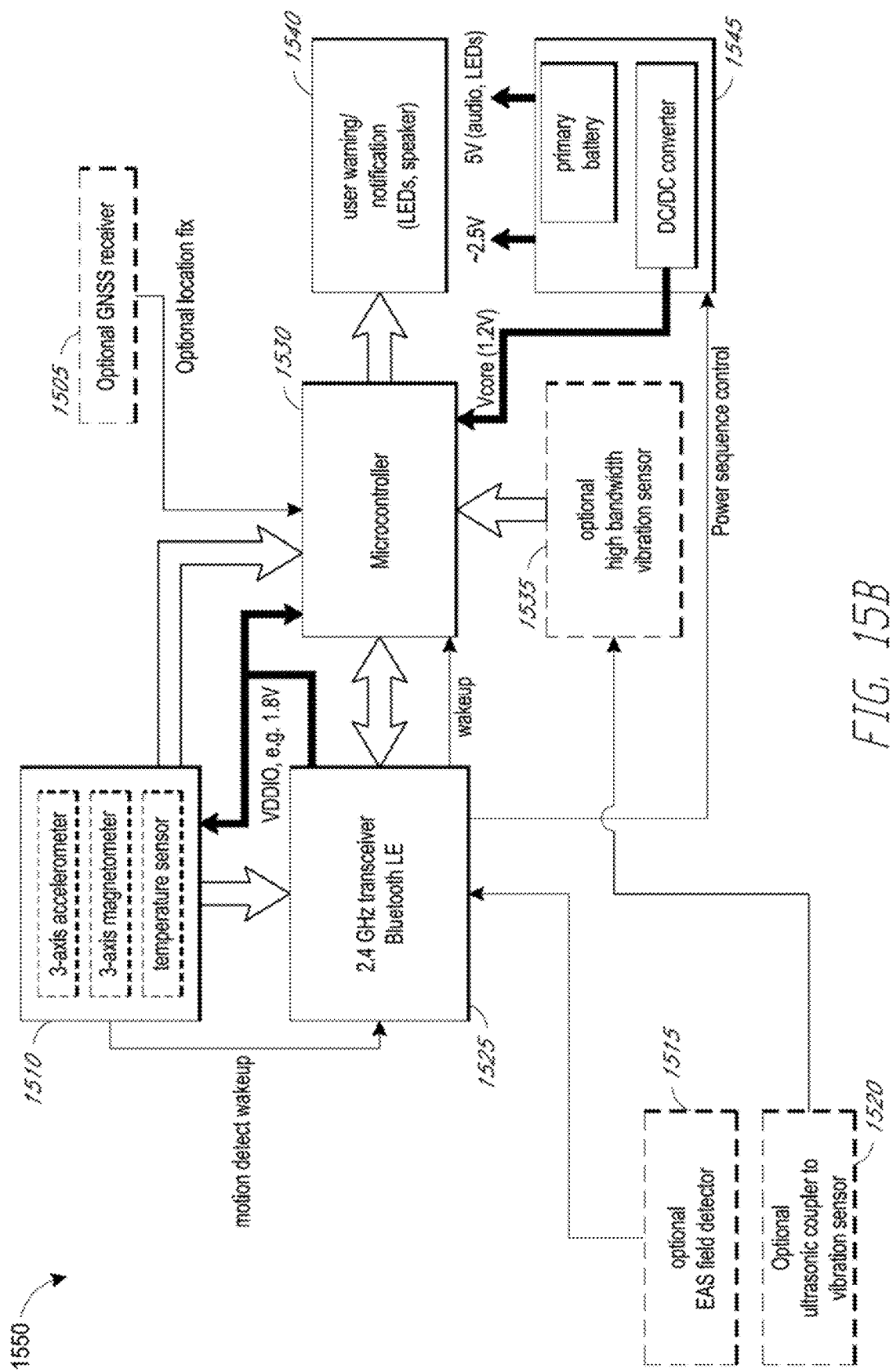

FIG. 15B shows a block diagram 1550 of another embodiment of the smart positioning system for the shopping cart application. In this embodiment, all the components are the same as the embodiment shown in FIG. 15A and are designated with the same reference numerals. The components are connected differently than the embodiment shown in FIG. 15A, however. In particular, the accelerometer/magnetometer 1510 and the optional EAS field detector 1515 are connected to a secondary processor in the 2.4 GHz transceiver 1525. The accelerometer/magnetometer 1510 can have an additional motion detect wake-up output connected to the secondary processor. The secondary processor (e.g., KW31Z) can wake up periodically to monitor events such as wheel rotation, EAS field reception, etc. If an event is detected, the secondary processor can wake up the primary processor to perform its functions. Advantageously, this embodiment can have lower power consumption because of a lower power consumption of the secondary processor compare with the primary processor, e.g., microcontroller 1530.

h. Example Shopping Cart Implementation

1. Smart Positioning System Mounting

FIG. 16 shows an example of a cart 1600 including a smart positioning system 1605 with a display presenting a notification that the wheel is about to lock. It can be advantageous to mount the smart positioning system to the handle 1610 of the shopping cart, e.g., as shown in FIG. 16 (e.g., near the center of the handle). Advantages include: (1) viewing angle(s) of the visible part of the user warning interface can be convenient to a wide range of user heights; (2) relatively unobstructed antenna paths for the 2.4 GHz transceiver and optional GNSS receiver; (3) the handle mounted location can be more protected from shocks during events such as mechanized cart retrieval than other locations on the cart.

Figure 17:
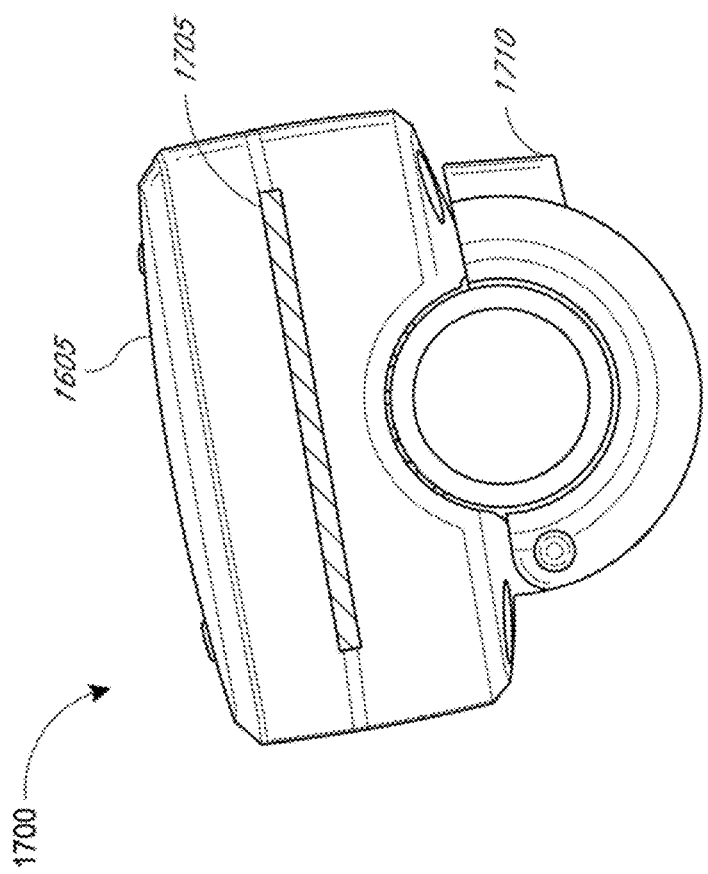
FIG. 17 shows a side view of an embodiment of a smart positioning system.

FIG. 17 shows a side view 1700 of an embodiment of a smart positioning system 1605. The stripe 1705 shows the orientation of the plane of the PCBA (the PCBA itself is inside the enclosure). The semicircular structure with a protrusion 1710 is the mounting mechanism for placing the smart positioning system on the handle of a shopping cart. When mounted, the handle of a shopping cart be placed in the hollow circular portion near the center of the system. The protrusion is a locking clip which can secure the system to the handle.

2. Example Locking Wheel

In some embodiments, a rear wheel may be a smart locking wheel instead of or in addition to the castered front wheel. In some embodiments, both front and rear wheels are castered, which is described below in section titled Front and Rear Castered Wheels. An example of a smart locking wheel that can be used with a shopping cart is the SmartWheel® 2.0QS wheel available from Gatekeeper Systems, Inc. (Irvine, Calif.).

Referring back to FIG. 3, an example smart locking wheel 215 can have one or more of the following capabilities and properties: (1) ability to communicate with the smart positioning system using wired or wireless links 365, e.g. via a 2.4 GHz RF link; (2) ability to lock and unlock 380 in response to commands sent from the smart positioning system. In some implementations, "lock" includes locking the wheel to prevent rotation and inhibiting rotation of the wheel about its axis. For example, rather than being rigidly locked, a locked wheel may be substantially more difficult to rotate than in an unlocked (e.g., freewheeling) state. A locked or locking wheel can include a wheel with a brake that can inhibit or prevent rotation of the wheel about the wheel's rotation axis; (3) ability to detect and timestamp rotation of the wheel 375; (4) ability to detect motion or the absence of motion, so that the wheel may enter a low power "sleep" state when the cart is not moving; (5) ability to detect and decode very low frequency 360 (VLF, typically extending from 3 kHz to 30 kHz, e.g., 8 kHz) fields such as those described in U.S. Pat. No. 6,127,927. Detection of the VLF fields can be used by the smart positioning system to actuate the wheel's locking mechanism (e.g., when the wheel moves past a containment boundary) to prevent theft of the shopping cart if the VLF field's radiating cable is located at a boundary of cart containment, or also as an anti-shoplifting measure such as implemented by the Purchek® system available from Gatekeeper Systems; (6) ability to detect magnetic markers 360 such as the magnetic markers described in U.S. Pat. No. 8,046,160 (see, e.g., FIGS. 6 through 10 and the relevant specification text). Specific locking wheel implementations may not provide all of these capabilities or may provide additional or different capabilities.

3. Wheel/Caster Configurations

In some embodiments, a locking wheel can be mounted in the front, e.g., castered, position. In some embodiments, a first locking wheel can be mounted in the front position, and a second locking wheel can be mounted in the rear position. Although it may be considered undesirable to have one or more locking wheels only in the rear because it may be much easier to continue to push a cart with a locked wheel only in the rear, some embodiments can be configured with a locking wheel mounted in the rear position. Section titled Front and Rear Castered Wheels describes embodiments in which all four wheels of a cart are castered.

An embodiment according to the present disclosure may have one of at least four different configurations of wheels and casters on the cart:

One, the cart has a noncastered rear wheels. At least one of the rear wheel can be a smart wheel capable of rotation detection and computation/logic processing. A castered front wheel can be equipped with a locking mechanism. Having locking front wheels can be advantageous because it may be easy to push a cart with only a rear wheel locked; cart containment may be less achievable as a result. This configuration is the default configuration for this disclosure. However, the disclosure is not limited to this configuration.

An installation which requires position tracking capability but not cart containment functionality through wheel locking, (e.g., tracking the motion of the cart only, or using only audio/visual warnings from the dead reckoning system) can have nonlocking front wheels, e.g., wheels without electronics and/or a locking mechanism.

In a second configuration, the smart locking wheel can be a front wheel. The smart wheel can perform all the functionalities described in this disclosure, e.g., rotation counting, wheel-related detection, and locking and unlocking.

In a third configuration, all four wheels are castered (e.g., as can be common in Europe). Thus the cart can "crab"—not go straight forward or backward. In this configuration, both a front and a rear wheel can have the various detection functionalities. In this configuration, the role of master wheel can change between the front and rear with respect to state transition diagram 560. An embodiment may use a rear smart wheel as a default master wheel and switched to a front smart wheel as the master wheel as needed, for example, when the cart is consistently going backward, e.g. being pulled by the handle rather than pushed. See section below titled Front and Rear Castered Wheels for additional descriptions.

In a fourth configuration, a rear wheel signals rotations to the smart positioning system without having any intelligence in the rear wheel, e.g. via the ultrasonic tuning fork in the wheel being struck. This configuration is described immediately below.

4. Enhanced Rotation Indicating Wheel

One embodiment of the wheel uses a tuning fork as a method of conveying rotation information to the dead reckoning system. A tuning fork and a striker can be placed in a wheel to produce a strike of the tuning fork for each rotation of the wheel. For example, a tuning fork may be placed in a stationary part of the wheel, e.g., attached to a wheel axis. A striker may be placed in a rotating part of the wheel. In some embodiments, the placement may be reversed, e.g., the tuning fork is rotating and the striker is stationary. Such an enhanced rotation indicating wheel can detect wheel rotation without requiring electrical energy in the wheel. This can be achieved, for example, through an ultrasonic sensor dead reckoning system. An ultrasonic sensor dead reckoning system can detect the ultrasonic pulses associated with rotations of a wheel which cause a striking of the tuning fork. The ultrasonic energy can propagate from the wheel either through the air or through the structure of the wheeled object to the ultrasonic sensor.

The resonant frequency of a tuning fork is given by Equation (1):

$$f = \frac{1.875^2}{2\pi \cdot l^2} \sqrt{\frac{E \cdot I}{\rho \cdot A}}, \tag{1}$$

where f is the resonant frequency, l is the length of the tines, E is Young's modulus of the material, I is the second moment of area of the tines, $\rho$ is the density of the material, and A is the cross-sectional area of the tines.

For example, a tuning fork made out of 308 stainless steel, with rectangular tines having a width of 1.1 mm and a length of 5 mm, has a resonant frequency of 22 kHz, above the range of human hearing.

One or more wheels of a wheeled object can be a wheel with a tuning fork. A wheel with a tuning fork and a striker can have low component cost and low energy cost (e.g., no electrical power is required to generate ultrasonic pulses), making multiple enhanced rotation indicating wheel an inexpensive and practical solution. More accurate wheel rotation data can be obtained through the use of more than one such wheels. For example, potentially bad data due to poor contact between a wheel and the ground can be identified by comparing data from different wheels. As another example, changing cart heading translates to more rotations of the front castered wheels than the rear wheels on an axle. Rotation data from both a front wheel and a rear wheel can be used in the estimate of changing heading.

Where more than one wheel has a tuning fork, each tuning fork may have a different resonant frequency from differences in their physical characteristics due to manufacturing variation. The resonant frequency of each wheel can be characterized during cart manufacturing/installation and stored in memory. Calibration data for resonant frequency across operational temperature range can be measured during manufacturing and stored in memory. The dead reckoning system can distinguish the source of an ultrasonic pulse through the resonant frequency of the pulse, temperature compensated as needed.

In an embodiment, the axle can be rigidly fixed to the caster fork; the rotating part of the wheel (e.g., hub and cover) can rotate around the axle with a pair of waterproof bearings. In a configuration wherein the tuning fork is rigidly coupled to the axle, the ultrasonic energy from the tuning fork can be coupled into the entire caster fork. The striker can be molded into one of the rotating parts, either hub or cover.

For a cart with noncastered rear wheels, the caster fork can be directly welded to the cart frame. In this embodiment, the ultrasonic energy can couple through the entire frame of the cart. Depending on details of the cart handle construction (e.g., some cart handles are welded steel tubes which are directly mechanically coupled to the rest of the frame; others are plastic or fiberglass, both of which can be heavily damping at ultrasonic frequencies), the ultrasonic energy will either couple directly into the smart positioning system or will couple via the air in the vicinity of the smart positioning system.

For a cart with all castered wheels, the rear caster fork, which is hard coupled to the tuning fork via the nonrotating axle, can provide a relatively large of area, on the order of 30 to 40 square centimeters, to couple acoustic energy into the air (from which the energy then couples into the ultrasonic receiver in the smart positioning system). An embodiment can use the rear rather than the front because the shorter acoustic path in the air to the smart positioning system (e.g. on handle unit) can provide stronger signal at the receiver.

5. Example Warning/Locking/Unlocking Behavior

The behavior of the cart (e.g., notifications to the user, and under which conditions the wheel locks and unlocks) can be adjusted to meet the customer's needs. In some embodiments, the behavior as the cart approaches the containment boundary includes the following: (1) When the estimated position of the cart is within a certain distance of the nearest point of the containment boundary, e.g., the distance being given by the field WarningDistance of the currently active configuration (e.g., see Table 1).

The navigation system can warn the user that a lock event is imminent. There may be multiple warning distances with different notifications to the user, such as different colors or flashing rates of the LEDs, different duty cycles on the buzzer, etc. (2) As the estimated position of the cart is crosses the containment boundary, the navigation system can command the locking wheel to lock. (3) The wheel can remain locked until it is unlocked, e.g., by a store employee using, for example, a handheld device which generates a specific wireless command (e.g., an RF 2.4 GHz command) to the wheel.

In some embodiments, the wheel may be unlocked when the cart has been pushed or dragged a certain distance back away from the containment boundary (e.g., back toward the store). Since the wheel is locked, the vibration spectrum of the cart may be different from the case where the wheel is rolling on the same surface. The vibration spectrum can be analyzed before or during installation. The site configuration file can include additional parameters to support this usage mode.

To protect against someone trying to steal the cart by dragging it backward (further away from the containment line), a system which requires the behavior of unlocking when being pushed or dragged back inward can include a castered wheel containing a magnetometer/compass, and use the magnetometer/compass in the wheel rather than the magnetometer/compass in the dead reckoning system as the heading source during a locked state. A magnetometer located on the cart handle may not indicate two different headings depending on whether the cart is moving forward or backward. On the other hand, a magnetometer located on a castered wheel can indicate different headings when the cart is moving backward rather than forward, since the castered wheel turns according to the cart's direction of movement.

i. Example Installation and Calibration

An example site configuration file, e.g., as shown in Table 1, can be created through an installation design process. The installation design process can take place offline, using tools such as a custom application using a map provider's application programming interface (API) (e.g., Google Maps API) to identify the spatial features of interest (e.g. exits, entrances, containment vertices, concrete sections, etc.). During the installation design process, the relative coordinates of these features can be obtained from the overhead imagery. Information obtained may be cross-referenced and verified with the customer's orders. During site installation process, information obtained during the design process may be confirmed through actual observation at the site.

Some embodiments of the system can allow for installation of smart wheels and smart positioning systems onto existing shopping carts in the field. The physical installation of the smart wheel onto the cart is well understood (for example, the existing Gatekeeper Systems SmartWheel® 2.0QS). The smart positioning system mounting can depend on the implementation of the cart handle. For handles that are part of the cart's rigid frame, the smart positioning system can include a magnetometer and an accelerometer, for example, on a printed circuit board assembly (PCBA). Various calibration procedures can be performed as described below.

1. Example Off-Line Calibration

In some embodiments, the dead reckoning system can include a mechanism by which a service technician can initiate a service/maintenance mode, of which calibration can be a submode.

One example method of triggering service/maintenance mode is to hold a permanent magnet next to the dead reckoning system in a specific orientation. The DC magnetic field can be detected by the magnetometer, and the dead reckoning system can interpret a field of the appropriate strength and orientation as a command to enter service mode.

Once service is initiated, the dead reckoning system can communicate via Bluetooth Low Energy with a handheld device such as a smartphone or tablet (e.g., iOS or Android devices). The handheld device can contain application software to assist the installation technician in the calibration process.

To enable communication to the individual units, the wheel and the dead reckoning system can have unique media access control (MAC) addresses on their RF (e.g., 2.4 GHz) links.

It may be advantageous to orient the accelerometer's 3 axes to the cart's body frame. An example of the cart's rigid body coordinate system is indicated in system 230 of FIG. 2: x forward, y left, z up. Through the calibration application on the handheld device, the installation technician can orient the accelerometer at any time that the cart is horizontal. Given the knowledge that the cart is horizontal, the orientation of the accelerometer in the xz plane can be determined from how the gravitational field resolves into the accelerometer's x and z axes. Orientation of the accelerometer relative to the cart body in the xy plane, if needed due to displacement of the cart handle from the y axis, can be performed by pushing (accelerating) the cart in a straight line.

The orientation of the magnetometer with respect to the accelerometer can be fixed at the time of manufacture of the dead reckoning system PCBA(s). Calibration of the offset and gain of the three magnetometer axes can be performed as part of dead reckoning system manufacturing process, e.g., by applying a series of known magnetic fields to the magnetometer via Helmholtz or Maxwell coils. The response of the magnetometer to the known, applied magnetic fields can be used to generate a calibration model usable to translate raw magnetometer readings into magnetic fields.

The magnetometer may often require hard and/or soft iron calibration, particularly if the cart handle material is ferromagnetic, e.g., mild steel or if the cart has an adjustable child seat and the magnetometer is disposed in or on the handle of the cart. A sufficiently accurate hard and soft iron calibration for some purposes can be performed by the service technician spinning the cart around the z axis only (1, 2, 3 or more spins can be used): while not fully accurate, as long as the shopping cart is constrained to a surface that is near level, as is usually the case, a post-correction heading accuracy on the order of two to five degrees can be obtained using this method.

As described above in the section titled Reducing Error in Heading Estimation, tilt of the ground surface can affect the accuracy of the magnetometer. At locations where the vertical component of geomagnetic field is about twice its horizontal component, e.g., in North America and Europe, achieving a heading estimate accuracy of one degree may require correcting for surface tilt (deviation from horizontal) of more than two degrees. At locations with a different geomagnetic field profile, correcting for a different severity of tilt may be required.

An embodiment may have a design target of 1 degree heading accuracy to support a site with a length of several hundred feet. A lower heading accuracy may be sufficient for a small site, e.g., a strip mall. For heading accuracies of better than one degree, a more accurate hard and soft iron compensation can be performed. The method can be performed, for example, by applying a series of known magnetic fields to the magnetometer, while the dead reckoning system is attached to the handle of the cart, via Helmholtz or Maxwell coils. The response of the magnetometer to the known, applied magnetic fields can be used to generate a calibration model usable to translate raw magnetometer readings into magnetic fields. Because the dead reckoning system is attached to the cart handle during the calibration procedure, this calibration method can compensate for the ferromagnetic material in the cart handle.

6. Example Temperature Compensation of Magnetometer

A dead reckoning system operating in a retail store setting may experience a wide range of temperatures, e.g., from severe winter to hot summer weather in the long term, and from climate controlled store interior to exterior whether elements in the short term. A magnetometer may be temperature sensitive and can require compensation across operating temperature range. Such compensation can help the dead reckoning system achieve the required accuracy across the operating temperature range. Units of magnetometers may need to be calibrated individually. This can be done during manufacturing e.g., after PCBA (for example, after the reflow process which can alter the temperature profile of a magnetometer). Magnetometer data can be measured at three or more temperature points. The calibration data can be stored in memory. In operation, a temperature sensor in the dead reckoning system (e.g., physically close to the magnetometer, for example, on or near the magnetometer die, or within a distance of 1 cm to 5 cm of the magnetometer) can sense operational temperature. The processor can compute a temperature compensation factor through, for example, polynomial interpolation of the calibration data based on the measured temperature. The processor can compensate for the temperature sensitivity of the magnetometer using this computed factor.

To provide a specific example, at the factory, each individual magnetometer can be calibrated (per axis) for offset and gain at a magnetic field value on the order of ±50 µT a at multiple temperatures. The number of temperatures at which the calibration is needed can depend on how accurate the temperature calibration needs to be, and on how non-linear the gain and offset versus temperature curves are for the particular embodiment of magnetometer. For example, for the KMX62 in a shopping cart application, a residual error after temperature compensation of 0.1 µT a over an operating temperature range of 15° C. to 50° C. can be a calibration target. The minimum output noise level of the KMX62's magnetometers in the lowest noise mode is about 0.2 µT. Hence a calibration target of 0.1 µT is reasonable in light of the inherent noise of the sensor. Measuring the gain and offset of each axis at three temperatures (e.g. −15° C., 25° C., and 50° C.) during factory calibration and linearly interpolating the results can produce RSS errors on the order of 10 nT.

VI. Example Applications a. Technical Challenges

The following implementation constraints can be applicable to the shopping cart containment problem, and in some cases may make otherwise practical solutions challenging or impractical to implement. Some of these constraints may also apply in other contexts or applications.

It may be advantageous for a shopping cart locking wheel to have the wheel's battery sealed inside the wheel at the time of manufacture. As a result, the battery may not be replaceable. In contrast, a handle mounted dead reckoning system can be designed to support replaceable batteries (see example in FIG. 17).

Some embodiments may include wheels containing an energy harvesting system, such as that described in U.S. Pat. No. 8,820,447. In such embodiments, the energy asymmetry between the smart positioning system and the smart locking wheel can be reversed (e.g., the smart positioning system becomes more energy constrained then the wheel). Energy in the smart positioning system becomes the quantity to conserve. In such embodiments, the main processing function can be migrated from the smart positioning system to the smart locking wheel, and the smart positioning system can accumulate heading and attitude information to relay to the smart locking wheel for processing.

b. Front and Rear Castered Wheels

In some embodiments, all four wheels of the wheeled object are castered. In such embodiments, the constraint that the path taken by the cart's body-centered velocity vector points "forward," e.g., normal to the line between two corresponding caster axes, may not apply.

Figure 18:
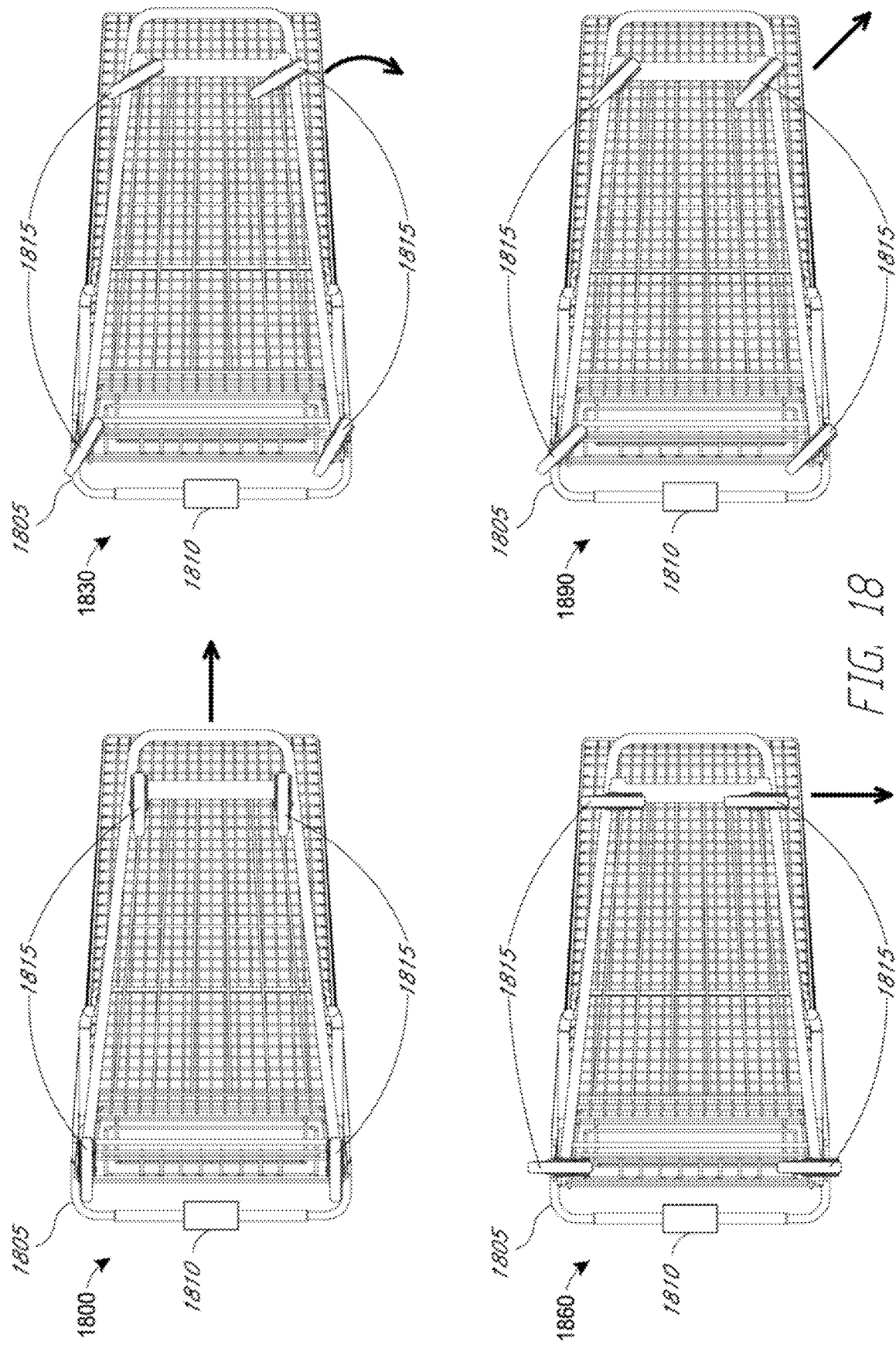
FIG. 18 illustrates a shopping cart with four castered wheels in various directions of motion.

FIG. 18 illustrates this phenomenon. In plot 1800, a shopping cart 1805 is moving in the forward direction, e.g., perpendicular to the wheel axles of the cart. The four wheels 1815 are aligned in the direction of cart motion, which is parallel to the x-axis. The magnetometer inside the smart positioning system 1810 produces a heading based on the cart's orientation, e.g., the x-axis.

In plot 1830, the shopping cart 1805 is turning clockwise. The wheels 1815 are aligned according to the direction of motion at each individual wheel. However, the four wheels may not be aligned with each other because the front of the cart and the rear of the cart are not turning in an identical direction. The magnetometer inside the dead reckoning system 1810 produces a heading based on the cart's orientation, e.g., the x-axis at the start of the turn, and the y-axis at the end of a 90° turn. The magnetometer can produce correct heading data in spite of the turn.

In plot 1860, the shopping cart 1805 is crabbing, e.g., moving sideways, parallel to the y-axis. The four wheels 1815 swivel to align in the direction of cart motion, parallel to the y-axis. But the magnetometer inside the dead reckoning system 1810 detects no change in the heading of the cart. The magnetometer output may be essentially the same as the output in plot 1800. Dead reckoning based on the magnetometer output can produce a position estimate which is erroneous. Similar error can occur with four castered wheels in all directions except the forward direction, as illustrated in plot 1890.

One solution to the absence of this constraint is to include a magnetometer in at least one wheel, e.g., heading/caster angle detector 383. The dead reckoning system can combine readings from the magnetometer in the wheel with readings from the magnetometer in the smart positioning system to estimate the cart's heading. For example, crabbing motion (e.g., as illustrated in plot 1860 or 1890) may be detected when readings from the two magnetometers have a large difference, and is not followed by a subsequent change in heading estimate from the magnetometer in the smart positioning system. For such motions, the system can use data from magnetometer in the wheel and not data from magnetometer in the smart positioning system. As another example, turning motion (e.g., as illustrated in plot 1830) may be detected when readings from the two magnetometers have a large difference, and is followed by a subsequent change in heading estimate from the magnetometer in the smart positioning system. Distinguishing turning motion from other types of motions, e.g., crabbing motion, with only a magnetometer in one wheel in addition to a magnetometer in the smart positioning system may be computationally expensive, however.

Another solution to the absence of the constraint on cart motion in association with front and rear castered wheels is to include a magnetometer in at least one front and one rear wheel. The heading of the cart body can be estimated as, for example, approximately the average of the headings of the front and rear wheels. In such an embodiment, the wheels can store at least raw magnetometer readings along with the timestamped rotation detections; these raw magnetometer readings can be processed together with the smart positioning system magnetometer and accelerometer time series data to yield the carts' heading history. With a magnetometer in at least one front wheel and one rear wheel, the system can distinguish turning motion from crabbing motion by comparing magnetometer readings from a front wheel versus concurrent readings from a rear wheel.

An additional or alternative solution is to provide a sensor by which the wheel can directly determine its caster angle, e.g., the angle between the wheel's direction of motion and the cart body.

c. Indoor Modes

Indoor dead reckoning can be used for multiple functions, including but not limited to: (1) tracking shopper behavior (e.g., dwell time and movement throughout the store), for post-processing analytics, or for real-time behavior such as sending targeted advertising to a shopper (which may be output on the display of the smart positioning system attached to the cart handle), estimating that a large number of shopping carts are heading for the checkout area (e.g., to increase the number of checkout personnel), etc.; (2) using dead reckoning estimates to infer shoplifting, for example, travel through (and perhaps pause at) the parts of the store which have high-value, theft-prone items such as liquor or cosmetics, followed by motion of the cart toward an exit without passing through a checkout station. Indoor dead reckoning can advantageously supply both direction and speed information. This enhances the likelihood of correctness of an inference of shoplifting. For example, a cart being rushed as it heads toward an entrance/exit leaving the store is more likely to be involved in shoplifting than a cart being rushed as it heads toward an entrance/exit entering the store. As another example, a cart passing a checkout stand slowly (e.g., and stopping) is less likely to be involved in shoplifting than cart passing a checkout stand quickly (e.g., without stopping).

An implementation of merchandise loss prevention based on dead reckoning can be based on user or cart behavior derived from dead reckoning estimates. For such applications, position tracking using a dead reckoning system can replace position tracking using, e.g., two-way communications, such as disclosed in U.S. Pat. No. 8,570,171 (System for Detecting Unauthorized Store Exit Events Using Signals Detected by Shopping Cart Wheels Units). Advantageously, position tracking using a dead reckoning system may not require signal sources at fixed locations, e.g., electronic article surveillance towers, access points, etc., thereby reducing infrastructure cost of the surveillance system. U.S. Pat. No. 8,570,171 is hereby incorporated by reference herein in its entirety for all it discloses.

Relative to an embodiment for outdoor applications, an embodiment adapted to perform these example indoor functions may include one or both of the following modifications: (1) Modification of the transfer function from magnetometer readings to georeferenced heading. (2) A rotation estimation algorithm optimized for use on tile or linoleum floors, which are significantly smoother than asphalt.

The magnetic field inside buildings (e.g., retail stores) can be significantly distorted from the geomagnetic field at the building's location. The distortion may primarily be caused by induced magnetization in the building's ferromagnetic elements (e.g. structural steel). An embodiment can add a single, constant correction vector to all magnetic field vectors measured within the building to correct for the distorted magnetic field. The correction vector can be a spatial average of the difference between the actual magnetic field measured at various points inside the store and the geomagnetic field at the store's location. The averaging can take place over an ensemble of locations which correspond to locations within the store that carts may be expected to traverse.

Some embodiments may implement a correction scheme involving storing a map of the magnetic field correction vectors, e.g., in a sparse grid corresponding to the individual points of the ensemble mentioned in the previous paragraph. The navigation algorithm, e.g., running on the dead reckoning system, can interpolate the instantaneous correction vector based on the present dead reckoned position. The correction vector(s) can be stored in the memory of the dead reckoning system (e.g., as lookup tables).

At a site where the ground has regularly spaced joints, e.g., tiles, dead reckoning algorithm can use vibration analysis to detect a cart crossing a tile joint. The distance traveled between joint crossings can simply be the size of a tile. Heading estimate can provide adjustment needed in the distance estimate when a cart does not travel in a straight line and does not cross tile joints at right angles. Tile size can be stored as parameters in the site configuration file.

The basic idea of detecting and counting expansion joint lines in concrete can be adapted to counting tile crossings indoors. The ambient vibration level can be far less indoors (due to the smoother surfaces of indoor floors compared to outdoor surfaces), and the coupled impulse from the tile joint can be much lower in amplitude than concrete expansion joints.

Figure 14:
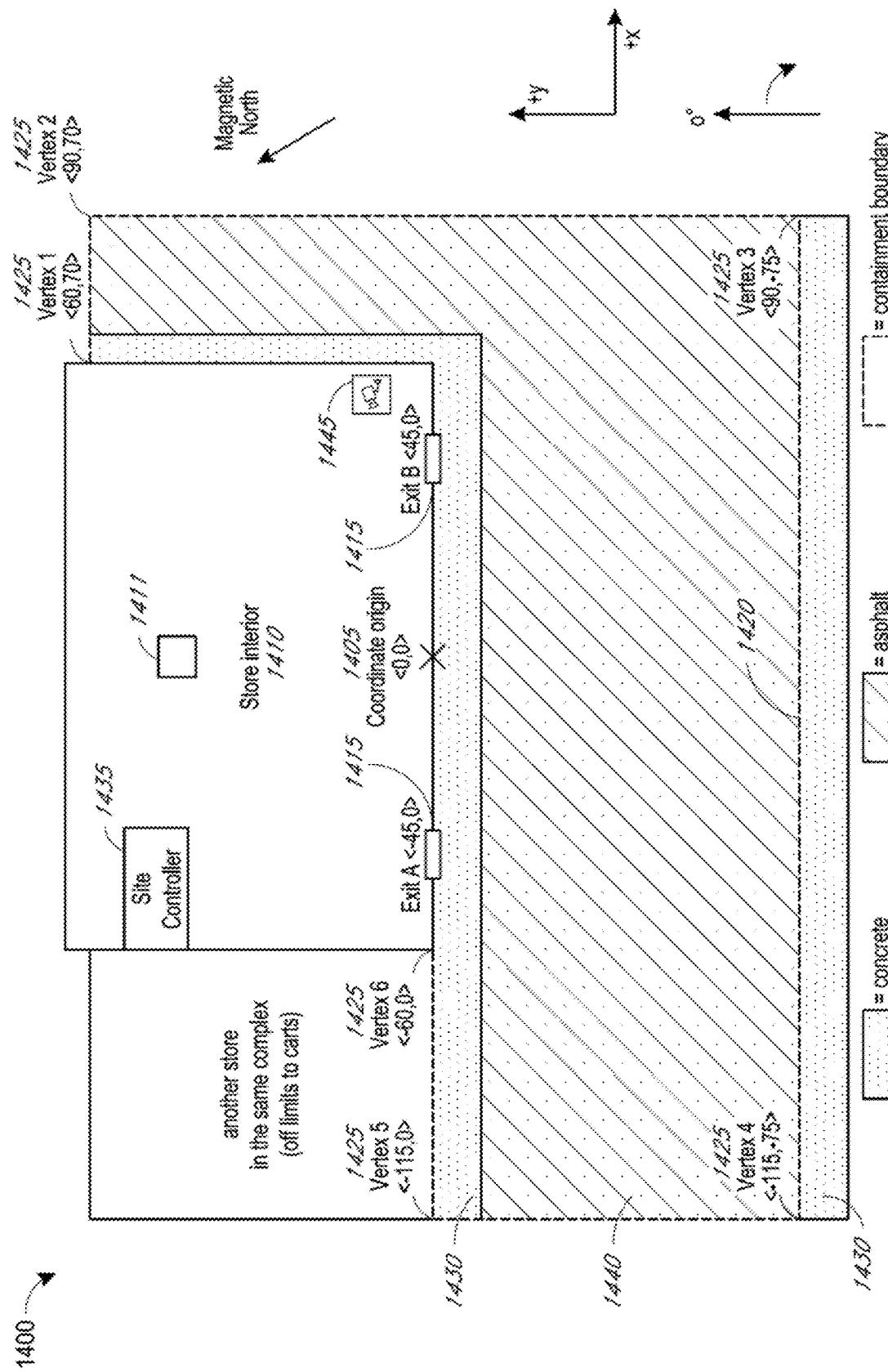
FIG. 14 shows an example of a ground plan of a shopping cart containment system installation.

Specifically, an embodiment for tracking position of indoor shopping carts can function as described below:

Upon entering a store, e.g., passing through store exit 126 in FIG. 1 or 1415 in FIG. 14 toward the store interior, a cart equipped with a dead reckoning system may begin indoor tracking using the entrance (exit) location as the initial position for dead reckoning. This location may or may not be augmented by specific precision fix (e.g., magnetic signature) readings at known points inside the store. Also upon entering the store, the cart may receive a start indoor navigation signal. This start indoor navigation signal may also provide operational parameters to the cart. The operational parameter information can be used to identify key locations inside the store and zones associated with triggering an anti-theft logic. For example, as the cart enters the store, it can be given the coordinates for checkout lanes and/or pay points in the store. It may also be given coordinates for where to trigger the anti-theft logic. With this information in the system, if or when the cart crosses the boundary of one of the anti-theft zones, the system can be triggered to prevent the cart from leaving the store without visiting a pay point or a checkout register.

While indoor, the cart can identify, through dead reckoning, if it passes through a register lane or is at a location in the store where payment transactions take place. For example, by combining the location of the cart and utilizing motion information such as heading and speed, an embodiment can determine whether the cart is in the vicinity of a register lane or a pay point and exhibits the motion profile associated with a shopper who is paying for merchandise. If so, the system can register that the cart is authorized to exit the store (e.g., by setting the state of the exit authorization to an authorized state), not locking the wheel and/or triggering alarms on the way out of the store. After the cart exits the building, the system can terminate indoor navigation mode, clear the state of the exit authorization, and begin outdoor navigation if triggered to do so.

If, on the other hand, the cart does not satisfy the criteria of purchasing merchandise at any time it is inside the store and attempts to exit the store, the system can determine via dead reckoning logic that the cart is attempting to exit but has no authorization to leave the store. The system can lock the wheel and/or trigger alarms. The alarms may be on the cart and/or external to the cart, e.g., on an electronic article surveillance tower which can communicate with the smart positioning system. Triggering the anti-theft system can be done in connection with high-value and/or high-risk merchandise areas such as liquor, health and beauty, etc. Alternatively or additionally, triggering the anti-theft system can be done based on the cart passing a boundary line, e.g., near an exit of the store.

In order to augment the accuracy of the dead reckoning algorithm, an embodiment can compare the actual magnetic field it reads to a previously recorded magnetic field mapping for the store. Key points in the store can be surveyed during the system installation phase; magnetic signatures for these key points may be stored in a table. When a system detects via dead reckoning navigation that it is near one of these signature points, it can compare its actual reading to the stored reading and can determine when it is actually in the vicinity of the stored magnetic field reading point. This can be used to reset errors in the dead reckoning algorithm.

d. Position Estimation Via Radius Fix or Hyperbolic Fix

In lieu of or in addition to dead reckoning, an embodiment may perform position estimation through radius fix using RF signals. For example, a single cooperating RF beacon/locating point, e.g., 395 in FIG. 3, can be located at a location known to the navigation system. Either the RF beacon or the navigation system can serve as the transmitter for the radius fix; the other device is the receiver.

In an installation where both the transmitter and receiver are capable of changing frequency without changing the phase of the phase locked loop (PLL) underlying the respective frequency synthesizers (RF chips with such capability include the NXP MKW31Z and the Microchip AT86RF215), the transmitter can transmit at several different frequencies. The phase difference of the path can be estimated from the received signals. This phase difference may be computed as radius (e.g., distance between the transmitter and the receiver) modulo wavelength at that particular frequency. With phase differences derived at several frequencies, a single value of radius can be computed, e.g., through a modular arithmetic approach finding the value of radius which can match all the different measured phase values. In practice, with noise and other issues, the modular arithmetic approach can used in conjunction with a best fit estimator.

In an installation where both RF and ultrasonic transmitter and receiver are available, radius fix can be computed through the use of both RF and ultrasonic signals. A fixed unit, e.g., the beacon, can be the ultrasonic transmitter. This can be the preferred embodiment because ultrasonic transmission consumes more power than ultrasonic reception, and because the fixed unit typically can have a line-power source. However, the wheeled object may function as the ultrasonic transmitter as well. Upon request for a radius fix (e.g., from either the wheeled object or a fixed unit, e.g., initiated by a central processing system), the transmitter can send both an RF transmission and an ultrasonic burst at the same time. The radius may be computed as the difference in reception time divided by speed of sound.

In lieu of or in addition to dead reckoning, an installation may provide position estimate via hyperbolic fix. Such an installation can have two antennas (e.g., 900 MHz or 2.4 GHz) on the fixed side, e.g., an RF receiver at a fixed location. Each of the two antennas can be connected via a coaxial cable of known length to an input of an RF phase detector. The RF phase detector can output the phase difference between the two inputs. A wheeled object with the smart positioning system can transmit sequentially on several different frequencies. This operation can be similar to the first example above for radius fix, except without the requirement that the transmitter can change frequency without changing phase of underlying PLL. The fixed side can obtain a series of phase differences as a function of frequency. Using the same approach as described in the first example for radius fix, a signed differential distance can be derived from the phase differences. The signed differential distance can define one half of a hyperboloid of two sheets. If the wheeled object is confined to a plane, as in the shopping cart case, the intersection of the plane and the hyperboloid is a hyperbola. The cart's position can be estimated to be on the hyperbola. The radius fix or the hyperbolic fix can be used in combination with dead reckoning position estimates to improve the accuracy of a position fix.

VII. Additional Improvements a. Navigation History and Backtracking

Some indoor navigation and backtracking algorithms can be computationally intensive. For example, indoor navigation using backtracking with particle filters can improve location accuracy by including structure floor plans (see, e.g., description with reference to FIG. 14) as constraints on position estimates. However, the high power requirements of indoor navigation and backtracking algorithms may be unsuitable for certain applications that are highly sensitive to power requirements such as a navigation system for a shopping cart. Accordingly, in some embodiments, some portion of the computational-intensive navigation calculations can be distributed from the navigation system on the cart to a remote computing system (e.g., in the "cloud") that performs the calculations and returns results to the cart navigation system. The remote computing system (sometimes referred to as a base station) can be connected to the cart navigation system via wireless techniques (e.g., a LAN, WAN, Bluetooth connection to the Internet, etc.). In some such embodiments, communication between the cart navigation system and the remote computing system (and offloading the processing to a base station) can be managed using embodiments of low-energy consumption techniques described in U.S. Patent Publication No. 2016/0259061, Low-Energy Consumption Location of Movable Objects, which is hereby incorporated by reference herein in its entirety.

A smart positioning system 210 (e.g., as described with respect to FIG. 2) on a cart can implement a less computationally intensive alternative to particle filter algorithms. The positioning system may handle some or all of these computations (or, as described above, offload some of the computations to a remote base station processing device). The less computationally intensive algorithm can help with navigating a shopping cart in an indoor environment with many barriers to free movement of the cart (such as shelves in a grocery store). A graph traversal approach can be implemented, where each node in the graph represents a region in which the cart's motion is unconstrained, such as a specific aisle, and the edges of the graph represent paths connecting the nodes, e.g., the zone at each end of an aisle where the aisle empties into a broader connecting area (each broader connecting area being a node as well, with edges to each aisle). Nodes of the graph can be weighted based on e.g., confidence of the cart's estimated position, and if (as described with reference to FIG. 22) the smart positioning system 210 determines there is an error in the estimated position, the nodes can be re-weighted and the estimated position re-calculated (e.g., via backtracking).

An example of a backtracking scenario will be discussed with reference to FIG. 22, which shows a section of a store with a single set of parallel aisles, with connecting aisles at each end. Merchandise shelves are indicated by cross-hatch. The section shown in FIG. 22 could be a portion of the store interior 1410 described with reference to FIG. 14. Additional, similar aisles may exist to the left and right of those shown in FIG. 22. For convenience of description, the primary aisles are oriented North-South, although this is for illustration only and is not a limitation. Nodes may be disposed in or along the aisles, and these nodes may provide to the smart navigation system a position (e.g., the node's position is assumed to be accurately known) as the cart passes the node. Examples of nodes include RF beacons 395 or fixed features 385 described with reference to FIG. 3. These position "fixes" from the nodes can be used by the navigation system to increase the accuracy of the dead reckoned position estimate. Embodiments of the smart positioning system 210 can store (or communicate to a base station for storage) a history of prior cart positions, a history of position estimates received from nodes, or histories of other navigation data (e.g., magnetometer measurements, wheel rotation estimates, etc.) and, as described in the following illustrative backtracking scenario, use the history data to improve the accuracy of a dead reckoned position estimate.

Figure 22:
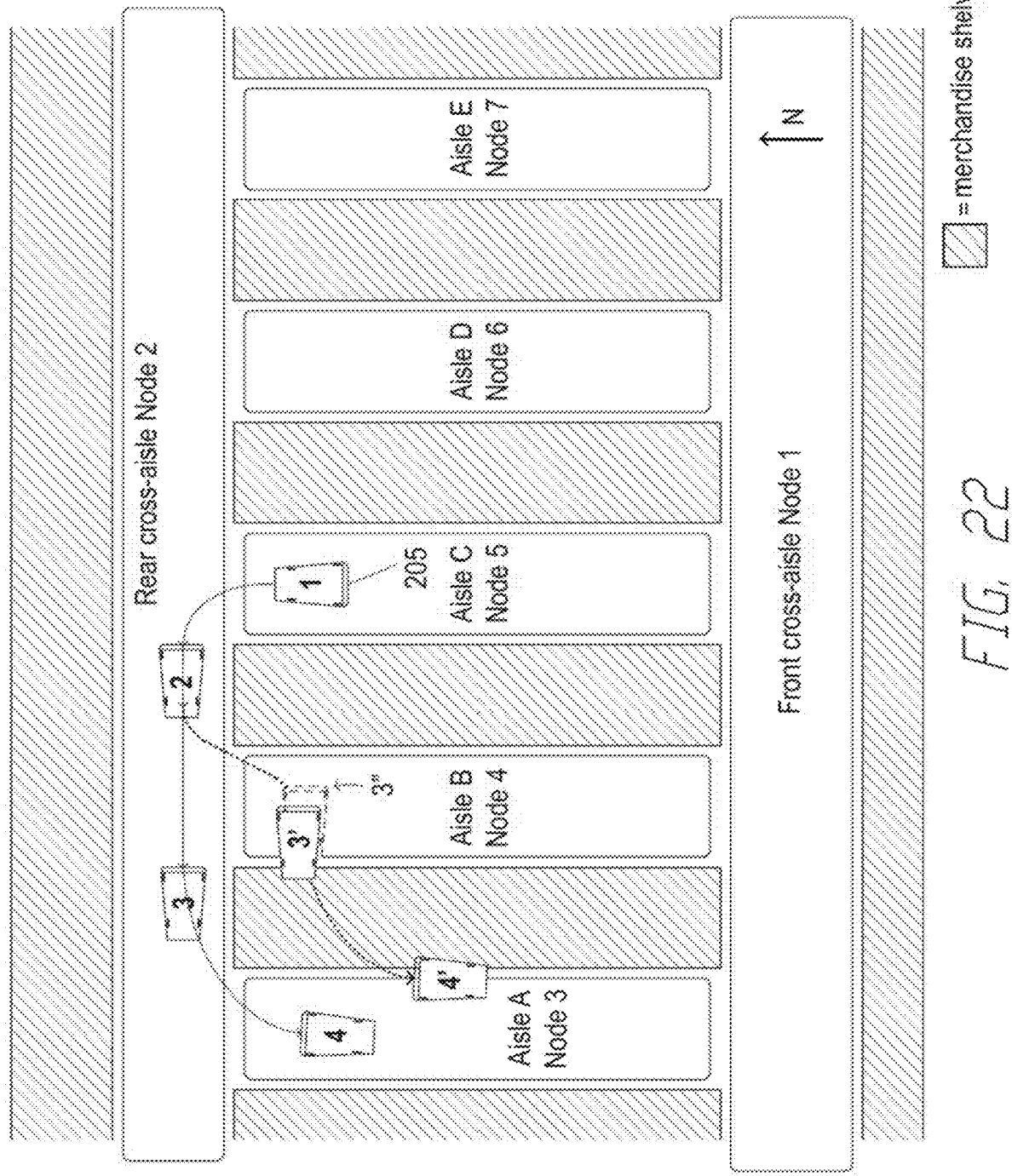
FIG. 22 shows an example scenario of dead reckoning in a store in which the navigation system uses backtracking to improve a position estimate.

In an example backtracking scenario, the cart 205 begins at position 1 in FIG. 22. The center of the cart handle is taken as the reference datum for all positions in this discussion (which is where the smart positioning system 1605 is commonly located).

The actual cart track is through positions 2, 3, and 4 as shown in FIG. 22, ending up in Aisle A. However, in this scenario a severe transient error in the magnetometer reading causes the estimated dead reckoning path to diverge, following the dotted track from position 2 to (erroneous) positions 3' and 4'.

Position 3' is actually impossible, since the cart cannot occupy the same volume as the merchandise shelving, so the dead reckoning algorithm with backtracking will assign a very low confidence to that dead reckoned position. However, at position 3' the most probable physical reality according to the dead reckoning algorithm is that the cart has not made quite as much forward travel as the dead reckoning indicates, and the actual position is something like 3", which is in Aisle B but not inside the shelving. Continued travel to dead reckoned position 4', going straight through a merchandise shelf, brings the probability low enough that backtracking is triggered. In this case, the dead reckoning algorithm reexamines the stored history of sensor measurements going back to the last confidently known position, 2, and finds the most probable node that could be reached from position 2 with reduced or minimum assumptions regarding sensor errors.

In this illustrative scenario, there is assumed to be no reason for the dead reckoning algorithm to doubt the rotation counting from position 2 onward (e.g., no changes in implied wheel rotation rate that are incompatible with measured x-axis acceleration), so the algorithm may assume that there was a heading error of unknown duration and magnitude at some point after leaving position 2. The node that can be reached with the reduced or minimum error assumption on heading is node 4, which in this scenario is correct, although the dead reckoning algorithm will have very low confidence in its estimate of the North-South position of the cart until another node transition, e.g. a turn onto Node 1 or Node 2, allows the North-South error to be bounded.

b. Determining Motion Direction for Various Dual Swivel Castor Embodiments

Tracking a cart, such as by dead reckoning, can involve determining a direction of motion for the cart. Carts with different castor implementations can determine the direction of motion in different ways.

Some carts can feature one or more wheels that swivel on casters and one or more wheels coupled to an axel. For example, two front wheels can swivel on casters while the axles rigidly fix two rear wheels to the cart frame (so that the rear wheels are always pointing parallel to the direction of the cart, e.g., perpendicular to the handlebar). In such an example, the cart's instantaneous motion vector is normal to the line between the two rear wheels. A directional sensor, such as a magnetometer, can be placed on a variety of positions to determine cart direction. For example, the magnetometer can be coupled to a rear wheel or anywhere on a cart body (e.g., the handlebar) that is rigidly fixed in direction with respect to the rear wheels.

For carts on which all four wheels have swivel casters (e.g., as described in the section entitled Front and Rear Castered Wheels, it can be more difficult to determine the angle that the cart is moving. For example, as shown and described with reference to FIG. 18, plots 1800, 1830, 1860, and 1890 show different directions that a cart with four swivel casters can move. A magnetometer rigidly mounted to the frame or body of a cart may not necessarily indicate a direction of motion of the cart. Accordingly, a sensor can be used to determine the directional heading of a wheel independently of the directional heading of the body of the cart. In some embodiments, a magnetometer or other directional sensor can be positioned in at least one of the swiveling wheels or casters, and the direction of the wheel can be used to determine the direction of the cart. In some embodiments, a sensor can be used to determine the swivel caster angle relative to the body of the cart.

Low cost, low standby power, and shock resistant systems for rotation counting on cart wheels tend to involve rotating permanent magnets inside the rotating wheel hub. The rotating permanent magnet activates a sensor in a non-rotating chassis such as a reed switch (e.g., an MK22-B-2 from Standex-Meder Electronics (Cincinnati, Ohio)), a Hall effect sensor (e.g., a DRV5023 from Texas Instruments (Dallas, Tex.)), or a magneto-resistive sensor (e.g., an RR120 from Coto Technology (North Kingstown, R.I.)). Such rotating magnets can create disturbances in the magnetic field detected by the magnetometer and can reduce the accuracy of a navigation system relying on the magnetometer.

In some embodiments, the magnetometer can be located farther from the moving magnet, reducing the effect of the rotating magnet on the magnetometer. A first wheel, such as a rear smart locking wheel (such as smart locking wheel 215 of FIG. 3) which may or may not be fixed (e.g., it may be castered), can include a rotation counter that includes a rotating permanent magnet. The magnetometer can be distanced from the rotating permanent magnet by being located in a second wheel, such as any front wheel or a front wheel diagonally across from the rear wheel with the rotating magnet, or on the handle of the cart. If the magnetometer is located in a second wheel, the second wheel can be free of rotating magnets.

In addition to a rotating permanent magnet in a first wheel (e.g., a rear wheel) that can indicate a speed and a distanced magnetometer that can indicate a directional heading, the navigation system can also determine if the cart is moving forward or backward. There are different ways to do so. As one example, the magnet in the first wheel may pass first and second sensors rigidly positioned with respect to the orientation of the cart, and the direction of rotation of the first wheel can be determined based on whether the first or second sensor is triggered first. As another example, the angular position of the rotating magnet is estimated using two magnetic field sensors at different angular positions in a wheel PCBA. Given a known vector magnetic moment of the rotating magnet, a possible angular position of the rotating magnet can be determined based on the magnetic field vectors at the two different magnetic field sensors. In some embodiments, the first wheel can be used to determine speed based on a rotating magnet while forward/backward movement is determined by reading a magnetometer at a first location (e.g., on a handle) and a magnetometer at a second location (e.g., in a second wheel).

In some embodiments, the magnetic field produced by the rotating magnet at the magnetometer is estimated and subtracted from the total field measured by the magnetometer. An inexpensive way to do this is to extrapolate the angular motion of the rotating magnet (e.g., estimate angular velocity versus time from timestamps of rotation detection) and integrate that function with respect to time from the most recent rotation detection to the present time. As described herein, motion detection can be used to wake up the smart positioning system from a low-power (e.g., sleep) state. This can help preserve energy consumption by the smart positioning system. In some embodiments, the second wheel (e.g., a front wheel) can also include a system for waking the processor (e.g., processor 370 of FIG. 3) that does not depend on rotation detection. For example, a motion detection system could use an accelerometer such as the LIS2DE from STMicrosystems NV (Geneva, Switzerland) to determine that the wheel has moved. Another example system for waking the processor that does not depend on rotation detection includes periodically waking the processor 370 FIG. via an internal timer and activating the communication system of the second wheel (e.g., the communication system 365 of FIG. 3) to listen for a message from the other (e.g., rear) wheel (e.g., smart locking wheel 215 of FIG. 3), indicating that the rear wheel has detected a rotation (at which point it is inferred that the entire cart is in motion).

c. Gyroscope in Wheel or Navigation Module

A cart can include a gyroscope to use in navigation and to enhance dead reckoning navigational accuracy, for example, as previously described in the section entitled Gyroscope in Wheel or Navigation Mode. Gyroscopes can determine instantaneous motion and direction. An example gyroscope is a MEMS gyroscope such as the LSM6DSL from STMicrosystems (Geneva, Switzerland). However, gyroscopes can use relatively large amounts of power, and constantly powering a gyroscope can be unsuitable for certain applications that are highly sensitive to battery life, such as a smart locking wheel.

Some systems can improve battery life by selectively operating the gyroscope for limited time periods instead of continuously operating the gyroscope. The gyroscope can be activated in response to determining that one or more of the other navigation systems are not functioning correctly. For example, a magnetometer guided navigation system (e.g., as described for carts with front and rear castered wheels) may detect a distortion to the geomagnetic field. For example, magnets in a cellphone, metals in passing cars or trucks, and other magnets or metals may be positioned close to a magnetometer in a cart and cause such a distortion. After hard and soft iron magnetometer compensation has been performed (e.g., as previous described with respect to blocks 1220 and 1216 in FIG. 12A), distortions in the magnetometer reading can often be detected after a navigation system produces a cart heading in geomagnetic field coordinates.

One or more factors can indicate that a magnetometer is not functioning correctly or encountering a magnetic field distortion. One factor includes determining if a vertical component of a magnetometer output is changing significantly or changing beyond a threshold vertical amount (e.g., changes greater than 0.5%, 1%, 3%, 5%, 10%, 20%, or more). Another factor includes determining if a vector magnitude of the magnetometer output is changing significantly or changing beyond a threshold magnitude amount (e.g., changes greater than 0.5%, 1%, 3%, 5%, 5%, 10%, 20%, or more). Another factor includes determining if the magnetometer output indicates a yaw rate that does not correspond to a low pass filtered y-axis acceleration (e.g., deviates by more than a threshold amount such as greater than 0.5%, 1%, 3%, 5%, 5%, 10%, 20%, or more). Another factor includes detecting changes in the magnetometer output while the cart is at rest (e.g., deviates by more than a threshold amount from the measured or expected resting value, such as by greater than 0.5%, 1%, 3%, 5%, 5%, 10%, 20%, or more). The numerical value of change that is appropriate may depend on the particular usage scenario. For example, when the cart is indoors, a greater level of variation is expected due to the proximity of ferromagnetic shelving and similar structures, but is on the order of a few percent.

As another example of a navigation system that may not always function correctly, a photosensor in a light based navigation system (e.g., as further described with reference to FIGS. 19 and 20) may be covered up (e.g., a shopper places a paper shopping list over the photosensor). As another example, two or more navigation systems can indicate conflicting locations.

In response to one or more navigation systems not operating properly or indicating conflicting locations or some other error, the gyroscope can be powered on and used to improve the accuracy of the dead reckoning system or other navigational system. Otherwise, the gyroscope can be powered off or put in a sleep mode, reducing power consumption.

When powered up, the gyroscope can provide an alternative and more reliable source of yaw rate. If the gyroscope is not mounted in the plane of motion of the cart, a three-axis gyroscope can be used to find the cart's yaw rate, with the three individual gyroscope axes being combined according to the standard coordinate rotation (such as described with respect to block 1208 of FIG. 12A). If the gyroscope is mounted in the plane of motion, a single axis gyroscope can be used to find the cart's yaw rate.

The gyroscope can be left powered up until a sufficient period of time has elapsed during which none of the indications of the magnetometer reading is being influenced by something other than the geomagnetic field have been seen.

d. Determining Cart Weight from Vibration Signatures

It can be advantageous to determine an estimate for the weight of a cart, for example, to determine whether a shopping basket of a cart is loaded or unloaded. Cart theft prevention logic (see, e.g., the example exit detection flowchart 600 described with reference to FIG. 6) can depend, at least partly, on the estimated cart weight (or the estimated weight above an unloaded cart weight), which can serve as a proxy for whether a user is attempting to leave a retail store with a cart loaded with unpurchased merchandise (a potential theft situation) or whether a user is leaving the store to return an unloaded cart to a cart corral (a non-theft situation). In a potential theft situation, a wheel may be locked (see, e.g., block 652 of the flowchart 600), whereas in a non-theft situation, the wheel may not be instructed to lock. As another example, in a potential theft situation, since the cart load may be a customer's child (who may be sitting in the cart) rather than unpurchased merchandise, instead of locking the wheel, the logic at block 652 may actuate an external security surveillance system (e.g., surveillance system 1445 shown in FIG. 14) to take a picture or video of the customer leaving the store. As yet another example, at a boundary to a tracking area 114 (e.g., a boundary of a parking lot), it may be desirable to prevent theft of the cart whether loaded or not. Accordingly, the exit detection logic may lock the cart wheel(s) at a tracking area boundary regardless of the determination of whether the cart is loaded (or the cart loading determination may be omitted in such regions).

The weight of the cart can affect other features. For example, as previously described, a shopping cart may lock its wheels when determining that a shopping cart is exiting a store without passing or stopping by the checkout lanes. However, the cart may be allowed to exit a store without locking its wheels if the cart's weight indicates that the cart is empty. As another example, the speed or force at which brakes engage to stop a cart may depend on the weight of the cart. Heavily weighted carts may have brakes applied with greater speed or force to slow down the momentum of a loaded cart. Unloaded carts may have brakes applied more slowly or with lower force so that the cart does not change momentum too suddenly.

A weight of a cart can be determined based on a vibration response of the cart. For example, a loaded cart vibrates with a different vibration signature after it crosses over a discontinuity (e.g., a tile joint, exit bump, etc.) than a lighter cart (e.g., an unloaded cart). By measuring the vibration signature induced by a discontinuity, the smart positioning system can estimate the mass of the cart or the load of the cart or simply determine whether or not the cart is loaded (or unloaded). Because the mass of the unloaded cart is known, the mass of the load in the cart can be estimated in some embodiments. In some embodiments, the system determines from the vibration response whether the cart is loaded or unloaded but does not make an estimate of the amount of the load (or the weight of the cart), because the anti-theft or navigation logic described herein may only need information on whether or not the cart is loaded (and not the amount of the load).

The presence or absence of a significant load (e.g., larger than 2 kg, larger than 5 kg, larger than 10 kg, larger than 15 kg, larger than 20 kg, larger than 25 kg, larger than 30 kg, larger than 50 kg, etc.) in a cart 205 can often be determined based at least in part on the vibrational signature of the shopping cart in response to shock impulses, in particular impulses along the Z-axis of the coordinate system 230 shown in FIG. 2.

A load in the basket that is on the same order of mass or greater than the mass of the empty cart will behave similar to a cantilevered mass, again particularly in the Z-axis. The energy of the ringing oscillator comprising the load mass and the (semi)-rigid arm created by the cart basket is mostly concentrated in the Z-axis. However, the highest amplitude of acceleration/vibration/ringing is in the X-axis, mostly because there is much more compliance for the cart to move with respect to the ground in the X-axis. For example, the entire frame of the cart wobbles by a small amount on the wheel axles. Accordingly, the surprising and unexpected result of the experiments described with reference to FIGS. 21A and 21B is that the vibration signature manifests itself most strongly in the X-axis vibration data, rather than the Z-axis vibration (the direction in which the impulsive shock initially occurs).

Thus, a vibration signature should show ringing after an impulse in the positive Z direction. The vibration signature can be measured, for example, by a smart positioning system 210 shown in FIG. 2 at the handle of the cart 205. Accordingly, a weight of a cart can be determined based on the vibration responses of the cart. After passing over a discontinuity (e.g., a tile joint), a loaded cart vibrates with a different vibration signature than an unloaded cart.

The hardware shown in FIG. 4, including the a three axis accelerometer 410, other vibration sensor(s) 415, and processor 425, that are used to process vibrations for inferring wheel rotation can be used to measure impulses along the Z axis and ringing (post-impulse) along Z, X, or Y-axes. As will be described, the X-axis vibration data can provide a useful signature to assist in determining whether the cart is loaded or not.

Figure 21A:
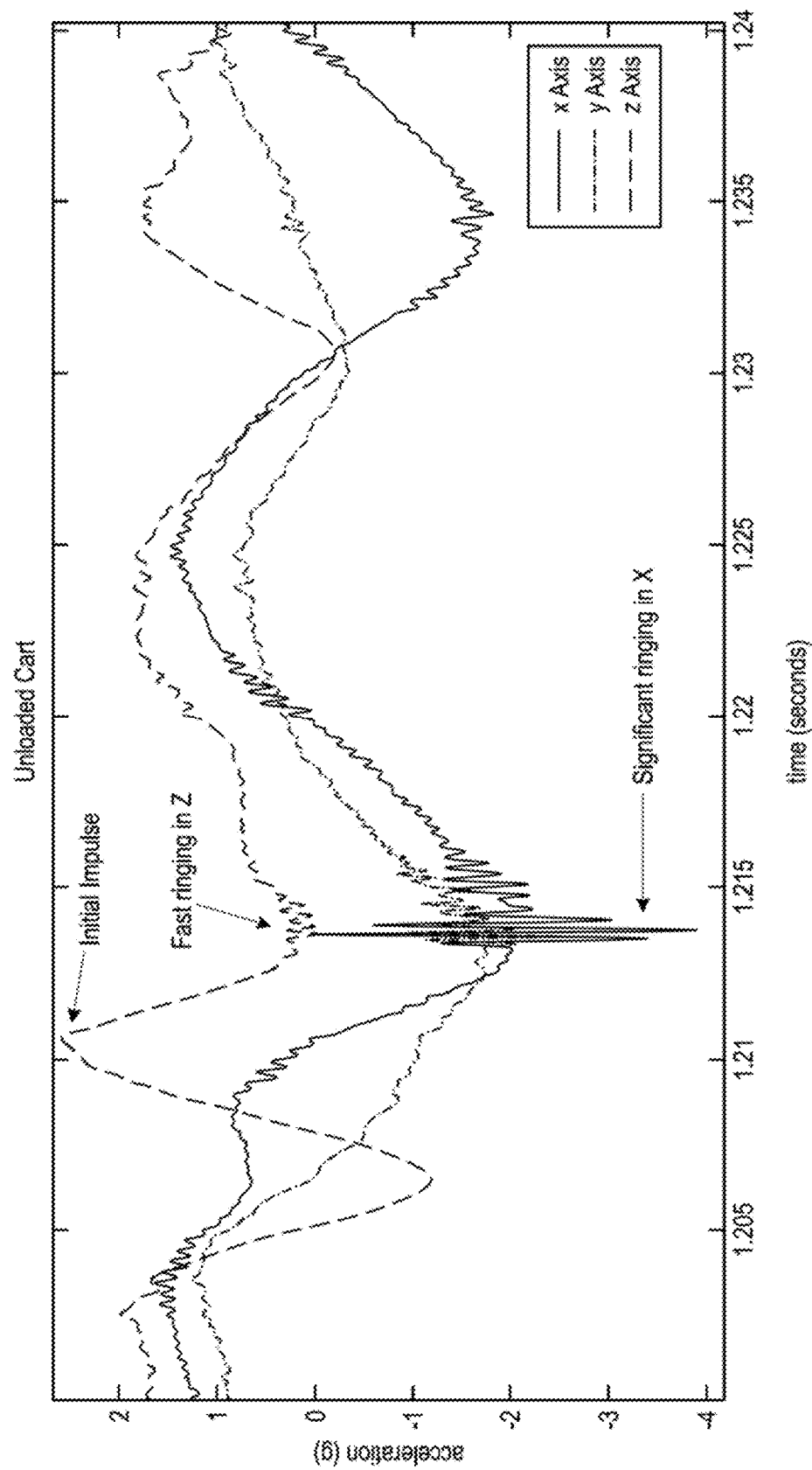
FIG. 21A shows an example output of a time domain three axis acceleration of an unloaded steel framed shopping cart.
Figure 21B:
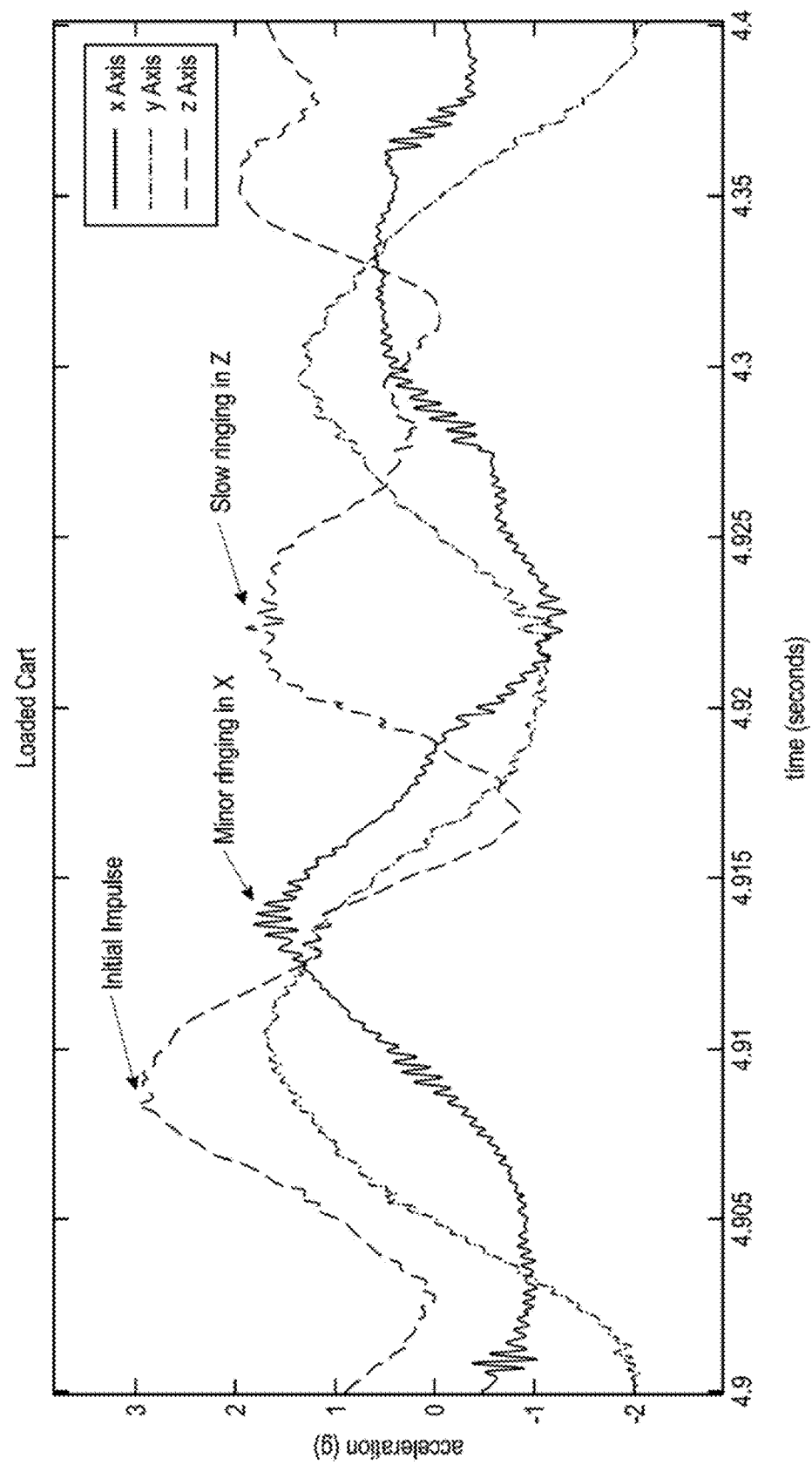
FIG. 21B shows an example output of a time domain three axis acceleration of a loaded steel framed shopping cart.

FIG. 21A shows an example of a time domain three axis acceleration of an unloaded steel framed 53 pound shopping cart (Model M90Z from Unarco Industries (Wagoner, Okla.)) going over a tile joint at a speed of about 1.0 meters/sec. The data was measured using the same experimental setup as for the data in FIG. 11B. After an initial impulse, the cart experiences significant ringing along the X-axis and fast ringing along the Z-axis (at substantially the same time).

FIG. 21B shows an example of the time domain three axis acceleration of the same cart as in FIG. 21A, but with a 5 kg load in the front of the basket going over the same tile joint at the same speed. After an initial impulse, the cart experiences minor ringing along the X-axis and slow ringing along the Z-axis.

In comparing the vibration signatures shown in FIG. 21A and FIG. 21B, significant ringing in the X-axis acceleration occurs in the unloaded cart shortly after (e.g., about 1 to 3 ms) the Z-axis impulse from the wheel dropping into a joint, compared with the much lower degree of X-axis ringing in the loaded cart. For example, the amplitude of the X-axis ringing in the unloaded cart is about 2-3 g's initially (e.g., decaying over several milliseconds), and the ringing occurs with a period of a fraction of a millisecond (frequency of 1-2 kHz). In contrast, the loaded cart has minor ringing in the X-axis with an initial amplitude of less than about 0.5 g (e.g., 4 to 6 times lower amplitude than unloaded cart). Thus, some embodiments, analyze vibration sensor data to find a vibration signature in the X-axis data and determine whether the cart is loaded or unloaded from the X-axis vibration signature. For example, the vibration signature of an unloaded cart may comprise an X-axis vibration having a frequency greater than about 1 kHz (up to about 5 kHz) and an amplitude greater than about 1 g (or greater than 2 g or greater than 3 g). The vibration signature of a loaded cart may comprise an X-axis vibration having a frequency greater than about 1 kHz (up to about 5 kHz) and an amplitude less than about 0.5 g (or less than about 0.2 g). The X-axis vibration signature of a loaded or unloaded cart may occur a time period of about 1 ms to about 5 ms (or 1 ms to 10 ms) after a Z-axis impulse (in a range from about 0.5 g to about 3 g that lasts for a period of less than about 10 ms) is measured. Thus, in some embodiments, the magnitude of the X-axis acceleration of an unloaded cart is above a vibration threshold (e.g., about 1 g) and the magnitude of the X-axis acceleration of a loaded cart is below the vibration threshold.

Given the large variation in shopping cart mechanical designs, other specific vibration signatures may characterize loaded and unloaded carts, and variations can occur in the signatures. However, the data shown in FIGS. 21A and 21B suggests that for common cart designs, the ringing signature between a loaded and unloaded cart is easily detectable from the vibration sensor data. For example, carts with plastic (e.g., ABS or ABS-polycarbonate blends) baskets (and a metal frame) are expected to ring less than a cart with a metal basket (and a metal frame), because the coupling of the initial impulse from the tile joint into the frame leads to a coupling (e.g., metal to plastic) which is diffuse (e.g., multiple mechanical points of contact with randomly distributed phase) and somewhat absorptive. Two level basket carts are expected to have two natural ringing frequencies, one for each basket.

Accordingly, analysis of the vibration sensor data can determine whether the cart is loaded (or not), where a load can be a few kg or greater. Other cart signatures can be used (additionally or alternatively) to determine whether a cart is loaded or unloaded. For example, the velocity signature of a cart can depend on cart load. A shopper pushing an unloaded cart can get the cart up to a typical speed more easily than a loaded cart (with increased mass that needs to be accelerated by the shopper). By examining shopper usage statistics, typical acceleration/deceleration times, speeds, human-propelled forces on carts, distances for loaded versus unloaded carts can be determined and compared to the corresponding measured value (in a particular situation) to determine whether or not the cart is loaded or unloaded. As an example, shopper usage statistics can be used to establish that a typical human shopper can apply a certain amount of force to propel a cart to reach a typical terminal cart speed (e.g., similar to walking speed). Assuming the human force, F, and the terminal cart speed, v, are approximately the same whether the cart is loaded and unloaded, an estimate for cart mass M is M=(F/v) t, where t is the measured time to reach the terminal speed (from rest). With the ratio (F/v) being roughly independent of whether the cart is unloaded or loaded, measurements of the time t can be used to infer an approximate mass M of the cart or at least whether the cart is likely to be loaded or unloaded.

Additionally or alternatively, a characteristic initial acceleration $a_0$ of an unloaded cart associated with a specific shopper may be determined as follows. From an initial state where the cart is inferred to be probably empty, e.g., from entering the store from outside, or from the cart having been at rest for a specific time, e.g. one hour, or in a location known to typically contain only empty carts such as a cart corral, an initial unloaded acceleration $a_0$ may be measured from the first forward motion of the cart from, preferably from an indoor stop.

The acceleration $a_0$ can be measured from rest to a specific cart velocity $v_0$ which is less than a typical terminal cart velocity, e.g. 0.5 m/sec. The acceleration can be determined as $a_0=v_0/t$, where t is the time from rest to the terminal velocity. From observations of shoppers starting up loaded carts, it has been observed that the acceleration of a loaded cart is typically much less (e.g., less than 75%, 50%, 25%, etc.) than the acceleration of an unloaded cart towards the beginning of the acceleration process. In some cases, the shopper may "lean into" a loaded cart to get it to move faster, which may increase the acceleration. Accordingly, measurement of $a_0$ (particularly early in the acceleration process) can provide a clear signature of whether the cart is loaded or unloaded.

In some implementations, at each start from an indoor stop, the average acceleration a can be compared to a specific $a_0$ associated with the cart/shopper combination, and if a is substantially less than $a_0$, e.g. less than 75%, or 50%, or 25%, of $a_0$, then the cart is provisionally inferred to be loaded. The initial accelerations of unloaded carts may be different in the forward and backward direction. Also, decelerations may be different for loaded and unloaded carts, in particular, an average deceleration d from $v_0$ to rest can be much greater in magnitude (e.g., greater than 125%, 150%, 175%, etc.) with loaded carts than with unloaded carts, because a shopper may instinctively rotate backward toward the cart as it slows.

As described above, in response to determining whether or not the cart is loaded, the cart exit detection logic (e.g., beginning at block 604 of FIG. 6) may modify the lock sequence (e.g., block 652), for example, by locking the wheel for loaded carts but not for unloaded carts, actuating a surveillance imaging system (in addition to or as an alternative to locking a cart wheel), etc.

e. Multi-Level Navigation (3-D Navigation)

It can be advantageous to determine and use the present altitude of a cart. For example, the cart may operate in a multi-floor structure, where different floors have different shopping cart containment boundaries (e.g., boundary 118 of FIG. 1), payment points (e.g., checkout lanes as previously described or as described in U.S. Pat. No. 8,463,540), floor maps, aisles, magnetic field configurations, access permissions (e.g., shoppers may be permitted to take carts to parking levels but not to residential or office levels of the structure), etc. Accordingly, different cart containment logic can be used for different levels of a structure. For example, a configuration file of the containment system can include a multi-level map of the structure (similar to the ground-plan 1400 described with reference to FIG. 14).

The multi-level maps can be include information on a plurality of surfaces, e.g. floors of a building and can include with ramps, escalators, elevators, or other vertical transportation paths between the different floors. Ground plans such as ground plan 1400 of FIG. 14 can be provided for multiple floors in the multi-level structure and access permissions can depend on, e.g., the floor, the transportation path (e.g., a cart may be permitted in an elevator but not on an escalator), etc.

A variety of vertical position detectors can be used to determine the vertical position of the cart. The vertical position detector can be part of the smart positioning system 210 as shown in FIG. 3. Examples of vertical position detectors include barometric pressure sensors, altimeters, accelerometers, beacons, etc. In some embodiments, a cart can include a vertical position detector 337 (shown in FIG. 3) such as a barometric pressure sensor (e.g., an MPL3115A2 from NXP (Eindhoven, the Netherlands)), which can be used to determine altitude (or change in altitude) of the cart. Pressure sensors can have a differential accuracy on the order of 10 cm. One or more barometric pressure sensors at fixed reference points (e.g., at the front door of the first floor, an elevator door of other floors, top and/or bottom of an escalator, etc.) can provided a temperature-compensated reference pressure. The reference pressure can be communicated to a processor in the cart, which can compare a barometric reading from a barometric pressure sensor on the cart to the reference pressure to determine the altitude of the cart relative to the altitude of the reference pressure.

In some embodiments, a cart can include an accelerometer (e.g., the accelerometer 410 of FIG. 4). A vertical acceleration indicated by the accelerometer can be used to determine vertical travel in a variety of cases. For example, in a first case, when a cart is moving both vertically and horizontally such as on an inclined ramp between floors, the vertical component of the cart's acceleration can be integrated (twice, from acceleration, to speed, to displacement) to yield a vertical displacement. In a second case, a cart's travel in an elevator can be inferred from the combination of significant, relatively smooth vertical acceleration (with a magnitude of typically a few hundredths to a few tenths of a g) for a few seconds followed by a smooth deceleration (having an opposite sign as compared to the vertical acceleration and a comparable magnitude), with little or no detection of rotation or lateral movement (in directions perpendicular to the vertical direction). A vertical acceleration time series can be integrated to yield nominal vertical travel that can be matched to the closest floor altitude. By assuming that the elevator stops on a defined floor, any integration error can usually be ignored and the barometer can be recalibrated to the known altitude of the floor.

In some embodiments, markers can be used to determine the vertical position of a cart. Some buildings have a shopping cart conveyor system such as the Cartveyor™ from Pflow Industries (Milwaukee, Wis.) to move carts between floors. Such conveyors are also known as travelators. Such conveyors usually inhibit the cart wheels from rolling or rotating while the cart is in the conveyor. These conveyors have an entrance and an exit. These entrances and exits can be included in the installation map (see, e.g., the ground plan 1400, which can be adapted to represent one or more floors other than a ground level in a structure). The smart positioning system can determine that the cart is in such a conveyor by the combination of a dead reckoned position close to one of the entrances to the conveyor followed by both vibration (from the conveyor) and substantial absence of wheel rotation. In some embodiments, specific location beacons (e.g., the RF beacon 395 in FIG. 3) and/or entry/exit markers (e.g., as the fixed feature 385 in FIG. 3) can be used to signal in the configuration file (e.g., such as Table 1) indicating which floor those beacons and/or markers are located on.

f. Multi-Level Magnetic Measurements

A multi-level magnetic field map can be used to determine the location of a cart. The magnetic field map can be generated, for example, by using a magnetometer to record the magnetic signatures of an area such as inside retail store 110 of FIG. 1 or in a parking lot. This can include, for example, down the various aisles of a retail store. As described above, some embodiments of the navigation system can use correction vectors to compensate for distortions in the geomagnetic field caused by metal or magnetic structures inside a building. The correction vectors can compensate at least partially for horizontally or vertically stratified magnetic anomalies in the store.

In some embodiments, carts can use multiple magnetometers (e.g., 2, 3, 4, 6, or more) to improve magnetic navigation accuracy. Magnetometers can be used to detect a magnetic field that matches with a magnetic field for a particular location on a magnetic field map. Magnetometers can also be used to determine the directional heading of a cart, which can be used for dead reckoning. Since the magnetometers are typically fixed to a frame of a cart at a particular height above the ground or at a fixed (or rotating) position inside a wheel of the cart, the magnetometers can provide information about the magnetic field at the corresponding heights inside the structure. Thus, the multiple magnetometers provide information on vertical stratification of the magnetic field at different heights above the floor level, and as the cart is moved horizontally around the structure, the magnetometers detect the horizontal stratification of the magnetic field. The navigation system can store information on the magnetic signature of the structure (e.g., locally in the smart positioning system or in a memory in a remote computing, base station).

In some embodiments, the cart includes two (or more) smart positioning systems 210 that communicate with each other (via wired or wireless techniques), and each contains a magnetometer coupled rigidly to the cart frame. For example, one magnetometer can be mounted to a cart handle (e.g., handle 1610 of FIG. 16) and a second magnetometer can be mounted to the front rail of the basket of the cart.

In some embodiments, a single smart positioning system 210 is mounted to the cart, such as on the handle, basket, etc. In addition, one or more magnetometers can be included in one or more of the wheels or casters. The wheel-mounted magnetometers could be part of a smart locking wheel such as smart locking wheel 215 of FIG. 2, or part of a standalone magnetometer component containing at least a magnetometer associated with a processor, communication link, and power source (but without the locking mechanism).

An implementation of such a wheel could include a KMX62 6-axis magnetometer/accelerometer from Rohm Kionix (Kyoto, Japan), a MKW31Z MCU with 2.4 GHz transceiver from NXP (Eindhoven, the Netherlands), and a battery, molded inside a wheel and configured to rotate with the wheel. The accelerometer function of the KMX62 can be used to infer the present angular position of the magnetometer, so that the magnetometer output can be transformed to the local horizontal reference frame. Such a rotating magnetometer samples the local magnetic field over a range of heights corresponding to the diameter of its circular path.

For extra accuracy, a cart can (optionally) have multiple magnetometers at different locations in the cart body and magnetometers in one or more wheels or casters. The one or more wheels or casters can include a communication system to communicate magnetometer measurements to the smart positioning system such as smart positioning system 210 of FIG. 3.

Magnetometer navigation can be used with dead reckoning navigation (or other navigation systems (e.g., with lighting signatures)) both indoors or outdoors. For example, dead reckoning systems may be primarily relied upon when the geomagnetic field is significantly distorted. The geomagnetic field can be significantly distorted, for example, at outdoor positions near a building. Medium sized buildings can have a distorted geomagnetic field within about 3 meters outside of the building, and larger buildings made with more metal can distort the geomagnetic field for up to 10 meters or farther. However, without significant geomagnetic distortions, a magnetometer can be calibrated within about 0.3 degrees or less than 1 degree, and magnetometer navigation can be accurate within about 1 or 2 degrees of heading error. In other cases without significant geomagnetic distortions, magnetometer calibration and magnetometer navigation can achieve varying levels of accuracy based on other factors such as component design, temperature, etc.

The magnetic field map can be a multi-layer map. The different layers can be recorded at the different levels at which magnetometer on a navigating cart might be positioned. For example, a first magnetic field map level may include a magnetic signatures at 2-3 inches off the ground of a first floor if magnetometers are located a 2-3 inches off the ground in a wheel of a cart. As another example, a second magnetic field map level may include magnetic signatures at 3 or 4 feet off the ground of a first floor at the height of a magnetometer located on the handles of a cart. Additional magnetic field map level may be made for the basement, second, third, and additional levels of a building. An additional magnetic field map can be recorded for transitional areas between levels, such as along cart escalators or inside of elevators. The magnetic field map can be included in a floor plan 1400 or site configuration file.

As described herein, the multi-level magnetic field map can include magnetic signatures at various heights for different locations, and the dead reckoning system can be configured to set its position to a location in the magnetic field map upon detecting a magnetic signature corresponding to the location.

A location determined based on a mapped magnetic signature can be used in conjunction with one or more other navigation systems. For example, a dead reckoning system can be used to determine that a cart is at a first location, and a second location based a mapped magnetic signature can be used to confirm the accuracy of the first location.

In some embodiments, each navigation system determines a location and a confidence level that the cart is at the location. For example, a dead reckoning system can be used to determine that a cart is at a first location with 90% confidence, and a second location is determined with 90% confidence based a mapped magnetic signature. If the first and second locations match, the confidence level can increase to a number greater than 90% (e.g., 95% or 100%). Thus, the location of the cart can be determined as a combination of the first location and the second location, optionally weighted by the confidences. If the first and second locations do not match, then in some embodiments, a third location between the first and second locations (e.g., a (weighted) average of the first and second locations) can be determined with a lower confidence. If the first and second locations do not match, then in some embodiments, a first navigation system can backtrack and recalculate a result using data from the second navigation system. In some embodiments, if the confidence of a position falls below a threshold value, then additional navigational systems can be used to increase the confidence level, such as by expending additional power to turn on and use a gyroscope. Examples of backtracking are described with reference to FIG. 22.

The magnetic fingerprint of an area can change. For example, metal shelving can be rearranged in a store, which can affect the magnetic fingerprint detected by a magnetometer. The magnetic fingerprint and navigation history data can be transmitted to a computer that can analyze the magnetic fingerprints collected along a cart path and detect changes in the fingerprint. New magnetic field maps can be generated, communicated to the carts (e.g., from a remote base station), and stored in the memory of a cart. The magnetic field map data over time (magnetic history) can be analyzed to learn magnetic signatures in the structure using various machine learning, artificial intelligence, or neural networks.

g. Navigation Using Lighting Signatures

In addition or as an alternative to the magnetic and RF signatures described elsewhere, signatures of light sources in known locations can be used to assist in determining the location or directional heading of a cart. Measurement of light signatures can be used as to supplement dead reckoning location information. One example of fixed light sources in known locations includes lights located inside of a building (e.g., overhead fluorescent lights in a store). Another example includes lights in a parking lot, which may be turned on at night. Data including a map or locations of light sources and the characteristics of the light sources can be provided to a smart positioning system such as smart positioning system 210 of FIG. 3. The map or locations of light sources (and optionally their properties such as heights above the plane of the light detector, optical power, or angular dependence of optical power) may be part of a floor plan 1400 or included in a site configuration file (see, e.g., Table 1) for the environment in which the cart is located. The floor plan 1400 or the site configuration file can be stored in non-transitory memory in the smart positioning system.

Figure 19:
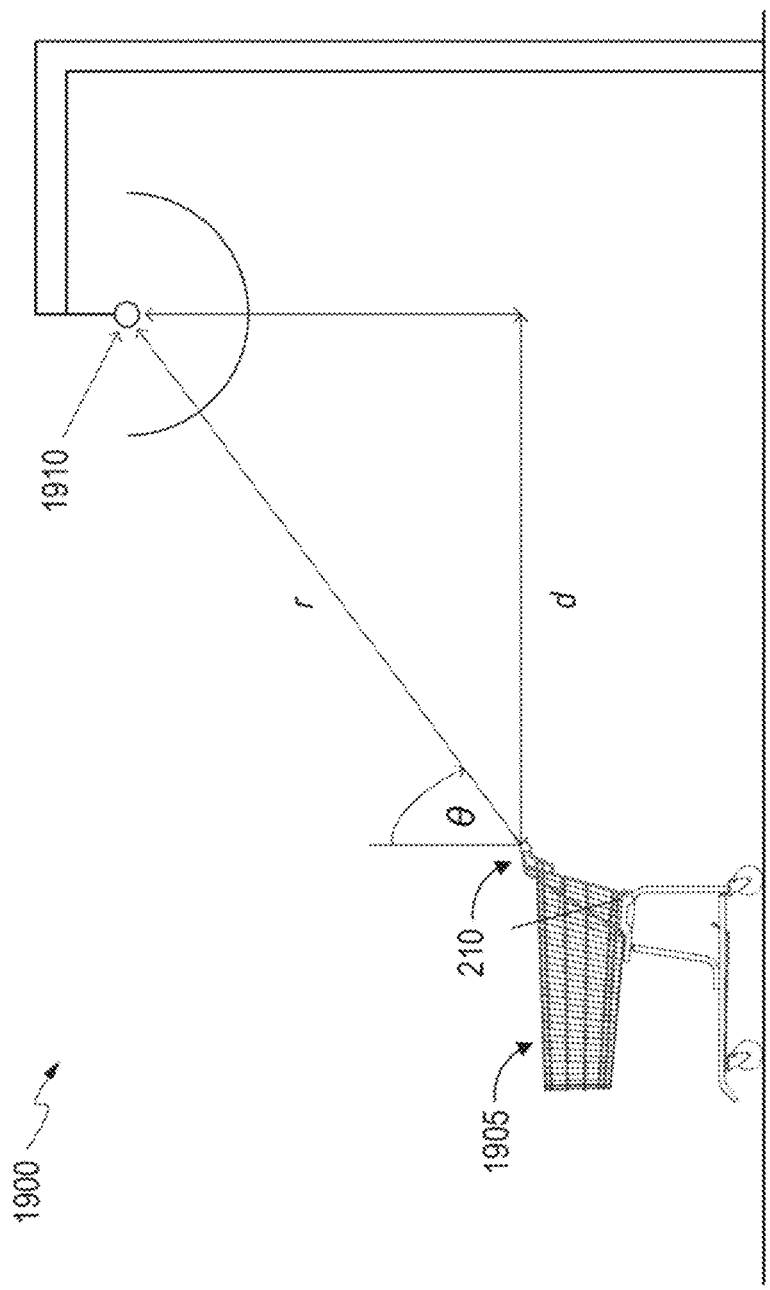
FIG. 19 shows an example system of a cart navigating outdoors using lighting signatures.

FIG. 19 shows an example system 1900 of a cart navigating outdoors using lighting signatures. In FIG. 19, light emitted from a point light source 1910 such as a parking lot light reaches a cart 1905. The cart 1905 is separated from the point light source by radial distance r, including components of horizontal distance d and vertical distance h. A polar angle θ is also shown in FIG. 19 (measured from the upward, vertical direction).

The cart 1905 can include an opaque housing around a photosensor and a light pipe positioned as an aperture through the opaque covering such that the photosensor is configured to detect ambient light passing through the light pipe. The housing, photosensor, and light pipe can be used as a light detector 333 in the smart positioning system 210 shown in FIG. 3. For example, the light pipe (e.g., a light transmissive material such as polycarbonate) can be formed in a surface of the smart positioning system 1605 shown in FIG. 16 and direct light to a photosensor included on a PCBA 1705 inside the system.

An example light source 1910 is mounted at a height h above the plane of the horizontal light pipe aperture at a horizontal distance of d and therefore radial distance r=$\sqrt{h^2+d^2}$. The example light source uniformly emits light in a downward hemisphere such that the irradiance $E_e$ associated with the light source is independent of polar angle θ and azimuth φ0 (e.g., coming out of the page in FIG. 19) for angles of interest. To better aid an understanding of the concepts, the example in FIG. 19 shows no other light sources contribute significantly to the optical flux through the light pipe aperture, and all other sources combined contribute less than a few percent points (e.g., 1%, 3%, 5%) of the flux through the light pipe aperture. The optical power P received through aperture A is $$P = P_0 \frac{A}{2\pi r^2} \cos\theta \qquad (2)$$

where $P_0$ is the total optical power of the source. The optical power P received at the light pipe aperture can be measured with a photosensor such as the APDS-9008 from Broadcom, Limited (San Jose, Calif.).

In the following example, the coordinates of the cart are measured in an $X_L$, $Y_L$ Cartesian coordinate system, which is fixed in the store (see FIG. 20, with $Y_L$ parallel to the aisle and $X_L$ perpendicular to the aisle). These coordinates are different from the cart-centered Cartesian coordinates described herein that may be used by the smart positioning system to perform dead reckoning position estimates.

An example cart 1915 starts from a position $x_1,y_1$ (in the store-centered coordinate system) where the received optical power is $P_1$, and a dead reckoning system estimated position of the cart 1915 at $\widehat{x_1},\widehat{y_1}$. As the cart 1915 travels to a second position $x_2,y_2$, the dead reckoning system determines that the cart 1915 travels in an estimated direction ρ for distance d, to a point $\widehat{x_2},\widehat{y_2}$. At the second position $x_2,y_2$, the received optical power is $P_2$.

In some cases, the errors in ρ and d can be small relative to the accumulated dead reckoning error included in $\widehat{x_1},\widehat{y_1}$, and navigation using lighting signatures can be more accurate than dead reckoning without lighting signatures. The most probable true starting location can be determined by reducing or minimizing the error term by finding $\in_x$ and $\in_y$ in equation 3 that reduces or minimizes the error term in equation 4, subject to the constraint in equation 5.

$$\in_x = x_1 - \widehat{x_1} \text{ and } \in_y = y_1 - \widehat{y_1} \qquad (3)$$

$$P_1(x_1^2+y_1^2)^{3/2} - P_2(x_2^2+y_2^2)^{3/2} \qquad (4)$$

$$x_2 = x_1 + d\cos\rho \text{ and } y_2 = y_1 + d\sin\rho \qquad (5)$$

The error term can be reduced or minimized by solving equations 3-5 analytically or using numerical optimization methods (e.g., linear or nonlinear programming, least squares, Newton's method, gradient descent, etc.).

As discussed, some embodiments can use numerical minimization methods in addition to or instead of analytical methods. In some cases, numerical minimization methods such as gradient descent can be more resilient against errors in measurements. The gradient descent method can be used when the light source output is not independent of polar angle θ and azimuth φ, as long as the functions $f1(\theta)$ and $f2(\varphi)$ which give the angular dependence according to equation 4 are known numerically and are single peaked over the range of angles of interest, where the received optical power is:

$$P = P_0 \frac{A}{2\pi r^2} \cos\theta f1(\theta) f2(\varphi). \qquad (6)$$

Given a set of point light sources at known x-y locations, heights of the light sources (e.g., above the plane of the light detector or above the floor), optical power, or angular dependence of optical power, a starting point and optical power measured at various points along a path traveled by a cart can be used to find the absolute location of the cart at a point in that path by reducing or minimizing a total error function, again by means of an optimization algorithm such as gradient descent. The weights of individual terms in the error function to be reduced or minimized can depend on the accuracy of the individual light sources locations, optical power, and angular dependencies of optical power.

Additional checking of the time history of the photosensor output may be valuable to confirm that the path from the light source to the light pipe aperture was not blocked, e.g., the time rate of change of the photosensor output should be consistent with the known velocity or direction of motion of the cart. Deviations from such consistency can be determined and data acquired during the inconsistency can be omitted or weighted less heavily in the optimization calculations.

These types of calculations can be performed by the processor and memory 325 in FIG. 3. However, processing these types of calculations can use a large amount of energy.

It may be desirable to perform the computation at an offboard computing system (e.g., a base station), with the smart position system communicating raw or preprocessed measurements via the communication system 330 of FIG. 3 and then receiving an updated position estimate. These types of calculations can also be performed when the rotation of one or more wheels indicates motion, and the processor can stop performing such calculations when rotation of wheels indicates that the cart is at rest.

Figure 20:
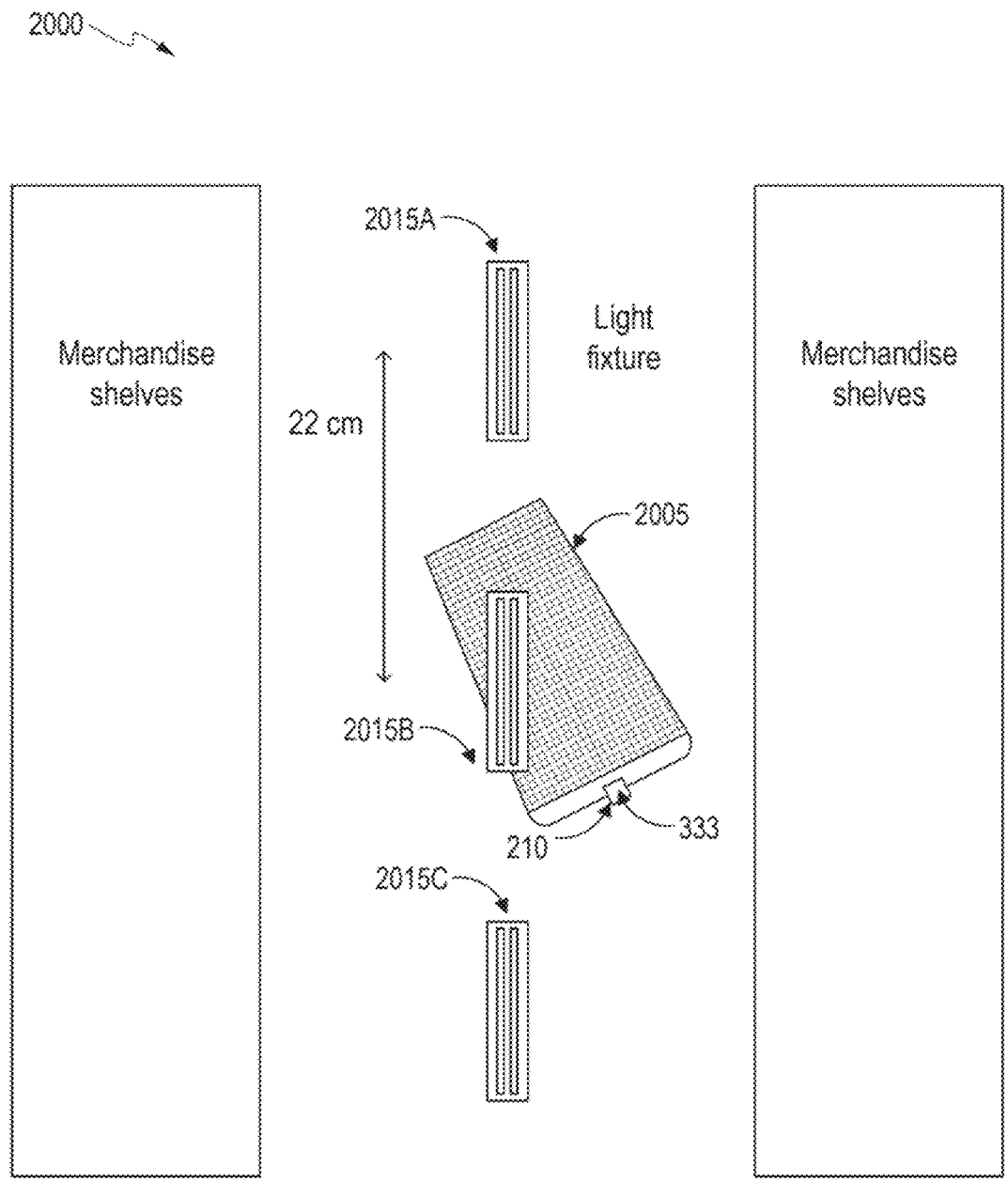
FIG. 20 shows an example system of a shopping cart navigating indoors using (at least in part) lighting signatures.

FIG. 20 shows an example system 2000 of a shopping cart 2005 navigating indoors using lighting signatures. The shopping cart 2005 includes a smart positioning system 210 (e.g., as described with respect to FIG. 2 and FIG. 3). The smart positioning system 210 includes a light detector 333 comprising a light pipe aperture and a photosensor. The cart moves inside an example grocery store that includes light fixtures 2015A, 2015B, 2015C, such as fluorescent or LED light tubes. The example light fixtures in this example include two tubes in parallel with a small separation (e.g., less than 10 cm), mounted above and parallel to the axis of each aisle. Merchandise shelves line the sides of the aisle. In some embodiments, the light pipe aperture may be in a range from about 1 mm$^2$ to 100 mm$^2$ to acquire light for a sufficient photosensor signal. FIG. 20 illustrates three lighting fixtures, such as model P7137-30STR from Progress Commercial Lighting (Greenville, S.C.) each containing two 17 W T8 fluorescent tubes, with centers spaced 122 cm (48 inches) apart located at a height 2 meters above the light pipe aperture.

A shopping cart's motion passing under one of these fixtures can produce a peak in the photosensor output as the photosensor of the cart passes under the centerline of the fixture, independent of the crossing angle. The peak may be relatively sharp. It is expected that the peak sharpness as function of the aperture $X_L$ coordinate will be independent of the crossing angle, although the sharpness of the peak may generally decrease somewhat as a function of increasing distance of the centerline crossing in the $Y_L$ coordinate (e.g., the farther away the aperture is from the center of the lighting fixture at the time the aperture crosses the centerline that runs down the middle of the string of three fixtures). The degree of "blurring" of the peak may depend on the specific characteristics of the lighting fixtures (for example, fluorescent tubes versus LED tubes of equal nominal luminosity), and indeed in some cases there may be no detectable broadening of the peak with significant off-center crossings. The reliable feature of the lighting signature is the presence of the peak.

Note that if the photosensor is sampled a rate that is high relative to the horizontal crossing speed, for example greater than about 100 samples per second with a crossing speed of one meter/second, it is sometimes possible for two separate peaks to be resolved, the first peak as the aperture passes directly under the first tube of the dual tube fixture, and the second peak as the aperture passes directly under the second tube of the dual tube fixture. Since the tube centers are typically much less than ten centimeters apart, only a very high sampling rate will resolve the double peak.

h. Multi-Navigation System Synergy

The combined use of multiple navigation systems can yield synergies beyond the sum of the individual parts. As one example of synergy, one navigation system can be used to determine if another navigation system is not functioning correctly, and the functional navigation system can be used. For instance, a dead reckoning system can be used in conjunction with a navigation using lighting signatures to determine if the photosensor is blocked. If the dead reckoning system determines movement while no lighting changes are detected by the photosensor, this can indicate that the photosensor and/or the light pipe is covered, turned off, or malfunctioning. The time rate of change of the photosensor output should be consistent with the known velocity and direction of motion of the cart. Different navigation systems can determine location, heading, and speed, and minor discrepancies between different systems can be weight averaged based on known error rates to determine an average estimated location, heading and speed. Larger discrepancies can indicate that a navigation system is not working properly, such as if the light pipe was covered for a period of time, and when discrepant navigation system resumes working, it can use the latest position, speed, and directional information from a different navigation system to begin navigating again.

Figure 23:
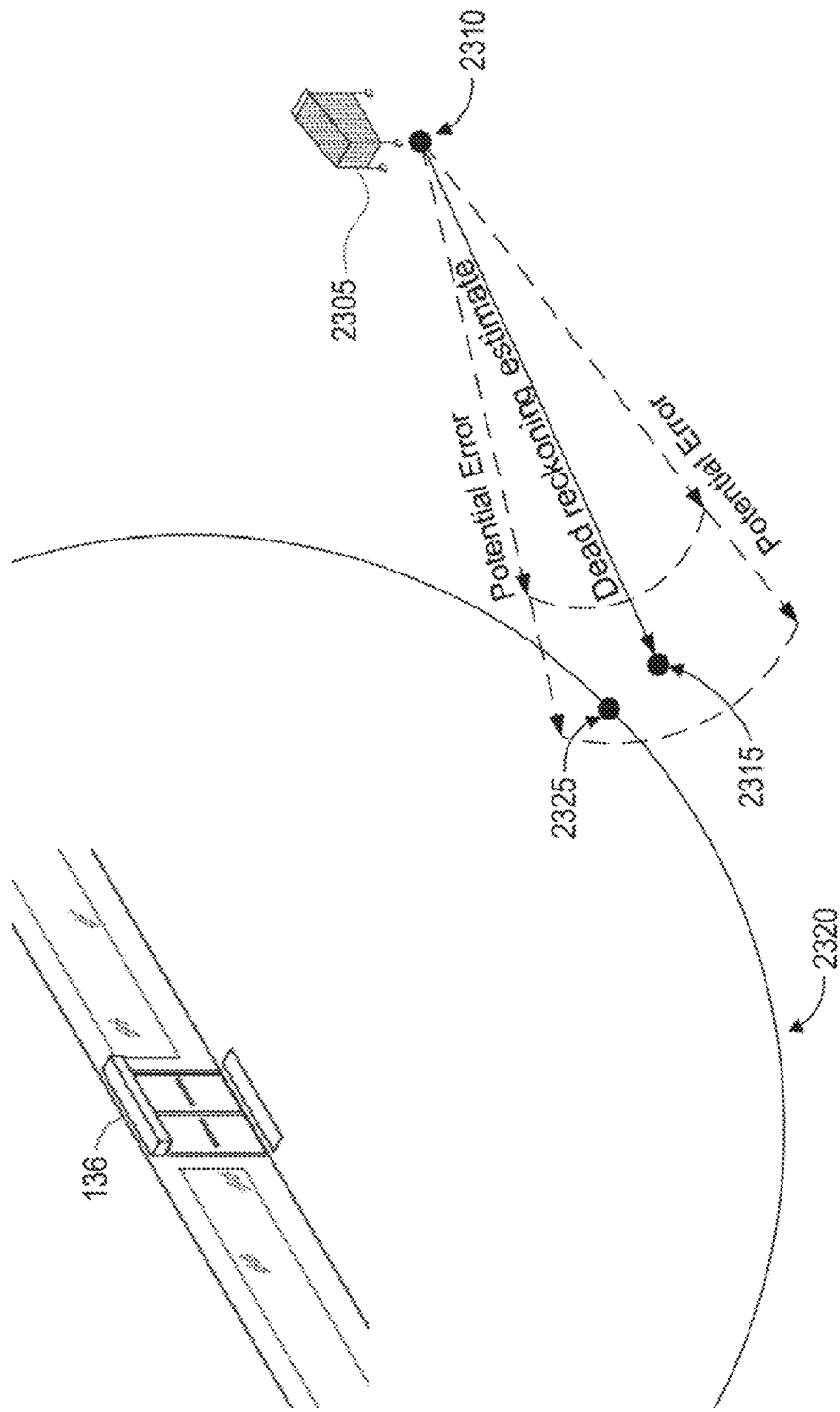
FIG. 23 shows an example of a system where multiple navigation systems synergize.

FIG. 23 shows another example of synergy where multiple navigation systems can be used to determine a more accurate location of a cart with an improved confidence. A cart 2305 can use both a dead reckoning navigation system and RSSI as discussed in the section entitled RSSI-Aided Dead Reckoning.

A cart 2305 starts a first location 2310. The dead reckoning system estimates that the cart moves to a second location 2315. However, the dead reckoning system may accumulate errors at a known rate such that a first confidence level in the second location can be relatively low (50% confidence, confident within 4 meters, etc.). Different embodiments may use different confidence systems.

An access point 136, such as previously described with respect to FIG. 13, may broadcast a signal to the cart 2305. Based on RSSI calculations, the cart can determine that it is located on an arc at a fixed radial distance 2320 away from the access point 136 with a second level of confidence.

Based on the combined information from the dead reckoning system, it can be determined that the cart is somewhere on or between the estimated location 2315 and the arc 2320. For example, the data can be combined to determine that the cart 2305 is at location 2325. Furthermore, the confidence level that the cart is at location 2325 can be higher than the first confidence level and/or higher than the second confidence level. For example, the navigation system can determine that the cart 2305 is at location 2325 with a 90% confidence level or within +/−1 meter.

Some functionality, such as activating the brakes on a shopping cart when shoplifting is suspected, can be performed when a minimum confidence threshold of positions is determined.

Although FIG. 23 is described with respect to dead reckoning and RSSI, it will be understood that the concepts can be applied to other combinations of navigation systems.

ADDITIONAL ASPECTS

Any of the navigation system functionalities can be used with any of the other functionalities described herein. For example, any of the techniques for using navigation history and backtracking, dual swivel castors, gyroscopes, determining cart weight or whether the cart is loaded or unloaded, multi-level (3D) navigation, multi-level magnetic sensors, navigation with lighting signatures, RF data (e.g., RSSI), magnetometer data, or vibration data can be used alone or in any combination with each other or with other navigation (e.g., magnetic dead reckoning) or anti-theft techniques. For example, any of the elements of any of the following aspects can be combined with any of the other aspects. All possible combinations and subcombinations of aspects 1-108 are contemplated herein.

In a 1st aspect, a navigation system for a wheeled object, the navigation system comprising: a vibration sensor; and a hardware processor programmed with executable instructions to analyze vibration data from the vibration sensor to determine a rotation rate of a wheel of the wheeled object.

In a 2nd aspect, the navigation system of aspect 1, wherein the hardware processor is programmed to analyze a spectrum of the vibration data.

In a 3rd aspect, the navigation system of aspect 2, wherein the hardware processor is programmed to identify a first peak in the spectrum, the peak associated with vibration data for vibrations in a forward or rearward direction of the wheeled object.

In a 4th aspect, the navigation system of aspect 3, wherein the hardware processor is programmed to determine the rotation rate of the wheel to be a harmonic frequency of the frequency of the first peak.

In a 5th aspect, the navigation system of aspect 4, wherein the hardware processor is programmed to validate the determined rotation rate by analyzing the spectrum for presence of a second peak at a harmonic frequency of the first peak.

In a 6th aspect, the navigation system of aspect 5, wherein the hardware processor is programmed to analyze the spectrum for presence of the second peak at a first odd harmonic frequency of the first peak.

In a 7th aspect, the navigation system of any of aspects 1 to 6, wherein the hardware processor is programmed to estimate a forward or rearward speed of the wheeled object based on the determined wheel rotation rate and a circumference of the wheel.

In an 8th aspect, the navigation system of any one of aspects 1 to 7, wherein the navigation system is configured to receive information relating to a reference position and the hardware processor is programmed to reset the position of the wheeled object based at least in part on the reference position.

In a 9th aspect, the navigation system of any one of aspects 1 to 8, wherein the hardware processor is further programmed to count regular boundaries on a surface over which the wheeled object travels.

In a 10th aspect, the navigation system of aspect 9, wherein the hardware processor is programmed to analyze a time-domain series of the vibration data in a vertical axis.

In an 11th aspect, the navigation system of any one of aspects 1 to 10, wherein the hardware processor is programmed to apply a corrective mapping to the geomagnetic field to compensate for perturbations to the geomagnetic field due to presence of magnetic elements.

In a 12th aspect, the navigation system of any one of aspect 1 to 11, wherein the hardware processor is further programmed to dynamically change modes of the DR position estimation method based at least in part on the vibration data.

In a 13th aspect, the navigation system of any of aspects 1 to 12, wherein the wheeled object comprises a human-propelled cart.

In a 14th aspect, the navigation system of aspect 13, wherein the DR system is mounted to a handle of the cart.

In a 15th aspect, a navigation system for a human-propelled cart, the navigation system comprising: a magnetometer; an accelerometer; a vibration sensor; a communication system configured to communicate with a wheel of a human-propelled cart, the wheel comprising a brake configured to inhibit rotation of the wheel in response to receipt of a locking signal; and a hardware processor programmed to: estimate a speed of the human-propelled cart based at least in part on vibration data from the vibration sensor; and estimate a position of the human-propelled cart based at least in part on the estimated speed of the cart.

In a 16th aspect, the navigation system of aspect 15, wherein the hardware processor is programmed to determine, based at least in part on the estimated position, whether the cart has crossed a containment boundary, and in response to the determination, to communicate the locking signal to the wheel.

In a 17th aspect, the navigation system of aspect 15 or aspect 16, further comprising a detector configured to detect an entrance signal or an exit signal indicative of whether the cart is entering or exiting a store, respectively.

In an 18th aspect, the navigation system of aspect 17, wherein the detector determines whether the cart is entering or exiting a store through searching for a peak in a received signal strength indicator (RSSI) of the entrance signal or the exit signal.

In a 19th aspect, the navigation system of any one of aspects 15 to 18, further comprising an audible or visual indicator configured to provide a notification to a user of the cart.

In a 20th aspect, the navigation system of any one of aspects 15 to 19, wherein the cart comprises a handle and the navigation system is mounted to the handle.

In a 21st aspect, the navigation system of any one of aspects 15 to 20, wherein the accelerometer is the vibration sensor.

In a 22nd aspect, the navigation system of any one of the aspects 15 to 21, further comprising a temperature sensor.

In a 23rd aspect, the navigation system of aspect 22, wherein the temperature sensor is physically close to the magnetometer.

In a 24th aspect, the navigation system of any one of aspects 1 to 23, wherein the hardware processor is further programmed to receive site configuration data comprising information associated with one or more of: (1) a containment boundary, (2) an entrance or an exit, (3) an indoor area of the site, (4) an outdoor area of the site, (5) areas having a surface with a particular characteristic, (6) a geomagnetic field, (7) a correction to a geomagnetic field due to magnetic structures at or near the site, (8) a location of a reference position, or (9) a warning distance associated with a containment boundary.

In a 25th aspect, a navigation method for a wheeled object, the navigation method comprising: obtaining an initial position of the wheel object from a transmitter at a fixed, known position; obtaining a heading of the wheeled object from a magnetometer; obtaining a speed of the wheeled object through data from a wheel rotation counter, wherein the wheel rotation counter comprises a tuning fork and a striker; and estimating a current position of the wheeled object based at least in part on the initial position, the heading, and the speed.

In a 26th aspect, the method of aspect 25, further comprising: obtaining a heading of a castered wheel from a magnetometer; detecting caster chatter based, at least in part, on a comparison of the heading of the wheeled object and a heading of the castered wheel.

In a 27th aspect, the method of aspect 26, further comprising: omitting the current position step when speed data is associated with caster chatter.

In a 28th aspect, a navigation method for a wheeled object, the navigation method comprising: obtaining an initial position of the wheel object from a transmitter at a fixed, known position; obtaining a heading of the wheeled object from a magnetometer; obtaining a speed of the wheeled object through data from a vibration sensor; and estimating a current position of the wheeled object based at least in part on the initial position, the heading, and the speed.

In a 29th aspect, the navigation method of aspect 28, further comprising: measuring a temperature of the magnetometer using a temperature sensor; and compensating for a temperature effect on the magnetometer.

In a 30th aspect, the navigation method of aspect 29, wherein compensating for the temperature effect on the magnetometer comprises: measuring the magnetometer output at three or more temperature points after a printed circuit board assembly which contains the magnetometer is assembled; creating a calibration database containing the measurement data; and computing a temperature compensation factor based at least in part on polynomial interpolation of the calibration data based on the measured temperature.

In a 31st aspect, the navigation method of any of aspects 28 to 30, further comprising: compensating for an alignment change between a true magnetic field and a known geomagnetic field at the magnetometer.

In a 32nd aspect, the navigation method of aspect 31, wherein: an initial alignment between the true magnetic field and the known geomagnetic field at the magnetometer is obtained through spinning the wheeled object around a vertical axis at an outdoor location away from any large ferromagnetic objects; and a current alignment between the true magnetic and temperature field and the known geomagnetic field at the magnetometer is obtained through a sufficient number of adequately spread heading readings over a sufficiently short period of time; and compensating for the alignment change comprises: comparing the current alignment with the initial alignment; replacing, if the initial alignment and the current alignment are significantly different, the initial alignment with the current alignment; and computing the heading of the wheeled object based, at least in part, on the initial alignment or the current alignment.

In a 33rd aspect, the navigation method of aspect 32, wherein a sufficient number of adequately spread heading readings comprises: at least 10% to 15% of the readings are in each quadrant of four magnetic quadrants in the horizontal plane, and at least 25% of the readings are in two of the four magnetic quadrants.

In a 34th aspect, the navigation method of aspect 32 or aspect 33, wherein a sufficiently short period of time is 10 to 20 seconds.

In a 35th aspect, a system for detecting unauthorized shopping cart exits from a store, the system comprising: a dead reckoning system attached to a shopping cart, the dead reckoning system having access to a store layout in a site configuration file, the store layout including positions of an exit and a checkout station; a locking wheel attached to the shopping cart; wherein the dead reckoning system is configured to: estimate a position of the shopping cart at a plurality of time using dead reckoning; detecting an exit event of the shopping cart; determine, based at least in part on the position estimate, whether the shopping cart has passed through the checkout station before the exit event; and communicate, upon a determination that the shopping cart has not passed through the checkout station before the exit event, a locking command to the locking wheel; and wherein the locking wheel is configured to engage a locking mechanism upon receiving the locking command from the dead reckoning system.

In a 36th aspect, the system of aspect 35, wherein the store layout further includes a position of high-value merchandise area, and the dead reckoning system is configured to communicate the locking command upon a determination that the shopping cart has passed through the high-value merchandise area without passing through the checkout station before the exit event.

In a 37th aspect, the system of aspect 35 or aspect 36, wherein the dead reckoning system is further configured to communicate the locking command upon a determination that the shopping cart has passed through the checkout station without stopping before the exit event.

In a 38th aspect, the system of any of aspects 35 to 37, wherein the dead reckoning system is configured to estimate a speed of the shopping cart based at least in part on an analysis of vibration or vertical acceleration data of the shopping cart.

In a 39th aspect, the system of any of aspects 35 to 38, wherein the store layout further includes a magnetic field correction vector, and wherein the dead reckoning system is configured to correct a heading estimate using the magnetic field correction vector.

In a 40th aspect, the system of any of aspects 35 to 39, wherein the store layout further includes a magnetic field correction vector map, and wherein the dead reckoning system is configured to correct a heading estimate using the magnetic field correction vector map and a current position of the shopping cart.

In a 41st aspect, the system of any of aspects 35 to 40, wherein the dead reckoning system is configured to trigger an audio alarm in conjunction with sending a locking command to the locking wheel.

In a 42nd aspect, the system of any of aspects 35 to 41, wherein the store layout further includes a magnetic field map including locations in the store and magnetic signatures at the locations, and wherein the dead reckoning system is configured to set its position to a location in the magnetic field map upon detecting a magnetic signature corresponding to the location.

In a 43rd aspect, a navigation system for a human-propelled cart is provided. The navigation system comprises a magnetometer configured to determine a heading of the human-propelled cart; a vibration sensor configured to measure vibration data of the human-propelled cart; a communication system configured to communicate with a wheel of the human-propelled cart, the wheel comprising a brake configured to inhibit rotation of the wheel in response to receipt of a locking signal; and a hardware processor programmed to: estimate a speed of the human-propelled cart based at least in part on the vibration data from the vibration sensor; and estimate a position of the human-propelled cart based at least in part on the estimated speed and the heading of the human-propelled cart.

In a 44th aspect, the navigation system of aspect 43, wherein to estimate the speed of the human-propelled cart based at least in part on vibration data from the vibration sensor, the hardware processor is programmed to analyze a spectrum of the vibration data.

In a 45th aspect, the navigation system of aspect 44, wherein to analyze the spectrum of the vibration data, the hardware processor is programmed to identify a first peak in the spectrum of the vibration data, the first peak associated with vibration data for vibrations associated with forward or rearward movement of the human-propelled cart.

In a 46th aspect, the navigation system of aspect 45, wherein to estimate the speed of the human-propelled cart, the hardware processor is programmed to: determine a rotation rate of the wheel to be a harmonic frequency of the frequency of the first peak in the spectrum of the vibration data; and estimate the speed based on the rotation rate and a circumference of the wheel.

In a 47th aspect, the navigation system of aspect 46, wherein the hardware processor is programmed to validate the determined rotation rate by analyzing the vibration spectrum for presence of a second peak at a harmonic frequency of the first peak.

In a 48th aspect, the navigation system of aspect 47, wherein the hardware processor is programmed to analyze the spectrum for presence of the second peak at a first odd harmonic frequency of the first peak.

In a 49th aspect, the navigation system of any one of aspects 43 to 48, wherein the hardware processor is programmed to analyze the vibration data to count regular boundaries on a surface over which the human-propelled cart travels.

In a 50th aspect, the navigation system of any one of aspects 43 to 49, wherein the hardware processor is programmed to determine, based at least in part on the estimated position, whether the cart has crossed a containment boundary, and in response to the determination, to communicate the locking signal to the wheel.

In a 51st aspect, the navigation system of any one of aspects 43 to 50, further comprising a detector configured to detect an entrance signal or an exit signal indicative of whether the human-propelled cart is entering or exiting a store, respectively.

In a 52nd aspect, the navigation system of any one of aspects 43 to 51, further comprising a received signal strength indicator (RSSI) detector, wherein the hardware processor is programmed to update the estimated position of the cart based at least partly on a measured RSSI signal.

In a 53rd aspect, the navigation system of any one of aspects 43 to 52, further comprising a radio frequency (RF) receiver configured to receive an RF signal from an external RF transmitter, wherein the hardware processor is programmed to update the estimated position of the cart based at least partly on the received RF signal.

In a 54th aspect, the navigation system of aspect 53, wherein the hardware processor is programmed to estimate a distance to the external RF transmitter based at least partly on an RF phase difference estimated using the RF signal.

In a 55th aspect, the navigation system of any one of aspects 43 to 54, further comprising a temperature sensor configured to measure a temperature of the magnetometer, wherein the hardware processor is programmed to compensate for temperature sensitivity of the magnetometer based at least partly on temperature.

In a 56th aspect, the navigation system of any one of aspects 43 to 55, wherein the magnetometer is configured to provide a plurality of magnetic readings, and the hardware processor is programmed to calibrate the magnetometer based at least partly on the plurality of magnetic readings and a hard or soft iron calibration model.

In a 57th aspect, the navigation system of any one of aspects 43 to 56, wherein the hardware processor is further programmed to receive site configuration data comprising information associated with one or more of: (1) a containment boundary, (2) an entrance or an exit, (3) an indoor area of the site, (4) an outdoor area of the site, (5) areas having a surface with a particular characteristic, (6) a geomagnetic field, (7) a correction to a geomagnetic field due to magnetic structures at or near the site, (8) a location of a reference position, or (9) a warning distance associated with a containment boundary.

In a 58th aspect, the navigation system of any one of aspects 43 to 57, wherein the vibration sensor comprises an accelerometer.

In a 59th aspect, the navigation system of any one of aspects 43 to 58, wherein the human-propelled cart comprises a handle, and the navigation system is mounted to the handle.

In a 60th aspect, the navigation system of aspect 59, wherein the human-propelled cart comprises a shopping cart. In another aspect, a shopping cart comprising the navigation system of any one of aspects 43 to 60.

In a 61st aspect, a navigation method for a human-propelled wheeled cart is provided. The method comprises measuring, with a magnetometer, a magnetic heading of the human-propelled cart; measuring a spectrum of vibrations experienced by the human-propelled cart as it travels over a surface; analyzing the spectrum of vibrations to determine a rotation rate of a wheel of the human-propelled cart; estimating a speed of the human-propelled cart based at least partly on the rotation rate of the wheel and a circumference of the wheel; and estimating a position of the human-propelled cart based at least partly on the estimated speed and the measured magnetic heading of the human-propelled cart.

In a 62nd aspect, the navigation method of aspect 61, wherein analyzing the spectrum of vibrations comprises identifying a first peak in the spectrum of vibrations associated with forward or rearward movement of the human-propelled cart.

In a 63rd aspect, the navigation method of aspect 62, wherein the rotation rate of the wheel is determined to be a harmonic frequency of the frequency of the first peak in the spectrum of the vibration data.

In a 64th aspect, the navigation method of aspect 62 or aspect 63, further comprising validating the determined rotation rate by analyzing the spectrum of vibrations for presence of a second peak at a harmonic frequency of the first peak.

In a 65th aspect, the navigation method of any one of aspects 61 to 64, wherein analyzing the spectrum of vibrations comprises counting regular boundaries on the surface over which the human-propelled cart travels.

In a 66th aspect, the navigation method of any one of aspects 61 to 65, wherein the wheel comprises a brake configured to inhibit rotation of the wheel, the method further comprising: determining, based at least in part on the estimated position, whether the human-propelled cart has crossed a containment boundary; and in response to determining the cart has crossed the containment boundary, communicating a braking signal to actuate the brake in the wheel.

In a 67th aspect, the navigation method of any one of aspects 61 to 66, further comprising: measuring a temperature of the magnetometer; and compensating for temperature sensitivity of the magnetometer based at least partly on the measured temperature.

In a 68th aspect, the navigation method of any one of aspects 61 to 67, further comprising: measuring, with the magnetometer, a plurality of magnetic readings while the human-propelled cart is traveling over the surface; and calibrating the magnetometer based at least partly on the plurality of magnetic readings and a hard or soft iron calibration model.

In a 69th aspect, a human-propelled wheeled cart comprising a navigation system configured to perform the navigation method of any one of aspects 61 to 68.

In a 70th aspect, the human-propelled wheeled cart of aspects 69, wherein the navigation system is mounted on or included in a handle of the cart.

In a 71st aspect, the human-propelled wheeled cart of aspect 69 or aspect 70, wherein the cart comprises a shopping cart.

In a 72nd aspect, an anti-theft system for a human-propelled cart, the anti-theft system comprising: a vibration sensor configured to measure vibration data of the human-propelled cart; a communication system configured to communicate with a wheel of the human-propelled cart, the wheel comprising a brake system configured to inhibit rotation of the wheel in response to receipt of a locking signal; and a hardware processor programmed to: analyze the vibration data to determine the cart has received an impulse; analyze the vibration data to determine a vibration signature indicative of ringing of the cart in response to the impulse; estimate, based at least partly on the analysis of the vibration data, whether the cart is loaded or unloaded; determine whether the cart has crossed a confinement boundary; determine, based at least partly on the estimate of whether the cart is loaded or unloaded and whether the cart has crossed the confinement boundary, an anti-theft instruction to communicate to the brake system or to an external surveillance system; and communicate the instruction.

In a 73rd aspect, the anti-theft system of aspect 72, wherein the vibration sensor comprises an accelerometer.

In a 74th aspect, anti-theft system of aspect 72 or aspect 73, wherein to analyze the vibration data to determine the cart has received an impulse, the hardware processor is programmed to identify a vertical component of acceleration with magnitude exceeding 0.5 g and having a duration less than 10 ms.

In a 75th aspect, the anti-theft system of any one of aspects 72-74, wherein to analyze the vibration data to determine a vibration signature indicative of ringing of the cart in response to the impulse, the hardware processor is programmed to identify a horizontal component of acceleration having a frequency greater than 1 kHz that occurs within 10 ms of the impulse, the horizontal component in a direction of cart motion.

In a 76th aspect, the anti-theft system of any one of aspects 72-75, wherein to determine an estimate of whether the cart is loaded or unloaded, the hardware processor is programmed to determine whether a vibration signal in a direction of cart motion is above or below a threshold vibration amplitude.

In a 77th aspect, the anti-theft system of any one of aspects 72-76, wherein the anti-theft instruction comprises an instruction to actuate the brake system if the cart is estimated to be loaded.

In a 78th aspect, the anti-theft system of any one of aspects 72-77, wherein the anti-theft instruction comprises an instruction to actuate the brake system, wherein the instruction further comprises an indication of a speed or force at which the brake system is to be applied to slow the cart, and wherein the indication of the speed or force depends at least partly on the estimate of whether the cart is loaded or unloaded.

In a 79th aspect, the anti-theft system of any one of aspects 72-78, wherein the anti-theft instruction comprises an instruction to not actuate the brake system if the cart is estimated to be unloaded.

In an 80th aspect, the anti-theft system of any one of aspects 72-79, wherein the anti-theft instruction comprises an instruction to actuate the external surveillance system if the cart is estimated to be loaded.

In an 81st aspect, the anti-theft system of any one of aspects 72-80, further comprising a navigation system configured to determine a location of the cart.

In an 82nd aspect, the anti-theft system of aspect 81, wherein the navigation system comprises: a magnetometer configured to determine a heading of the cart, wherein the hardware processor is further programmed to: estimate a speed of the cart based at least in part on the vibration data from the vibration sensor; and estimate a location of the cart based at least in part on the estimated speed and the heading of the cart.

In an 83rd aspect, the anti-theft system of aspect 82, wherein to estimate the speed of the cart, the hardware processor is programmed to: analyze a spectrum of the vibration data; identify a first peak in the spectrum of the vibration data, the first peak associated with vibration data for vibrations associated with forward or rearward movement of the cart; determine a rotation rate of the wheel to be a harmonic frequency of the frequency of the first peak in the spectrum of the vibration data; and estimate the speed based on the rotation rate and a circumference of the wheel.

In an 84th aspect, a method for determining whether a human-propelled wheeled cart is loaded or unloaded, the method comprising: measuring, with a vibration sensor, a Z-vibration signature representative of an impulse to the cart in a vertical, Z-direction; measuring, with the vibration sensor, an X-vibration signature representative of ringing of the cart in response to the impulse, the X-vibration signature in a horizontal, X-direction parallel to a direction of motion of the cart; and determining whether the cart is loaded or unloaded based at least partly on the X-vibration signature.

In an 85th aspect, the method of aspect 84, wherein the Z-vibration signature comprises an acceleration in the Z-direction having a magnitude greater than 1 g and a duration of less than 10 ms.

In an 86th aspect, the method of aspect 84 or aspect 85, wherein the X-vibration signature has a frequency greater than 1 kHz and occurs within 10 ms of the impulse.

In an 87th aspect, the method of any one of aspects 84-86, wherein estimating the weight of the cart comprises comparing an amplitude of acceleration associated with the X-vibration signature to a threshold.

In an 88th aspect, the method of aspect 87, wherein the threshold is 1 g.

In an 89th aspect, the method of any one of aspects 84-88, further comprising estimating a weight of the cart or a weight of the cart load based at least partly on the X-vibration signature. In aspect 89-A, the method of any one of aspects 84-89, further comprising: in response to determining that the cart is loaded, actuating a brake system configured to inhibit motion of the cart. An aspect 89-B, the method of aspect 89-A, further comprising providing an indication of a speed or force at which the brake system is to be applied to slow the cart, wherein the indication of the speed or force depends at least partly on the determination that is loaded. In aspect 89-C, the method of any one of aspects 84-89, 89-A, or 89-B, further comprising: estimating a speed of the cart based at least in part on vibration data from a vibration sensor; and estimating a location of the cart based at least in part on the estimated speed and a heading of the cart.

In a 90th aspect, a navigation system for a human-propelled, wheeled cart, the navigation system comprising: a light detector configured to detect ambient light data along a path traveled by the cart; non-transitory memory configured to store lighting signature data representative of a cart environment; and a hardware processor in communication with the light detector and the non-transitory memory, the hardware processor programmed to: analyze the ambient light data and the lighting signature data to determine a location of the cart in the cart environment.

In a 91st aspect, the navigation system of aspect 90, wherein the light detector comprises a photosensor.

In a 92nd aspect, the navigation system of aspect 90 or aspect 91, wherein the lighting signature data comprises, for an ambient light source, one or more of: a horizontal position of the light source, a height of the light source, an optical power of the light source, or an angular dependence of optical power of the light source.

In a 93rd aspect, the navigation system of any one of aspects 90-92, wherein to analyze the ambient light data and the lighting signature data to determine a location of the cart in the cart environment, the hardware processor is programmed to reduce or minimize an error function based at least partly on a previous cart location, the ambient light data, and the lighting signature data.

In a 94th aspect, the navigation system of any one of aspects 90-93, wherein the hardware processor is further programmed to check a time history of the ambient light data to determine whether the time history is consistent with the measured velocity or direction of motion of the cart.

In a 95th aspect, the navigation system of any one of aspects 90-94, further comprising: a dead reckoning system configured to estimate cart location based at least partly on measurement of wheel rotation and cart heading.

In a 96th aspect, the navigation system of aspect 95, wherein to analyze the ambient light data and the lighting signature data to determine a location of the cart in the cart environment, the hardware processor is further programmed to utilize the cart location estimated by the dead reckoning system.

In a 97th aspect, a human-propelled, wheeled cart comprising: a first magnetometer configured to record first magnetic data, the first magnetometer disposed at a first height; a second magnetometer configured to record second magnetic data, the second magnetometer disposed at a second height that is different from the first height; and a navigation system configured to receive the first magnetic data and the second magnetic data, the navigation system further configured to determine a location of the cart based at least partly on the first magnetic data, the second magnetic data, or both the first and the second magnetic data.

In a 98th aspect, the human-propelled, wheeled cart of aspect 97, wherein: the first magnetometer is mounted to a handle of the cart; and the second magnetometer is mounted to a rail of a basket of the cart, the rail disposed below the handle of the cart.

In a 99th aspect, the human-propelled, wheeled cart of aspect 97 or aspect 98, wherein: the first magnetometer is disposed in the navigation system which is mounted to a handle of the cart; and the second magnetometer is disposed in a wheel of the cart.

In a 100th aspect, the human-propelled, wheeled cart of any one of aspects 97-99, wherein: the navigation system is configured to determine a first location of the cart based at least partly on the first magnetic data, the first location associated with a first confidence; the navigation system is configured to determine a second location of the cart based at least partly on the second magnetic data, the second location associated with a second confidence; and the navigation system is configured to determine the location of the cart based at least partly on the first location, the second location, the first confidence, and the second confidence.

In 101st aspect, the human-propelled, wheeled cart of any one of aspects 97-100, wherein the navigation system is configured to store a magnetic field map of an environment for the cart, the magnetic field map comprising a multi-layer map having first magnetic signatures corresponding to the first height and second magnetic signatures corresponding to the second height.

In a 102nd aspect, the human-propelled, wheeled cart of aspect 101, wherein the navigation system is configured to determine the location of the cart based at least partly on the magnetic field map.

In a 103rd aspect, a positioning system for a human-propelled cart, the navigation system comprising: a vertical position detector; non-transitory memory configured to store a multi-level map containing information on a plurality of levels within an environment in which the cart can move; and a navigation system in communication with the vertical position detector and the non-transitory memory, the navigation system configured to determine a location of the cart within the environment based at least partly on a measurement from the vertical position detector and information in the multi-level map, the location of the cart comprising a horizontal location within the environment and an identification of one of the plurality of levels on which the cart is located.

In a 104th aspect, the positioning system of aspect 103, wherein the vertical position detector comprises a pressure sensor, an altimeter, or an accelerometer.

In a 105th aspect, the positioning system of aspect 103 or aspect 104, wherein the navigation system comprises a dead reckoning system.

In a 106th aspect, the positioning system of any one of aspects 103-105, wherein the vertical position detector comprises a pressure sensor, and the navigation system is configured to: receive a reference pressure measured by a reference pressure sensor located within the environment; and determine an altitude of the cart relative to an altitude of the reference pressure sensor.

In a 107th aspect, the positioning system of any one of aspects 103-106, wherein the vertical position detector comprises an accelerometer, and the navigation system is configured to integrate acceleration data from the accelerometer to determine a vertical displacement of the cart.

In a 108th aspect, the positioning system of any one of aspects 103-107, further comprising: a vibration sensor; and a wheel rotation detector; wherein the navigation system is configured to use vibration data from the vibration sensor, absence of measured wheel rotation, and a location estimate that the cart is near an entrance to a cart conveyor system to determine the location of the cart.

ADDITIONAL INFORMATION

The various illustrative logical blocks, modules, and processes described herein may be implemented or performed by a machine, such as a computer, a processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor may be a microprocessor, a controller, microcontroller, state machine, combinations of the same, or the like. A processor may also be implemented as a combination of computing devices, e.g., a combination of a DSP and a microprocessor, a plurality of microprocessors or processor cores, one or more graphics or stream processors, one or more microprocessors in conjunction with a DSP, or any other such configuration.

Further, certain implementations of the object location systems of the present disclosure are sufficiently mathematically, computationally, or technically complex that application-specific hardware (e.g., FPGAs or ASICs) or one or more physical computing devices (utilizing appropriate executable instructions) may be necessary to perform the functionality, for example, due to the volume or complexity of the calculations involved (e.g., analyzing the vibration data and performing the dead reckoning navigation calculations) or to provide results (e.g., statistical information on the object locations) substantially in real-time.

The blocks or states of the processes described herein may be embodied directly in hardware, in a software module stored in a non-transitory memory and executed by a hardware processor, or in a combination of the two. For example, each of the processes described above may also be embodied in, and fully automated by, software modules (stored in a non-transitory memory) executed by one or more machines such as computers or computer processors. A module may reside in a non-transitory computer readable medium such as RAM, flash memory, ROM, EPROM, EEPROM, registers, hard disk, an optical disc, memory capable of storing firmware, or any other form of computer-readable (e.g., storage) medium. A computer-readable medium can be coupled to a processor such that the processor can read information from, and write information to, the computer-readable medium. In the alternative, the computer-readable medium may be integral to the processor. The processor and the computer-readable medium may reside in an ASIC. The computer-readable medium may include non-transitory data storage (e.g., a hard disk, non-volatile memory, etc.).

The processes, methods, and systems may be implemented in a network (or distributed) computing environment. For example, the central control unit or base station may be implemented in a distributed, networked, computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network, a terrestrial or satellite network, or any other type of communication network.

Depending on the embodiment, certain acts, events, or functions of any of the processes or methods described herein can be performed in a different sequence, may be added, merged, or left out altogether. Thus, in certain embodiments, not all described acts or events are necessary for the practice of the processes. Moreover, in certain embodiments, acts or events may be performed concurrently, e.g., through multi-threaded processing, interrupt processing, or via multiple processors or processor cores, rather than sequentially. In any apparatus, system, or method, no element or act is necessary or indispensable to all embodiments, and the disclosed apparatus, systems, and methods can be arranged differently than shown or described.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present. The articles "a" or "an" or "the" when referring to an element means one or more of the element, unless the context clearly indicates otherwise.

While the above detailed description has shown, described, and pointed out novel features as applied to various embodiments, it will be understood that various omissions, substitutions, and changes in the form and details of the logical blocks, modules, and processes illustrated may be made without departing from the spirit of the disclosure. As will be recognized, certain embodiments of the inventions described herein may be embodied within a form that does not provide all of the features and benefits set forth herein, as some features may be used or practiced separately from others.

What is claimed is:

1. A method of monitoring usage of a shopping cart, the method comprising:
   generating, with a vibration sensor attached to the shopping cart, vibration data representing vibration that occurs during movement of the shopping cart in a store; and
   by one or more hardware processors:
      generating a vibration signature based on an analysis of the vibration data;
      determining a load status of the shopping cart based on the vibration signature;
      determining that the shopping cart is exiting the store; and
      determining whether to perform an anti-theft action that inhibits movement of the shopping cart as the shopping cart exits the store based at least partly on the determined load status of the shopping cart.

2. The method of claim 1, wherein the vibration signature is generated in response to detection of an impulse.

3. The method of claim 1, wherein the vibration signature represents vibration of the shopping cart along a horizontal axis.

4. The method of claim 3, wherein the horizontal axis is parallel to a direction of movement of the shopping cart.

5. The method of claim 1, wherein the vibration sensor is a three-axis accelerometer, and the method comprises generating vibration data along each of three axes.

6. The method of claim 1, further comprising estimating a weight of a load in the shopping cart based on the vibration signature.

7. The method of claim 1, wherein determining whether to perform an anti-theft action comprises determining whether to activate a brake of the shopping cart.

8. The method of claim 1, wherein determining whether to perform an anti-theft action comprises determining to perform said anti-theft action in response to determining that the shopping cart is loaded and is exiting the store without passing through a checkout area.

9. The method of claim 1, wherein determining whether to perform an anti-theft action comprises, in response to determining that the shopping cart is not loaded, determining to allow the shopping cart to exit the store without performance of the anti-theft action.

10. The method of claim 1, wherein the determination of whether to perform the anti-theft action is based partly on a location history of the shopping cart.

11. A method of monitoring usage of a shopping cart, the method comprising:
generating, with a vibration sensor attached to the shopping cart, vibration data representing vibration that occurs during movement of the shopping cart; and
by one or more hardware processors:
generating a vibration signature based on an analysis of the vibration data, wherein the vibration signature represents vibration of the shopping cart along a horizontal axis, and the horizontal axis is parallel to a direction of movement of the shopping cart;
determining a load status of the shopping cart based on the vibration signature;
determining a location of the shopping cart; and
determining whether to perform an anti-theft action based at least partly on the load status and the location of the shopping cart;
wherein the vibration signature is generated in response to detection of an impulse along a vertical axis.

12. A system, comprising:
a vibration sensor configured to attach to a shopping cart and to generate vibration data representing vibration that occurs during movement of the shopping cart in a store; and
a computing system comprising one or more hardware processors, the computing system configured to perform a process that comprises:
generating a vibration signature based on an analysis of the vibration data;
determining a load status of the shopping cart based on the vibration signature;
determining that the shopping cart is exiting the store; and
determining whether to perform an anti-theft action that inhibits movement of the shopping cart as the shopping cart exits the store based at least partly on the determined load status of the shopping cart.

13. The system of claim 12, wherein the computing system is configured to generate the vibration signature in response to detection of an impulse.

14. The system of claim 12, wherein the vibration signature represents vibration of the shopping cart along a horizontal axis.

15. The system of claim 14, wherein the horizontal axis is parallel to a direction of movement of the shopping cart.

16. The system of claim 12, wherein the vibration sensor is a three-axis accelerometer, and the process comprises generating vibration data along each of three axes.

17. The system of claim 12, wherein the process further comprises estimating a weight of a load in the shopping cart based on the vibration signature.

18. The system of claim 12, wherein determining whether to perform an anti-theft action comprises determining whether to activate a brake of the shopping cart.

19. The system of claim 12, wherein determining whether to perform an anti-theft action comprises determining to perform said anti-theft action in response to determining that the shopping cart is loaded and is exiting the store without passing through a checkout area.

20. The system of claim 12, wherein determining whether to perform an anti-theft action comprises, in response to determining that the shopping cart is not loaded, determining to allow the shopping cart to exit the store without performance of the anti-theft action.

21. The system of claim 12, wherein the determination of whether to perform the anti-theft action is based partly on a location history of the shopping cart.

22. A system, comprising:
a vibration sensor configured to attach to a shopping cart and to generate vibration data representing vibration that occurs during movement of the shopping cart; and
a computing system comprising one or more hardware processors, the computing system configured to perform a process that comprises:
generating a vibration signature based on an analysis of the vibration data, wherein the vibration signature represents vibration of the shopping cart along a horizontal axis, and the horizontal axis is parallel to a direction of movement of the shopping cart;
determining a load status of the shopping cart based on the vibration signature;
determining a location of the shopping cart; and
determining whether to perform an anti-theft action based at least partly on the load status and the location of the shopping cart;
wherein the computing system is configured to generate the vibration signature in response to detection of an impulse along a vertical axis.

* * * * *